United States Patent
Sakakura et al.

(10) Patent No.: US 12,002,818 B2
(45) Date of Patent: Jun. 4, 2024

(54) SEMICONDUCTOR DEVICE AND MANUFACTURING METHOD THEREOF

(71) Applicant: Semiconductor Energy Laboratory Co., Ltd., Atsugi (JP)

(72) Inventors: Masayuki Sakakura, Tochigi (JP); Yoshiaki Oikawa, Sagamihara (JP); Shunpei Yamazaki, Setagaya (JP); Junichiro Sakata, Atsugi (JP); Masashi Tsubuku, Atsugi (JP); Kengo Akimoto, Atsugi (JP); Miyuki Hosoba, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/215,987

(22) Filed: Jun. 29, 2023

(65) Prior Publication Data
US 2024/0014222 A1     Jan. 11, 2024

Related U.S. Application Data

(63) Continuation of application No. 17/105,801, filed on Nov. 27, 2020, now Pat. No. 11,695,019, which is a (Continued)

(30) Foreign Application Priority Data

Sep. 4, 2009     (JP) .................................. 2009-204565

(51) Int. Cl.
*H01L 27/14*     (2006.01)
*G02F 1/1343*     (2006.01)
(Continued)

(52) U.S. Cl.
CPC ...... *H01L 27/124* (2013.01); *G02F 1/134309* (2013.01); *G02F 1/13454* (2013.01);
(Continued)

(58) Field of Classification Search
CPC ............... H01L 27/124; H01L 27/1225; H01L 27/1255; G02F 1/134309; G02F 1/13454; G02F 1/1368; G02F 2202/10
(Continued)

(56) References Cited

U.S. PATENT DOCUMENTS

| 5,731,856 | A | 3/1998 | Kim et al. |
| 5,744,864 | A | 4/1998 | Cillessen et al. |

(Continued)

FOREIGN PATENT DOCUMENTS

| EP | 1737044 A | 12/2006 |
| EP | 1918904 A | 5/2008 |

(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Tan N Tran
(74) *Attorney, Agent, or Firm* — Eric J. Robinson; Robinson Intellectual Property Law Office, P.C.

(57) ABSTRACT

The semiconductor device includes a driver circuit portion including a driver circuit and a pixel portion including a pixel. The pixel includes a gate electrode layer having a light-transmitting property, a gate insulating layer, a source electrode layer and a drain electrode layer each having a light-transmitting property provided over the gate insulating layer, an oxide semiconductor layer covering top surfaces and side surfaces of the source electrode layer and the drain electrode layer and provided over the gate electrode layer with the gate insulating layer therebetween, a conductive layer provided over part of the oxide semiconductor layer (Continued)

and having a lower resistance than the source electrode layer and the drain electrode layer, and an oxide insulating layer in contact with part of the oxide semiconductor layer.

8 Claims, 34 Drawing Sheets

Related U.S. Application Data continuation of application No. 16/672,988, filed on Nov. 4, 2019, now Pat. No. 10,854,640, which is a continuation of application No. 15/460,652, filed on Mar. 16, 2017, now Pat. No. 10,629,627, which is a continuation of application No. 14/264,301, filed on Apr. 29, 2014, now Pat. No. 9,601,516, which is a continuation of application No. 12/871,148, filed on Aug. 30, 2010, now Pat. No. 8,742,422.

(51) Int. Cl.
  G02F 1/1345     (2006.01)
  G02F 1/1368     (2006.01)
  H01L 27/12      (2006.01)
(52) U.S. Cl.
  CPC ........ *G02F 1/1368* (2013.01); *H01L 27/1225* (2013.01); *H01L 27/1255* (2013.01); *G02F 2202/10* (2013.01)
(58) Field of Classification Search
  USPC ..................................................... 257/59, 72
  See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,774,397 B2 | 8/2004 | Arao et al. | |
| 6,819,389 B2 | 11/2004 | Imayama et al. | |
| 6,867,822 B2 | 3/2005 | Kim et al. | |
| 7,009,664 B2 | 3/2006 | Imayama et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,095,047 B2 | 8/2006 | Arao et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,335,597 B2 | 2/2008 | Arao et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,427,833 B2 | 9/2008 | Fish et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito. et al. | |
| 7,674,650 B2 | 3/2010 | Akimoto et al. | |
| 7,719,185 B2 | 5/2010 | Jin et al. | |
| 7,732,251 B2 | 6/2010 | Hoffman et al. | |
| 7,732,819 B2 | 6/2010 | Akimoto et al. | |
| 7,745,798 B2 | 6/2010 | Takahashi | |
| 7,749,825 B2 | 7/2010 | Honda | |
| 7,768,617 B2 | 8/2010 | Yamazaki et al. | |
| 7,795,621 B2 | 9/2010 | Yamaguchi et al. | |
| 7,804,091 B2 | 9/2010 | Takechi et al. | |
| 7,907,224 B2 | 3/2011 | Ito et al. | |
| 7,943,985 B2 | 5/2011 | Kim et al. | |
| 8,044,598 B2 | 10/2011 | Fukumoto et al. | |
| 8,115,883 B2 | 2/2012 | Yamazaki et al. | |
| 8,203,144 B2 | 6/2012 | Hoffman et al. | |
| 8,222,098 B2 | 7/2012 | Honda | |
| 8,232,124 B2 | 7/2012 | Takechi et al. | |
| 8,253,252 B2 | 8/2012 | Shingu et al. | |
| 8,502,220 B2 * | 8/2013 | Yamazaki | ........... H01L 27/1288 257/E29.151 |
| 8,519,628 B2 | 8/2013 | Fukumoto et al. | |
| 8,520,178 B2 | 8/2013 | Yamazaki et al. | |
| 8,647,031 B2 | 2/2014 | Hoffman et al. | |
| 8,742,422 B2 | 6/2014 | Sakakura et al. | |
| 8,785,990 B2 | 7/2014 | Honda | |
| 8,803,768 B2 | 8/2014 | Kimura et al. | |
| 9,601,516 B2 | 3/2017 | Sakakura et al. | |
| 9,922,600 B2 | 3/2018 | Kimura | |
| 10,629,627 B2 | 4/2020 | Sakakura et al. | |
| 10,854,640 B2 | 12/2020 | Sakakura et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0111663 A1 | 6/2003 | Yagi | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0263441 A1 | 12/2004 | Tanaka et al. | |
| 2005/0017302 A1 | 1/2005 | Hoffman | |
| 2005/0199959 A1 | 9/2005 | Chiang et al. | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0023750 A1 | 2/2007 | Chaing et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0087487 A1 | 4/2007 | Honda | |
| 2007/0090365 A1 | 4/2007 | Hayashi et al. | |
| 2007/0105286 A1 | 5/2007 | Huh et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006827 A1 | 1/2008 | Shim et al. | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0073674 A1 | 3/2008 | Cho et al. | |
| 2008/0080221 A1 | 4/2008 | Koo et al. | |
| 2008/0083950 A1 | 4/2008 | Pan et al. | |
| 2008/0106191 A1 | 5/2008 | Kawase | |

(56) References Cited

U.S. PATENT DOCUMENTS

| | | |
|---|---|---|
| 2008/0119018 A1 | 5/2008 | Toyota et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0233669 A1 | 9/2008 | Hirakata et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2009/0001374 A1 | 1/2009 | Inoue et al. |
| 2009/0050876 A1 | 2/2009 | Marks et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0278133 A1 | 11/2009 | Kim et al. |
| 2009/0280600 A1 | 11/2009 | Hosono et al. |
| 2009/0283762 A1 | 11/2009 | Kimura |
| 2009/0315451 A1 | 12/2009 | Choi et al. |
| 2010/0044701 A1 | 2/2010 | Sano et al. |
| 2010/0044711 A1 | 2/2010 | Imai |
| 2010/0059754 A1 | 3/2010 | Lee et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0264420 A1 | 10/2010 | Honda |
| 2011/0031493 A1 | 2/2011 | Yamazaki et al. |
| 2011/0031496 A1 | 2/2011 | Yamazaki et al. |
| 2011/0032444 A1 | 2/2011 | Yamazaki et al. |
| 2011/0057187 A1 | 3/2011 | Sakakura et al. |
| 2011/0058116 A1 | 3/2011 | Yamazaki et al. |
| 2011/0210324 A1 | 9/2011 | Sakakura et al. |
| 2011/0210325 A1 | 9/2011 | Sakakura et al. |
| 2011/0210355 A1 | 9/2011 | Yamazaki et al. |
| 2012/0126232 A1 | 5/2012 | Yamazaki et al. |
| 2013/0178004 A1 | 7/2013 | Hirakata et al. |
| 2014/0326998 A1 | 11/2014 | Honda |
| 2014/0346506 A1 | 11/2014 | Kimura et al. |
| 2017/0062483 A1 | 3/2017 | Kimura et al. |

FOREIGN PATENT DOCUMENTS

| | | |
|---|---|---|
| EP | 1981085 A | 10/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-202156 A | 7/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-231124 A | 8/2000 |
| JP | 2002-033331 A | 1/2002 |
| JP | 2002-057345 A | 2/2002 |
| JP | 2002-076356 A | 3/2002 |
| JP | 2002-289859 A | 10/2002 |
| JP | 2003-029293 A | 1/2003 |
| JP | 2003-086000 A | 3/2003 |
| JP | 2003-086808 A | 3/2003 |
| JP | 2003-167258 A | 6/2003 |
| JP | 2004-103957 A | 4/2004 |
| JP | 2004-273614 A | 9/2004 |
| JP | 2004-273732 A | 9/2004 |
| JP | 2004-341186 A | 12/2004 |
| JP | 2005-243951 A | 9/2005 |
| JP | 2006-242987 A | 9/2006 |
| JP | 2006-286772 A | 10/2006 |
| JP | 2006-527391 | 11/2006 |
| JP | 2007-081362 A | 3/2007 |
| JP | 2007-096055 A | 4/2007 |
| JP | 2007-123861 A | 5/2007 |
| JP | 2007-134482 A | 5/2007 |
| JP | 2007-134687 A | 5/2007 |
| JP | 2007-163467 A | 6/2007 |
| JP | 2007-171932 A | 7/2007 |
| JP | 2007-179032 A | 7/2007 |
| JP | 2007-258675 A | 10/2007 |
| JP | 2007-266252 A | 10/2007 |
| JP | 2007-529119 | 10/2007 |
| JP | 2007-298601 A | 11/2007 |
| JP | 2008-033284 A | 2/2008 |
| JP | 2008-040343 A | 2/2008 |
| JP | 2008-129314 A | 6/2008 |
| JP | 2008-134625 A | 6/2008 |
| JP | 2008-270182 A | 11/2008 |
| JP | 2008-270773 A | 11/2008 |
| JP | 2008-286911 A | 11/2008 |
| JP | 2009-158940 A | 7/2009 |
| JP | 2009-193065 A | 8/2009 |
| JP | 2009-265271 A | 11/2009 |
| JP | 2010-098280 A | 4/2010 |
| JP | 5601940 | 10/2014 |
| WO | WO-2004/109640 | 12/2004 |
| WO | WO-2004/114391 | 12/2004 |
| WO | WO-2005/093850 | 10/2005 |
| WO | WO-2006/093028 | 9/2006 |
| WO | WO-2007/043493 | 4/2007 |
| WO | WO-2008/105347 | 9/2008 |
| WO | WO-2008/126879 | 10/2008 |
| WO | WO-2009/072532 | 6/2009 |
| WO | WO-2009/090969 | 7/2009 |
| WO | WO-2011/027676 | 3/2011 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure Rfid Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-IN. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven By Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:NUMERICAL Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] At Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
International Search Report (Application No. PCT/JP2010/064132) dated Sep. 21, 2010.
Written Opinion (Application No. PCT/JP2010/064132) dated Sep. 21, 2010.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura. K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung. T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SITIO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

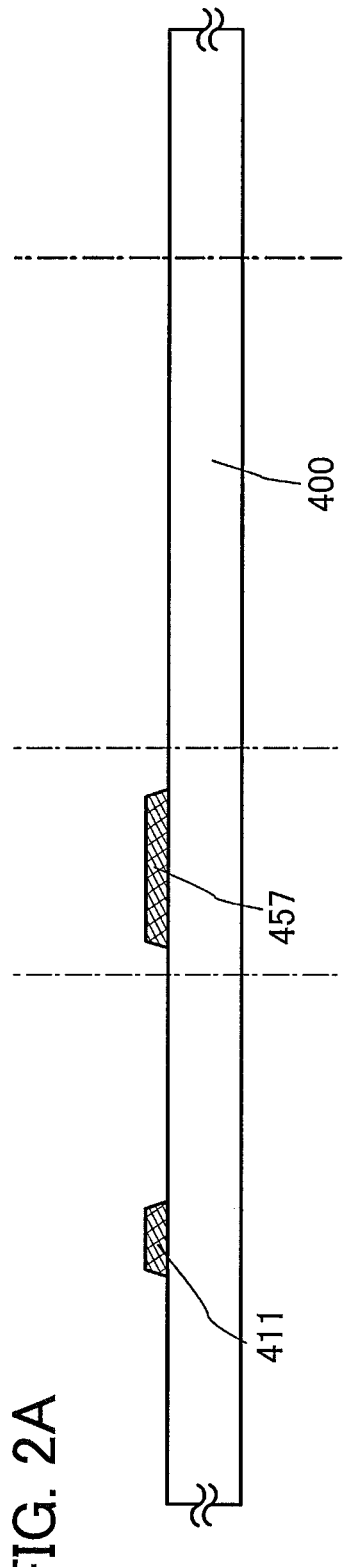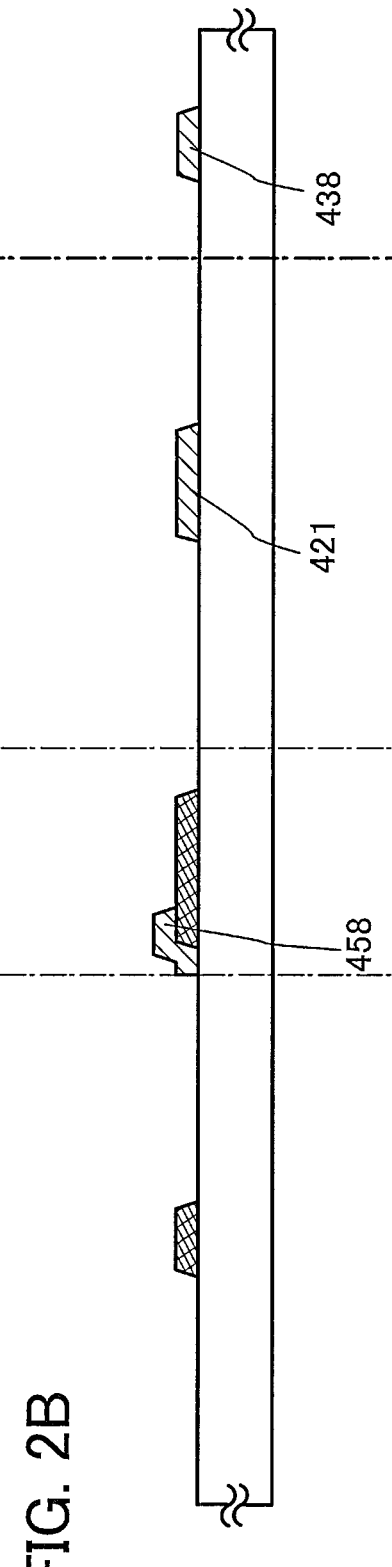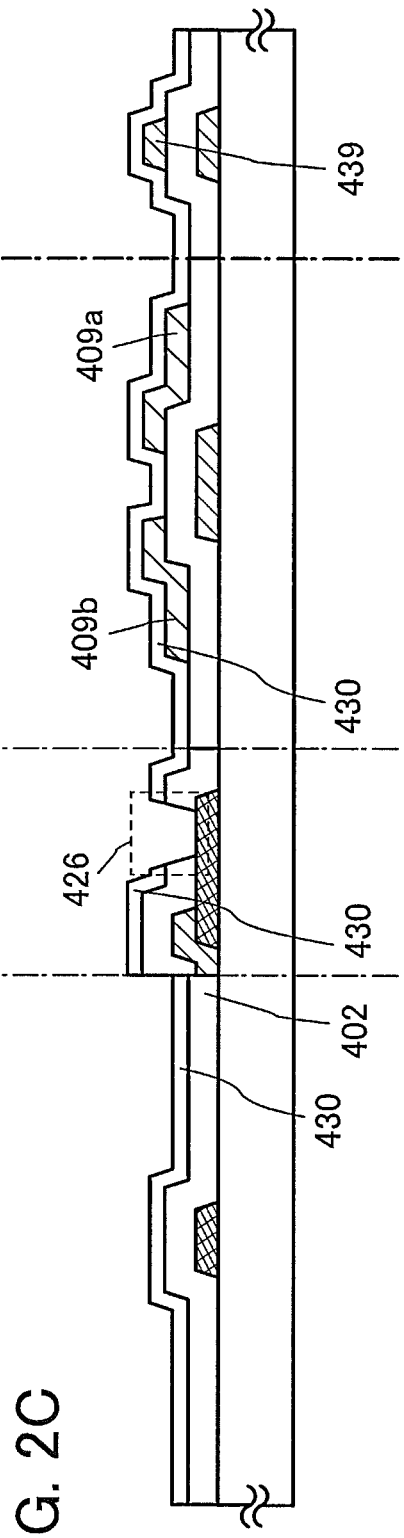

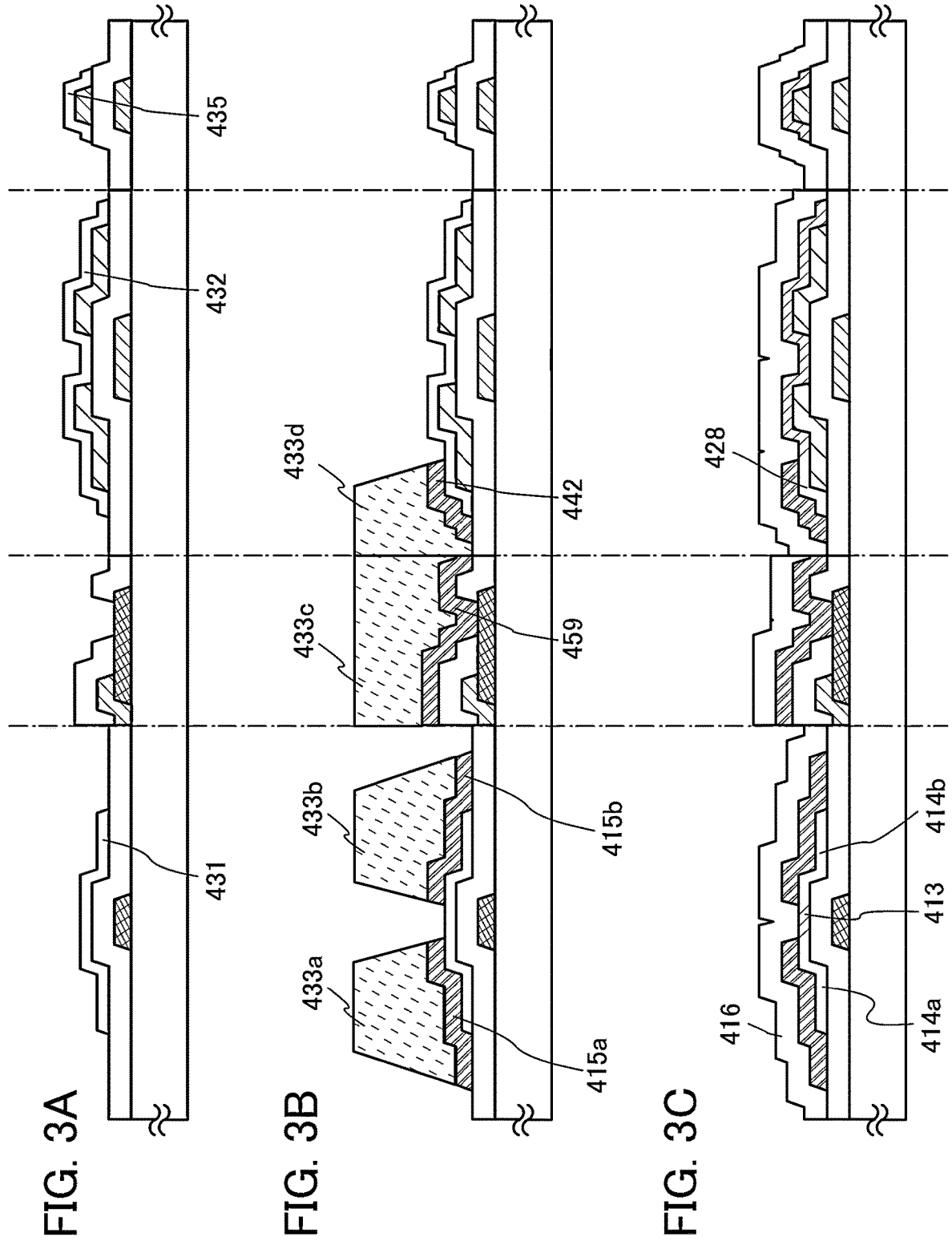

FIG. 5A1
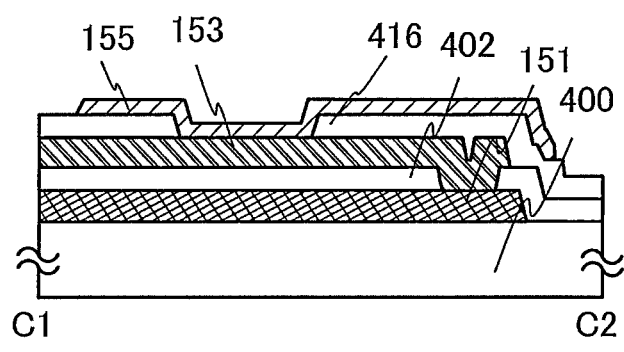
FIG. 5A2
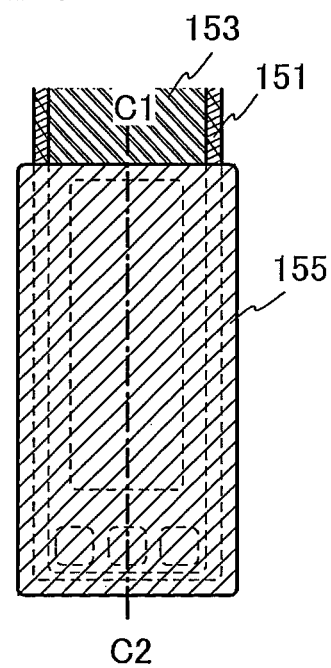
FIG. 5B1
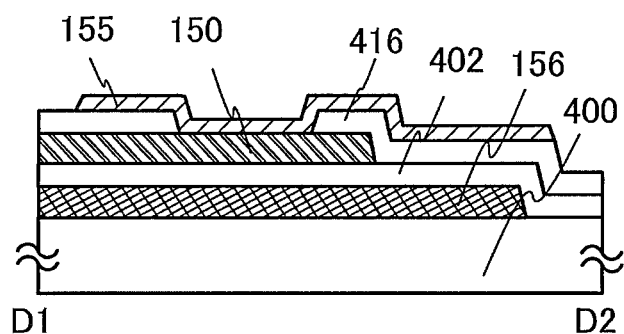
FIG. 5B2
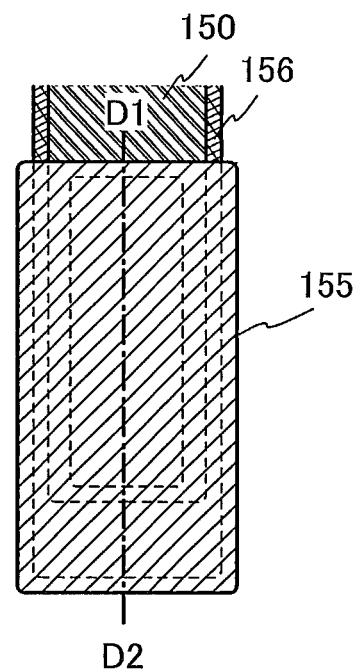

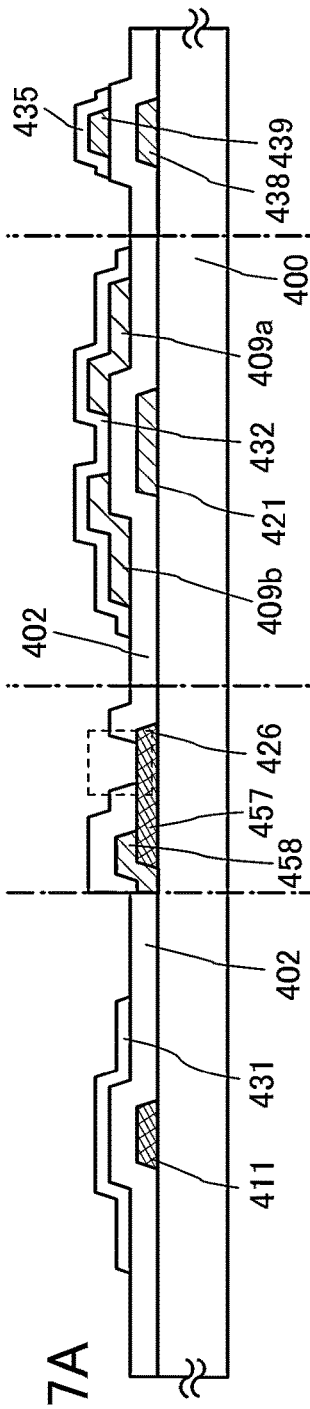
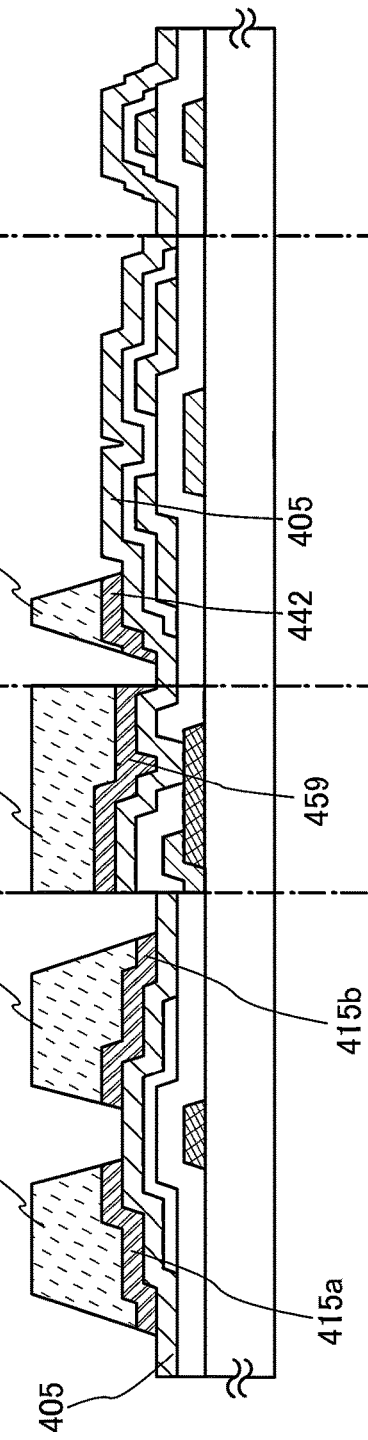
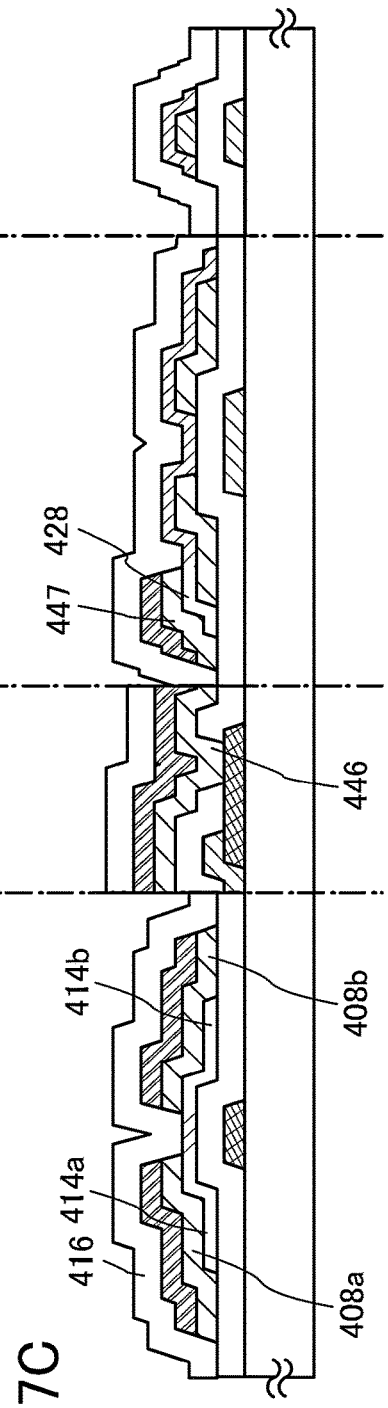

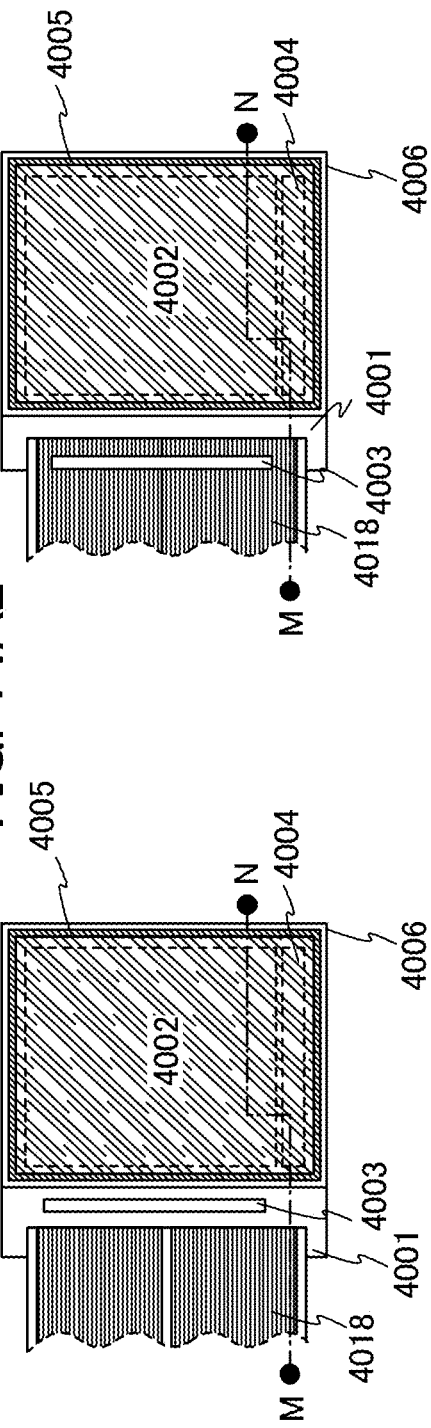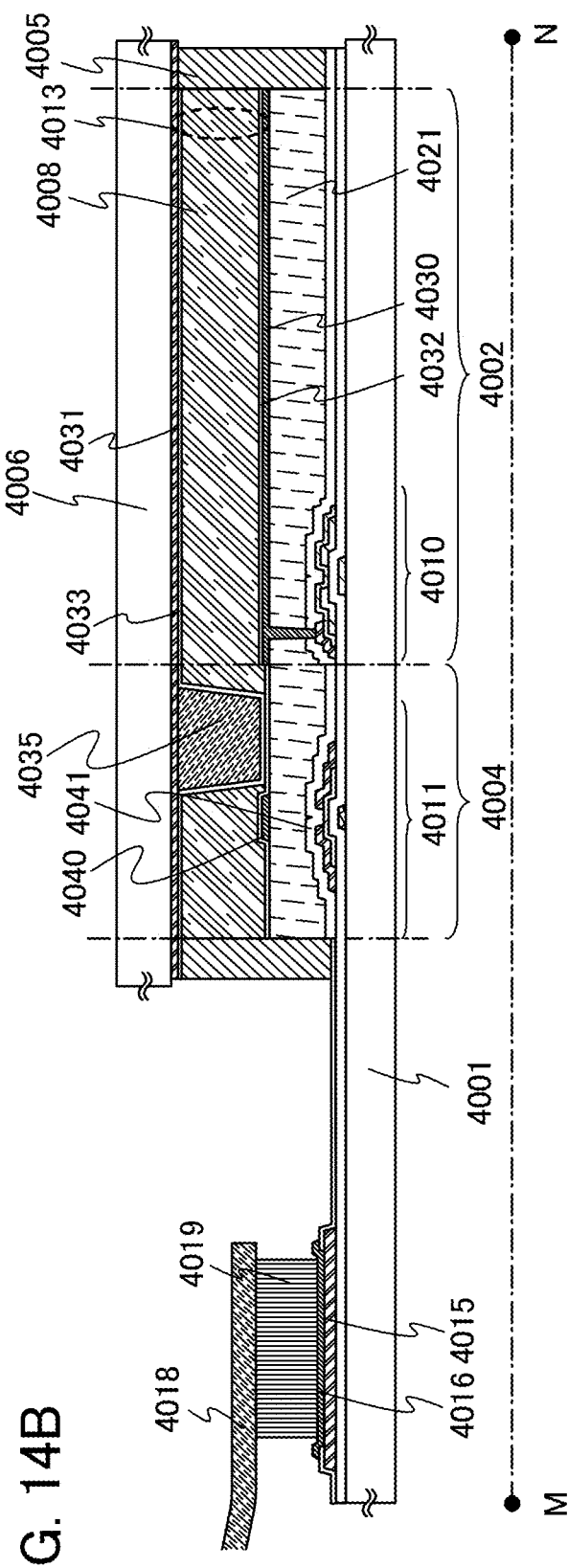

SEMICONDUCTOR DEVICE AND MANUFACTURING METHOD THEREOF

TECHNICAL FIELD

The present invention relates to a semiconductor device including an oxide semiconductor and a manufacturing method thereof.

Note that in this specification, a semiconductor device refers to all devices that can function by utilizing semiconductor properties, and electro-optic devices such as display devices, semiconductor circuits, and electronic devices are all semiconductor devices.

BACKGROUND ART

In recent years, a technique by which a thin film transistor (TFT) is manufactured using a semiconductor thin film (having a thickness of about several nanometers to several hundred nanometers) formed over a substrate having an insulating surface has attracted attention. Thin film transistors have been widely applied to electronic devices such as ICs and electro-optical devices, and their development especially as switching elements for an image display device has been accelerated. Further, various metal oxides are used for a variety of applications. For example, indium oxide is a well-known material and used for a material of a transparent electrode which is needed in a liquid crystal display or the like.

Some metal oxides have semiconductor characteristics. Examples of such metal oxides having semiconductor characteristics include tungsten oxide, tin oxide, indium oxide, zinc oxide, and the like. Thin film transistors in which a channel formation region is formed of such a metal oxide having semiconductor characteristics are already known (Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

In the case where a driver circuit is formed over an insulating surface, it is preferable that operation speed of a thin film transistor used for the driver circuit be high.

For example, the operation speed is increased when a channel length (also referred to as L) of the thin film transistor is reduced or a channel width (also referred to as W) of the thin film transistor is increased. However, when the channel length L is reduced, there is a problem in that a switching characteristic, for example, an on-off ratio is lowered. In addition, when the channel width W is increased, there is a problem in that the capacity load of the thin film transistor itself is increased.

An object of an embodiment of the present invention is to provide a semiconductor device provided with a thin film transistor having stable electric characteristics even if a channel length is small.

In the case where a plurality of circuits which are different from each other is formed over an insulating surface, for example, when a pixel portion and a driver circuit are formed over one substrate, excellent switching characteristics such as a high on-off ratio is needed for a thin film transistor used for the pixel portion, while a high operation speed is needed for a thin film transistor used for the driver circuit. In particular, as the definition of a display device is higher, writing time of the display image is reduced. Therefore, it is preferable that the thin film transistor used for the driver circuit operate at high speed.

An object of an embodiment of the present invention is to provide a semiconductor device in which various circuits are formed over one substrate and various thin film transistors suitable for properties of the various circuits are provided while complication of a process and an increase in manufacturing costs are prevented.

An object of an embodiment of the present invention includes a driver circuit and a pixel portion (also referred to as a display portion) over one substrate. A thin film transistor is provided in each of the driver circuit and the pixel portion. By formation of the driver circuit and the pixel portion over one substrate, a manufacturing cost can be reduced.

Further, a thin film transistor for a driver circuit and a thin film transistor for a pixel may be formed over one substrate, so that a display device such as a liquid crystal display can be manufactured.

In an embodiment of the present invention, a thin film transistor in a driver circuit (also referred to as a first thin film transistor) and a thin film transistor in a pixel portion (also referred to as a second thin film transistor) are bottom-gate thin film transistors including a gate electrode, a source electrode, a drain electrode, and a semiconductor layer having a channel formation region. The thin film transistor in a pixel portion is an inverted-coplanar (also referred to a bottom-contact) thin film transistor including a semiconductor layer which overlaps with source and drain electrode layers.

In an embodiment of the present invention, the gate electrode, the source electrode, and the drain electrode of the thin film transistor in the pixel portion are formed using a light-transmitting conductive layer, and a semiconductor layer is formed using a light-transmitting semiconductor layer. That is, the gate electrode, the source electrode, the drain electrode, and the semiconductor layer of the thin film transistor have a light-transmitting property. Thus, improvement in an aperture ratio of the pixel portion is achieved.

In an embodiment of the present invention, a gate electrode of a thin film transistor in a driver circuit is formed using a material having a lower resistance value than the material used for the gate electrode of the thin film transistor in the pixel portion. A source and drain electrodes of the thin film transistor in the driver circuit are formed using a material having a lower resistance value than the material used for the source and drain electrodes of the thin film transistor in the pixel portion. Therefore, the resistance values of the gate electrode, the source electrode, and the drain electrode of the thin film transistor in the driver circuit are lower than the respective resistance values of the gate electrode, the source electrode, and the drain electrode of the thin film transistor in the pixel portion. Thus, operation speed of the driver circuit is improved.

In an embodiment of the present invention, a thin film transistor in a driver circuit can have a structure including a conductive layer between a semiconductor layer and a source electrode and between a semiconductor layer and a drain electrode. It is preferable that the resistance value of the conductive layer be lower than that of the semiconductor layer and higher than those of the source and drain electrode.

In an embodiment of the present invention, a thin film transistor in a pixel portion has a structure including a conductive layer between a drain electrode layer and a pixel electrode layer. The conductive layer can reduce contact resistance between the drain electrode layer and the pixel electrode layer. It is preferable that the conductive layer has lower resistance than the drain electrode layer.

An embodiment of the present invention is a semiconductor device which includes a driver circuit portion provided with a driver circuit and a pixel portion provided with a pixel over a substrate, a first gate electrode layer provided in the driver circuit portion, a second electrode layer having a light-transmitting property provided in the pixel portion, a gate insulating layer provided over the first gate electrode layer and the second gate electrode layer, a first oxide semiconductor layer provided over the first gate electrode layer with the gate insulating layer therebetween, a first source electrode layer and a first drain electrode layer provided over part of the first oxide semiconductor layer, a second source electrode layer and a second drain electrode layer each having light-transmitting properties provided over the gate insulating layer in the pixel portion, a second oxide semiconductor layer which is provided over the second gate electrode layer with the gate insulating layer therebetween and covers a top surface and a side surface of the second source electrode layer and a top surface and a side surface of the second drain electrode layer, a conductive layer provided over part of the second oxide semiconductor layer and having a lower resistance than the second source electrode layer and the second drain electrode layer, and an oxide insulating layer in contact with part of the first oxide semiconductor layer and part of the second oxide semiconductor layer.

In an embodiment of the present invention, the first source electrode layer and the first drain electrode layer may be a single layer or a stacked layer formed using a metal material or an alloy material containing an element selected from molybdenum, titanium, chromium, tantalum, tungsten, aluminum, copper, neodymium, and scandium as its main component.

In an embodiment of the present invention, the second source electrode layer and the second drain electrode layer may be formed using indium oxide, an alloy of indium oxide and tin oxide, an alloy of indium oxide and zinc oxide, or zinc oxide.

In an embodiment of the present invention, the conductive layer may be a single layer or a stacked layer formed using a metal material or an alloy material containing an element selected from molybdenum, titanium, chromium, tantalum, tungsten, aluminum, copper, neodymium, and scandium as its main component.

In an embodiment of the present invention, the pixel may include a capacitor portion. The capacitor portion may include a capacitor wiring and a capacitor electrode overlapping with the capacitor wiring; and the capacitor wiring and the capacitor electrode may have a light-transmitting property.

In an embodiment of the present invention, a conductive layer may be provided to overlap with the first oxide semiconductor layer with the oxide insulating layer therebetween.

In an embodiment of the present invention, an oxide conductive layer may be provided between the first oxide semiconductor layer and the first source electrode layer or the first drain electrode layer In an embodiment of the present invention, the oxide conductive layer may be formed using indium oxide, an alloy of indium oxide and tin oxide, an alloy of indium oxide and zinc oxide, or zinc oxide.

An embodiment of the present invention is a method for manufacturing a semiconductor device in which a driver circuit portion and a pixel portion are formed over one substrate, including the steps of forming a first gate electrode layer over the substrate in the driver circuit portion, forming a second gate electrode layer using a light-transmitting material over the substrate in the pixel portion, forming a gate insulating layer over the first gate electrode layer in the driver circuit portion and the second gate electrode layer in the pixel portion, forming a second source electrode layer and a second drain electrode layer using a light-transmitting material over the gate insulating layer in the pixel portion, forming an oxide semiconductor film over the gate insulating layer, etching part of the oxide semiconductor film, so that a first oxide semiconductor layer provided over the first gate electrode layer in the driver circuit with the gate insulating layer therebetween and a second oxide semiconductor layer which is provided over the second gate electrode layer in the pixel portion with the gate insulating layer therebetween and covers top surfaces and side surfaces of the second source electrode layer and the second drain electrode layer in the pixel portion are formed, subjecting the first oxide semiconductor layer and the second oxide semiconductor layer to dehydration or dehydrogenation by heat treatment, forming a conductive film over the gate insulating layer with the first oxide semiconductor layer and the second semiconductor layer therebetween, etching part of the conductive film, so that a first source electrode layer and a first drain electrode layer over part of the first oxide semiconductor layer and a conductive layer over part of the second oxide semiconductor layer are formed, forming an oxide insulating layer over the first semiconductor layer and the second semiconductor layer, forming a contact hole which reaches the conductive layer in part of the oxide insulating layer, forming a light-transmitting conductive film over the oxide insulating layer, and forming a pixel electrode layer by etching part of the light-transmitting conductive film.

An embodiment of the present invention is a method for manufacturing a semiconductor device in which a driver circuit portion and a pixel portion are formed over one substrate, including the steps of forming a first gate electrode layer over the substrate in the driver circuit portion, forming a second gate electrode layer using a light-transmitting material over the substrate in the pixel portion, forming a gate insulating layer over the first gate electrode in the driver circuit portion and the second gate electrode layer in the pixel portion, forming a second source electrode layer and a second drain electrode layer using a light-transmitting material over the gate insulating layer in the pixel portion, forming an oxide semiconductor film over the gate insulating layer, etching part of the oxide semiconductor film, so that a first oxide semiconductor layer provided over the first gate electrode layer in the driver circuit with the gate insulating layer therebetween and a second oxide semiconductor layer which is provided over the second gate electrode layer in the pixel portion with the gate insulating layer therebetween and covers top surfaces and side surfaces of the second source electrode layer and the second drain electrode layer in the pixel portion are formed, subjecting the first oxide semiconductor layer and the second oxide semiconductor layer to dehydration or dehydrogenation by heat treatment, forming an oxide conductive film over the gate insulating layer with the first oxide semiconductor layer and the second oxide semiconductor layer therebetween, forming a conductive film over the oxide semiconductor film, etching part of the oxide conductive film and the conductive film, so that a first oxide conductive layer and a second oxide conductive layer which is provided over part of the first oxide semiconductor layer, a first source electrode layer over part of the first oxide conductive layer, a first drain electrode layer over part of the second oxide conductive layer, and a conductive layer over part of the second oxide semiconductor layer are formed, forming an oxide insulating layer over the first oxide semiconductor layer and the second oxide semiconductor layer, forming a contact hole which reaches the conductive layer in part of the oxide insulating layer, forming a conductive film having a light-transmitting property over the oxide insulating layer, and forming a pixel electrode layer by etching part of the light-transmitting conductive film.

As the oxide semiconductor used in this specification, for example, a thin film expressed by $InMO_3(ZnO)_m$ (m>0) is formed, and a thin film transistor in which the thin film is used for an oxide semiconductor layer is manufactured. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Note that the oxide semiconductor may contain a transition metal element such as Fe or Ni or oxide of the transition metal element as an impurity element in addition to the metal element contained as M. In this specification, among the oxide semiconductor layers whose composition formulas are represented by $InMO_3 (ZnO)_m$ (m>0 and m is not an integer), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based semiconductor film.

As the metal oxide applied to the oxide semiconductor layer, any of the following metal oxide can be applied besides the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Alternatively, silicon oxide may be included in the oxide semiconductor layer formed using the above metal oxide.

The oxide semiconductor preferably includes In, further preferably, includes In and Ga. Dehydration or dehydrogenation is effective in forming an i-type (intrinsic) oxide semiconductor layer.

In the case where heat treatment is performed in an atmosphere of an inert gas such as nitrogen or a rare gas (e.g., argon or helium) in the manufacturing process of a semiconductor device, the oxide semiconductor layer is changed into an oxygen-deficient oxide semiconductor layer by the heat treatment so as to be a low-resistance oxide semiconductor layer, i.e., an n-type (e.g., n⁻-type) oxide semiconductor layer. Then, the oxide semiconductor layer is made to be in an oxygen excess state by formation of an oxide insulating layer which is in contact with the oxide semiconductor layer, so that a high-resistance oxide semiconductor layer, i.e., an i-type oxide semiconductor layer is formed. In this manner, a semiconductor device including a thin film transistor having favolable electric characteristics and high reliability can be manufactured and provided.

Note that in the manufacturing process of the semiconductor device, heat treatment is performed at a temperature higher than or equal to 350° C., preferably higher than or equal to 400° C. and lower than or equal to 700° C., more preferably higher than or equal to 420° C. and lower than or equal to 570° C. in an inert gas atmosphere containing nitrogen or a rare gas (argon, helium, or the like), in order to reduce impurities such as moisture contained in the oxide semiconductor layer. Further, water ($H_2O$) can be prevented from being contained in the oxide semiconductor layer again later.

The heat treatment for dehydration or dehydrogenation is preferably performed in a nitrogen atmosphere at an $H_2O$ concentration of 20 ppm or lower. Alternatively, the heat treatment may be performed in ultra-dry air at an $H_2O$ concentration of 20 ppm or lower.

Two peaks of water or at least one peak of water at around 300° C. is not detected even when thermal desorption spectroscopy (also referred to as TDS) at up to 450° C. is performed on an oxide semiconductor layer subjected to dehydration or dehydrogenation. Therefore, even when TDS is performed at up to 450° C. on a thin film transistor including the oxide semiconductor layer subjected to dehydration or dehydrogenation, at least the peak of water at around 300° C. is not detected.

In addition, in the manufacturing process of the semiconductor device, it is important to prevent water or hydrogen from being mixed into the oxide semiconductor layer, with the oxide semiconductor layer not being exposed to the air. When a thin film transistor is formed using an oxide semiconductor layer obtained by changing an oxide semiconductor layer into a low-resistance oxide semiconductor layer, i.e., an n-type (e.g., n⁻-type) oxide semiconductor layer by dehydration or dehydrogenation and then by changing the low-resistance oxide semiconductor layer into a high-resistance oxide semiconductor layer to be an i-type semiconductor layer by supplying oxygen, the threshold voltage of the thin film transistor can be positive, whereby a so-called normally-off switching element can be realized. It is preferable for a semiconductor device that a channel be formed with positive threshold voltage which is as close to 0 V as possible in a thin film transistor. Note that if the threshold voltage of the thin film transistor is negative, the thin film transistor tends to be normally on; in other words, current flows between a source electrode and a drain electrode even when the gate voltage is 0 V. For example, in an active matrix display device, the electric characteristics of a thin film transistor included in a circuit are important and influence the performance of the display device. Among the electric characteristics of the thin film transistor, the threshold voltage (Vth) is particularly important. For example, when the threshold voltage is high or negative even when field-effect mobility is high in the thin film transistor, it is difficult to control the circuit. In the case where a thin film transistor has high threshold voltage, the thin film transistor cannot perform a switching function as a TFT and might be a load when a TFT is driven at low voltage. For example, in the case of an n-channel thin film transistor, it is preferable that a channel be formed and drain current flows after positive voltage is applied to a gate electrode. A transistor in which a channel is not formed unless the driving voltage is increased and a transistor in which a channel is formed and drain current flows even in the negative voltage state are unsuitable for a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, with the use of a furnace in which dehydration or dehydrogenation are performed, cooling is performed without exposure to the air, with the furnace filled with a high-purity oxygen gas or a high-purity $N_2O$ gas.

The electric characteristics of a thin film transistor are improved using an oxide semiconductor film cooled slowly (or cooled) in an atmosphere which does not contain moisture (having a dew point of lower than or equal to −40° C., preferably lower than or equal to −60° C.) after moisture contained in the film is reduced by heat treatment for dehydration or dehydrogenation, and a high-performance thin film transistor which can be mass-produced is realized.

In this specification, heat treatment performed in an atmosphere of an inert gas such as nitrogen or a rare gas (e.g., argon or helium) is referred to as "heat treatment for dehydration or dehydrogenation". In this specification, "dehydrogenation" does not indicate elimination of only $H_2$ by this heat treatment. For convenience, elimination of H, OH, and the like is referred to as "dehydration or dehydrogenation".

In the case where heat treatment is performed under an atmosphere of an inert gas such as nitrogen or a rare gas (e.g., argon or helium) in the manufacturing process of the semiconductor device, an oxide semiconductor layer is changed into an oxygen-deficient oxide semiconductor layer by the heat treatment to be a low-resistance oxide semiconductor layer, i.e., an n-type (e.g., n⁻-type) oxide semiconductor layer. As a result, a region overlapped with a source electrode layer is formed as a high-resistance source region (also referred to as an HRS region) which is an oxygen-deficient region, and a region overlapped with a drain electrode layer is formed as a high-resistance drain region (also referred to as an HRD region) which is an oxygen-deficient region.

Specifically, the carrier concentration of the high-resistance drain region is higher than or equal to $1\times10^{18}/cm^3$ and is at least higher than the carrier concentration of a channel formation region (lower than $1\times10^{18}/cm^3$). Note that the carrier concentration in this specification is a carrier concentration obtained by Hall effect measurement at room temperature.

Further, an oxide conductive layer may be formed between the oxide semiconductor layer and the source and drain electrodes. The oxide conductive layer preferably contains zinc oxide as a component and preferably does not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region or a low-resistance source (LRS, also referred to as an LRN (low-resistance n-type conductivity)) region. Specifically, the carrier concentration of the low-resistance drain region is higher than that of the high-resistance drain region (the HRD region) and is preferably in a range of $1\times10^2$ $cm^3$ or higher and $1\times10^{21}/cm^3$ or lower. Providing the oxide conductive layer between the oxide semiconductor layer and the source and drain electrodes can reduce contact resistance and realizes higher speed operation of the transistor. Accordingly, frequency characteristics of a peripheral circuit (a driver circuit) can be improved.

The oxide conductive layer and a conductive layer for forming the source and drain electrodes can be formed in succession Then, a channel formation region is formed by making at least part of the oxide semiconductor layer subjected to dehydration or dehydrogenation be in an oxygen-excess state so as to be a higher-resistance oxide semiconductor layer, i.e., an i-type oxide semiconductor layer. Note that as a method for making the oxide semiconductor layer subjected to dehydration or dehydrogenation be in an oxygen-excess state, a method for forming an oxide insulating layer so as to be in contact with the oxide semiconductor layer subjected to dehydration or dehydrogenation, for example, by a sputtering method, or the like is given. In addition, after the formation of the oxide insulating layer, heat treatment (e.g., heat treatment under an atmosphere containing oxygen), cooling treatment under an oxygen atmosphere or cooling treatment in ultra-dry air (having a dew point of lower than or equal to −40° C., preferably lower than or equal to −60° C.) after heating under an inert gas atmosphere, or the like may be performed.

Further, in order to make at least part of the oxide semiconductor layer subjected to dehydration or dehydrogenation (a portion overlapping with a gate electrode layer) serve as the channel formation region, the oxide semiconductor layer is selectively made to be in an oxygen-excess state so as to be a high-resistance oxide semiconductor layer, i.e., an i-type oxide semiconductor layer. For example, the channel formation region can be formed in such a manner that a source electrode layer and a drain electrode layer formed using metal electrodes of Ti or the like are formed over and in contact with the oxide semiconductor layer subjected to dehydration or dehydrogenation and an exposed region of the oxide semiconductor layer which does not overlap with the source electrode layer and the drain electrode layer is selectively made to be in an oxygen-excess state. In the case where the oxide semiconductor layer is selectively made to be in an oxygen-excess state, a high-resistance source region overlapping with the source electrode layer and a high-resistance drain region overlapping with the drain electrode layer are formed, and a region between the high-resistance source region and the high-resistance drain region becomes the channel formation region. That is, the channel formation region is formed between the source electrode layer and the drain electrode layer in a self-aligned manner.

According to one embodiment of the present invention, it is possible to manufacture and provide a semiconductor device including a highly reliable thin film transistor with favorable electrical characteristics.

Note that by the formation of the high-resistance drain region (and the high-resistance source region) in the oxide semiconductor layer, which overlaps with the drain electrode layer (and the source electrode layer), reliability of a driver circuit can be improved. Specifically, by forming the high-resistance drain region, the transistor can have a structure in which conductivity can be varied gradually from the drain electrode layer to the high-resistance drain region and the channel formation region. Thus, in the case where operation is performed with the drain electrode layer connected to a wiring for supplying a high power supply potential VDD, the high-resistance drain region serves as a buffer, and thus local concentration of an electric field does not occur even if the high electric field is applied between the gate electrode layer and the drain electrode layer, which leads to an increase in the in dielectric withstand voltage of the transistor.

In addition, by the formation of the high-resistance drain region (and the high-resistance source region), the amount of leakage current in the driver circuit can be reduced. Specifically, by forming the high-resistance source region and the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel formation region can be concentrated on the vicinity of an interface between the channel formation region and a gate insulating layer, which has high resistance when the transistor is off. Thus, the amount of leakage current in a back channel portion (part of a surface of the channel formation region, which is apart from the gate electrode layer) can be reduced.

Further, the high-resistance source region overlapping with the source electrode layer and the high-resistance drain region overlapping with the drain electrode layer, although depending on the width of the gate electrode layer, overlap with part of the gate electrode layer with the gate insulating layer therebetween, and thus the intensity of an electric field in the vicinity of an end portion of the drain electrode layer can be reduced more effectively.

Note that the ordinal numbers such as "first" and "second" in this specification are used for convenience and do not denote the order of steps and the stacking order of layers. In addition, the ordinal numbers in this specification do not denote particular names which specify the present invention.

As a display device including a driver circuit, a display device in which an electrophoretic display element is used, which is also referred to as electronic paper, is given in addition to a liquid crystal display device.

When a pixel portion and a driver circuit are formed over one substrate in a liquid crystal display device, in the driver circuit, only one of positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a VCO. Therefore, one of the high-resistance drain region which requires high dielectric withstand voltage may be designed to be wider than the high-resistance source region. In addition, the width of each of portions of the high-resistance source region and the high-resistance drain region overlapping with the gate electrode layer may be increased.

A thin film transistor having a single-gate structure is described as the thin film transistor provided for a driver circuit; however, a thin film transistor having a multi-gate structure in which a plurality of channel formation regions are included can also be used as needed.

An AC drive is performed in the liquid crystal display device in order to prevent deterioration of a liquid crystal. Through the AC drive, the polarity of a signal potential applied to a pixel electrode layer is inverted to be negative or positive at regular intervals of time. In a TFT which is connected to the pixel electrode layer, a pair of electrodes functions as a source electrode layer and a drain electrode layer. In this specification, one electrode of the pixel thin film transistor is referred to as a source electrode layer and the other one is referred to as a drain electrode layer; actually in AC drive, one electrode functions alternately as the source electrode layer and the drain electrode layer. In order to reduce the amount of leakage current, the width of the gate electrode layer of the thin film transistor provided in the pixel may be smaller than the width of the gate electrode layer of the thin film transistor in the driver circuit. Alternatively, in order to reduce the amount of leakage current, the gate electrode layer in the thin film transistor provided in the pixel may be designed so as not to overlap with the source electrode layer and the drain electrode layer.

Since a thin film transistor is easily broken due to static electricity or the like, a protective circuit for protecting the thin film transistor in the pixel portion is preferably provided over the same substrate for a gate line or a source line. The protective circuit is preferably formed with a non-linear element including an oxide semiconductor layer.

In an embodiment of the present invention, a thin film transistor having stable electric characteristics can be manufactured and provided. Therefore, a semiconductor device which includes highly reliable thin film transistors having favorable electric characteristics can be provided.

BRIEF DESCRIPTION OF DRAWINGS

In the accompanying drawings:

FIGS. 2A to 2C illustrate a method for manufacturing a semiconductor device;

FIGS. 3A to 3C illustrate a method for manufacturing a semiconductor device;

FIGS. 5A1 and 5A2 and FIGS. 5B1 and 5B2 illustrate a semiconductor device;

FIGS. 7A to 7C illustrate a method for manufacturing a semiconductor device;

FIGS. 14A1 and 14A2 and FIG. 14B illustrate a semiconductor device;

BEST MODE FOR CARRYING OUT THE INVENTION

Figure 1:
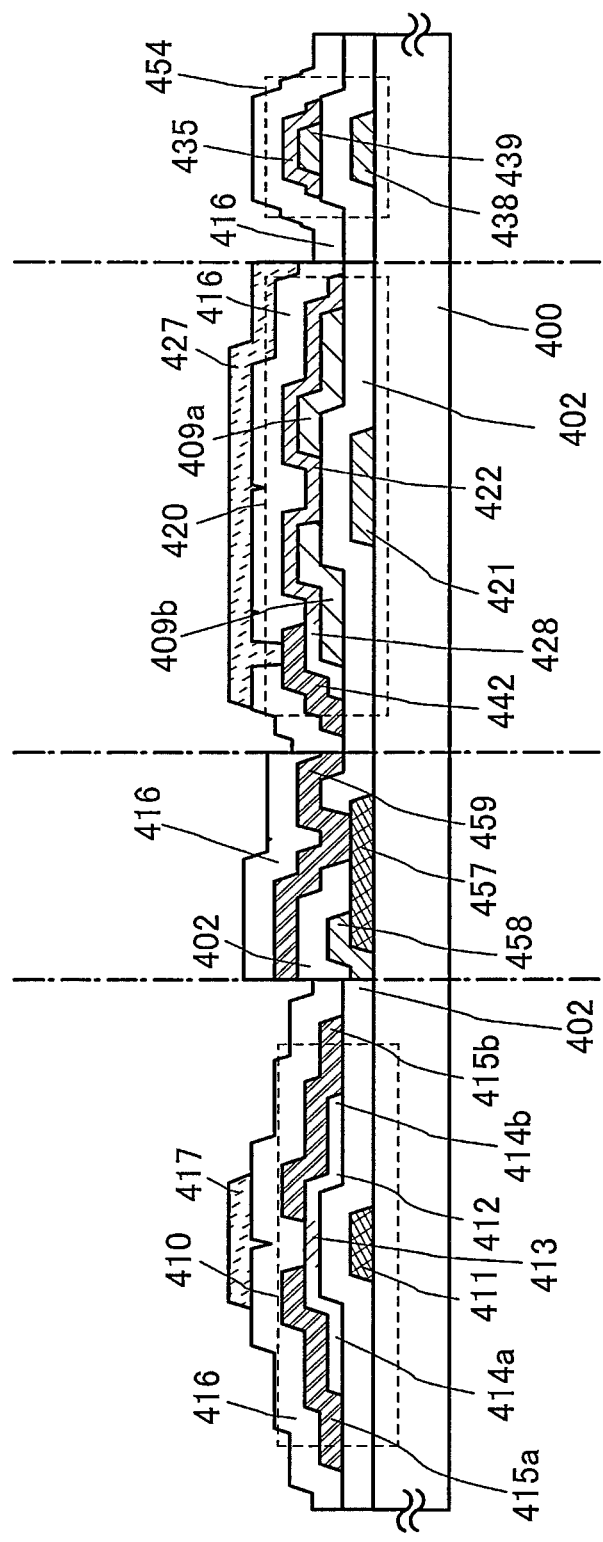
FIG. 1 illustrates a semiconductor device.

Embodiments will be described in detail with reference to the accompanying drawings. However, the present invention is not limited to the following description, and various changes for the modes and details thereof will be apparent to those skilled in the art unless such changes depart from the spirit and the scope of the invention. Therefore, the present invention should not be interpreted as being limited to what is described in the embodiments below. In the structures to be given below, the same portions or portions having similar functions are denoted by the same reference numerals in different drawings, and explanation thereof will not be repeated.

Note that contents described in each of the following embodiments can be combined with or replaced with each other as appropriate.

Embodiment 1

A structure of a semiconductor device of the present invention is described using FIG. 1. FIG. 1 is a cross-sectional view illustrating a structural example of the semiconductor device of this embodiment.

In the semiconductor device illustrated in FIG. 1, a driver circuit and a pixel portion are provided over a substrate 400. The driver circuit includes a thin film transistor 410. A pixel includes a thin film transistor 420.

The thin film transistor 410 includes a gate electrode layer 411 provided over the substrate 400; a gate insulating layer 402 provided over the gate electrode layer 411; an oxide semiconductor layer 412 which is provided over the gate electrode layer 411 with the gate insulating layer 402 therebetween and includes at least a channel formation region 413, a high-resistance source region 414a, and a high-resistance drain region 414b; and a source electrode layer 415a and a drain electrode layer 415b which are provided over the oxide semiconductor layer 412.

The gate electrode layer 411 preferably has low resistance and is preferably formed using, for example, a metal material.

The gate insulating layer 402 is formed, for example, with a single layer of any of an oxide insulating layer and a nitride insulating layer, or a stacked layer of one of or both an oxide insulating layer and a nitride insulating layer. The gate insulating layer 402 preferably has a light-transmitting property.

The high-resistance source region 414a is formed in contact with a bottom surface of the source electrode layer 415a in a self-aligned manner. The high-resistance drain region 414b is formed in contact with a bottom surface of the drain electrode layer 415b in a self-aligned manner. In addition, the channel formation region 413 is a region (an i-type region) having higher resistance than the high-resistance source region 414a and the high-resistance drain region 414b.

The source electrode layer 415a and the drain electrode layer 415b preferably have low resistance. For example, a metal material is preferably used for the source electrode layer 415a and the drain electrode layer 415b.

In addition, the driver circuit may have a structure in which the gate electrode layer or a conductive layer formed using the same conductive film as the gate electrode layer is electrically connected to the source electrode layer, the drain electrode layer, or a conductive layer formed using the same conductive film as the source electrode layer and the drain electrode layer through an opening portion provided in the gate insulating layer. The semiconductor device illustrated in FIG. 1 includes a conductive layer 457 formed using the same conductive film as the gate electrode layer 411, a conductive layer 458 which is formed over the conductive layer 457 with the use of the same conductive film as a gate electrode layer 421, the gate insulating layer 402 provided over the conductive layer 458, and a conductive layer 459 which is formed over the gate insulating layer 402 and electrically connected to the conductive layer 457 through the opening portion provided in the gate insulating layer 402. The conductive layer 459 is formed using the same conductive film as the source electrode layer 415a and the drain electrode layer 415b. Accordingly, favorable contact can be obtained, which leads to a reduction in contact resistance. Therefore, the number of openings can be reduced, which results in reducing the area occupied by the driver circuit.

The thin film transistor 420 includes the gate electrode layer 421 provided over the substrate 400; the gate insulating layer 402 provided over the gate electrode layer 421; a source electrode layer 409a and a drain electrode layer 409b which are provided over the gate insulating layer 402; and an oxide semiconductor layer 422 provided over the source electrode layer 409a, the drain electrode layer 409b, and the gate insulating layer 402.

A light-transmitting material is used for the gate electrode layer 421 in order to obtain a display device having a high aperture ratio. For example, the gate electrode layer 421 is formed using a light-transmitting film.

Further, a light-transmitting material is used for the source electrode layer 409a and the drain electrode layer 409b in order to obtain a display device having a high aperture ratio. For example, the source electrode layer 409a and the drain electrode layer 409b are formed using a light-transmitting film.

In this specification, a light-transmitting film refers to a film which has such a thickness that a visible light transmittance thereof is 75% to 100%. When the material included in the film has conductivity, it is also referred to as a transparent conductive film. Further, a conductive film that is semi-transparent to visible light may be used for the gate electrode layer, the source electrode layer, the drain electrode layer, the pixel electrode layer, or a different electrode layer or a different wiring layer. Semi-transparency to visible light means that the visible light transmittance thereof is 50% to 75%.

Note that the thin film transistor 420 illustrated in FIG. 1 has a structure in which top surfaces and side surfaces of the source electrode layer 409a and the drain electrode layer 409b are covered with the oxide semiconductor layer 422. However, this embodiment is not limited thereto. The thin film transistor 420 may have a structure in which the oxide semiconductor layer 422 is provided over part of the source electrode layer 409a and the drain electrode layer 409b.

In addition, the pixel portion includes a conductive layer 442 electrically connected to the drain electrode layer 409b. The conductive layer 442 illustrated in FIG. 1 is provided over part of the oxide semiconductor layer 422.

The conductive layer 442 preferably has low resistance. For example, a metal material is preferably used for the conductive layer 442.

The oxide semiconductor layer 422 includes a region 428. The region 428 is formed in contact with a bottom surface of the conductive layer 442 in a self-aligned manner. The region 428 becomes an oxygen-deficient region by heat treatment so as to be a low-resistance region, that is, an n-type (e.g., n$^-$-type) region. The region 428 is an oxygen-deficient region like a high-resistance source region and a high-resistance drain region. Therefore, the carrier concentration of the region 428 is higher than that of the channel formation region similarly to those of the high-resistance source region and the high-resistance drain region. Note that the region 428 is also referred to as a high-resistance region.

Further, the pixel portion may include a capacitor 454. The capacitor 454 includes a conductive layer 438 provided over the substrate 400, a conductive layer 439 provided over the conductive layer 438 with the gate insulating layer 402 therebetween, and an oxide semiconductor layer 435 provided over the conductive layer 439. The capacitor 454 has a function as a storage capacitor of the pixel portion.

When the whole capacitor 454 is formed using a light-transmitting material, an aperture ratio of the pixel can be improved. Therefore, it is preferable that the conductive layer 438, the conductive layer 439, and the oxide semiconductor layer 435 have a light-transmitting property.

The light-transmitting property of the capacitor 454 is important in increasing the aperture ratio. For small liquid crystal display panels of 10 inches or smaller in particular, even when the size of pixels is decreased in order to realize higher resolution of display images by increasing the number of gate wirings, for example, a high aperture ratio can be achieved. Further, a light-transmitting film is used for a component of the thin film transistor 420 and the capacitor 454, whereby a high aperture ratio can be realized even when one pixel is divided into a plurality of subpixels in order to realize a wide viewing angle. In other words, an aperture ratio can be high even when a group of thin film transistors are densely arranged, so that a display region can have a sufficient area. For example, in the case where one pixel includes two to four sub-pixels, the storage capacitors have a light-transmitting property as well as the thin film transistors, so that the aperture ratio can be increased.

The driver circuit and the pixel portion of the semiconductor device illustrated in FIG. 1 include an oxide insulating layer 416 which is in contact with at least part of the oxide semiconductor layer 412 and part of the oxide semiconductor layer 422.

Further, the driver circuit of the semiconductor device illustrated in FIG. 1 includes a conductive layer 417 which is provided over the oxide insulating layer 416 and overlaps with the channel formation region 413. For example, the conductive layer 417 is electrically connected to the gate electrode layer 411 so that the conductive layer 417 and the gate electrode layer 411 have the same potential, whereby a gate voltage can be applied from above and below the oxide semiconductor layer 412 placed between the gate electrode layer 411 and the conductive layer 417. Alternatively, when the gate electrode layer 411 and the conductive layer 417 are made to have different electric potentials, for example, when the conductive layer 417 has a fixed potential, GND, or 0 V, the electrical characteristics of the TFT, such as the threshold voltage, can be controlled.

In addition, the pixel portion of the semiconductor device illustrated in FIG. 1 includes a pixel electrode layer 427 which is provided over the oxide insulating layer 416 and in contact with the conductive layer 442 through a contact hole provided in the oxide insulating layer 416.

Note that the capacitor 454 can be formed with the conductive layer 439 provided over the gate insulating layer 402, the oxide semiconductor layer 435 provided over the conductive layer 439, the oxide insulating layer 416 provided over the oxide semiconductor layer 435, and the pixel electrode layer 427, without providing the conductive layer 438.

Note that a nitride insulating layer may be provided over the oxide insulating layer 416. The nitride insulating layer is preferably in contact with the gate insulating layer 402 provided below the oxide insulating layer 416 or an insulating film serving as a base, and blocks entry of impurities such as moisture, a hydrogen ion, and OH$^-$ from the vicinity of a side surface of the substrate. The above structure is effective particularly when a silicon nitride film is used for the gate insulating layer 402 in contact with the oxide insulating layer 416 or the insulating film serving as a base. In other words, when a silicon nitride film is provided so as to surround bottom surfaces, top surfaces, and side surfaces of the oxide semiconductor layer 412 and the oxide semiconductor layer 422, the reliability of the display device can be improved.

Further, a planarization insulating layer may be provided between the oxide insulating layer 416 and the pixel electrode layer 427. In the case where the nitride insulating layer is provided over the oxide insulating layer 416, a planarization insulating layer is preferably provided over the nitride insulating layer. The planarization insulating layer can be formed using a heat-resistant organic material, such as polyimide, acrylic resin, benzocyclobutene resin, polyamide, or epoxy resin. Other than such organic materials, it is also possible to use a low-dielectric constant material (a low-k material), a siloxane-based resin, PSG (phosphosilicate glass), BPSG (borophosphosilicate glass), or the like for the planarization insulating layer. Note that the planarizing insulating layer may be formed by stacking a plurality of insulating films formed of these materials.

Note that the siloxane resin corresponds to a resin including a Si—O—Si bond formed using a siloxane-based material as a starting material. The siloxane-based resin may include as a substituent an organic group (e.g., an alkyl group or an aryl group). Moreover, the organic group may include a fluoro group.

There is no particular limitation on the method for forming the planarization insulating layer. The planarization insulating layer can be formed, depending on the material, with a method or means such as a sputtering method, an SOG method, a spin coating method, a dipping method, a spray coating method, a droplet discharge method (e.g., an ink-jet method, screen printing, or offset printing), a doctor knife, a roll coater, a curtain coater, or a knife coater.

Note that heat treatment for reducing impurities such as moisture (heat treatment for dehydration or dehydrogenation) is performed on the oxide semiconductor layer 412 and the oxide semiconductor layer 422. After heat treatment for dehydration or dehydrogenation and slow cooling, the carrier concentration of the oxide semiconductor layer is reduced by formation of an oxide insulating film, as the oxide insulating layer, in contact with the oxide semiconductor layer, or the like, which leads to improvement in electric characteristics and reliability of the thin film transistor 410 and the thin film transistor 420.

Note that in the semiconductor device illustrated in FIG. 1, higher-speed operation is needed for the thin film transistor of the driver circuit as compared to the thin film transistor of the pixel portion. Therefore, the channel length of the thin film transistor 410 may be shorter than that of the thin film transistor 420. At this time, for example, it is preferable that the channel length of the thin film transistor 410 be approximately 1 μm to 5 μm, and the channel length of the thin film transistor 420 be 5 μm to 20 μm.

As described above, the example of the semiconductor device of this embodiment has a structure in which the driver circuit including a first thin film transistor (the thin film transistor 410) and the pixel portion including a second thin film transistor (the thin film transistor 420) are provided over one substrate. An electrode of the second thin film transistor is formed using a light-transmitting material, and an electrode of the first thin film transistor is formed using a material having lower resistance than the light-transmitting material. Accordingly, an aperture ratio of the pixel portion and operation speed of the driver circuit can be improved. In addition, when the driver circuit and the pixel portion are provided over one substrate, the number of wirings which connect the driver circuit and the pixel portion to each other can be reduced and the length of the wiring can be shortened; therefore, the size and cost of the semiconductor device can be reduced.

In addition, an example of the semiconductor device of this embodiment can have a structure in which the conductive layer which overlaps with the channel formation region and is formed using a light-transmitting material is provided over the oxide insulating layer in the thin film transistor of the driver circuit. With this structure, the threshold voltage of the thin film transistor can be controlled.

Further, an example of the semiconductor device of this embodiment has a structure in which the pixel electrode of the pixel portion is electrically connected to the drain electrode of the thin film transistor of the pixel portion with a conductive layer (the conductive layer 442) therebetween. Accordingly, contact resistance between the pixel electrode and the drain electrode of the thin film transistor can be reduced.

In addition, an example of the semiconductor device of this embodiment has a structure in which the pixel electrode layer is electrically connected to the oxide semiconductor layer with the conductive layer therebetween in the pixel portion. Accordingly, contact resistance between the pixel electrode layer and the oxide semiconductor layer can be reduced.

Next, an example of a method for manufacturing the semiconductor device illustrated in FIG. 1 is described using FIGS. 2A to 2C, FIGS. 3A to 3C, and FIGS. 4A and 4B.

First, the substrate 400 is prepared and a conductive film is formed over the substrate 400. Then, a first photolithography step is performed, so that a resist mask is formed over part of the conductive film. The conductive film is etched using the resist mask, whereby the gate electrode layer 411 is formed (see FIG. 2A).

It is necessary that the substrate 400 have an insulating surface and have at least enough heat resistance to heat treatment to be performed later. As the substrate 400, a glass substrate or the like can be used, for example.

As a glass substrate, if the temperature of the heat treatment to be performed later is high, a glass substrate whose strain point is 730° C. or higher is preferably used. As the glass substrate, a glass material such as aluminosilicate glass, aluminoborosilicate glass, or barium borosilicate glass is used, for example. Note that by containing a larger amount of barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used as substrate 400, instead of the glass substrate. Alternatively, crystallized glass or the like may be used as the substrate 400. Since the semiconductor device described in this embodiment is a transmissive type, a light-transmitting substrate is used as the substrate 400; however, in the case of a reflective type, a non-light-transmitting substrate such as a metal substrate may be used as the substrate 400.

Further, an insulating film serving as a base film may be provided between the substrate 400 and the gate electrode layer 411. The base film has a function of preventing diffusion of an impurity element from the substrate 400, and can be formed with a single film or a stacked film using one or more of a silicon nitride film, a silicon oxide film, a silicon nitride oxide film, and a silicon oxynitride film.

As an example of a material of the conductive film for forming the gate electrode layer 411, a metal material such as molybdenum, titanium, chromium, tantalum, tungsten, aluminum, copper, neodymium, or scandium or an alloy material containing any of these materials as a main component can be used. The conductive film for forming the gate electrode layer 411 and the conductive layer 457 can be formed with a single film or a stacked film containing one or plurality of these materials.

As the metal conductive film for forming the gate electrode layer 411, a three-layer stacked film including a titanium film, an aluminum film provided over the titanium film, and a titanium film provided over the aluminum film, or a three-layer stacked film including a molybdenum film, an aluminum film provided over the molybdenum film, and a molybdenum film provided over the aluminum film is preferably used. Needless to say, a single layer film, a two-layer stacked film, or a stacked film of four or more layers may also be used as the metal conductive film. When a stacked conductive film including a titanium film, an aluminum film, and a titanium film is used as the conductive film, etching can be performed by a dry etching method with the use of a chlorine gas.

Further, the conductive layer 457 is formed in the driver circuit with the use of the same material and the same photolithography step as those of the gate electrode layer 411. The conductive layer 457 has a function as a terminal electrode or a terminal wiring.

Next, the resist mask is removed and the conductive film is formed over the gate electrode layer 411 and the conductive layer 457. A second photolithography step is performed, so that a resist mask is formed over part of the conductive film. The conductive film is etched using the resist mask, whereby the gate electrode layer 421 is formed (see FIG. 2B).

As the conductive film for forming the gate electrode layer 421, a conductive material that transmits visible light, for example, any of the following conductive materials can be used: an In—Sn—Zn—O-based conductive material, an In—Al—Zn—O-based conductive material, an Sn—Ga—Zn—O-based conductive material, an Al—Ga—Zn—O-based conductive material, an Sn—Al—Zn—O-based conductive material, an In—Zn—O-based conductive material, an Sn—Zn—O-based conductive material, an Al—Zn—O-based conductive material, an In—Sn—O-based conductive material, an In—O-based conductive material, an Sn—O-based conductive material, and a Zn—O-based conductive material. The thickness of the conductive film is set within the range of 50 nm to 300 nm inclusive. The metal oxide film used for the gate electrode layer 421 is deposited by a sputtering method, a vacuum evaporation method (e.g., an electron beam evaporation method), an arc discharge ion plating method, or a spray method. In the case where the light-transmitting conductive film is formed by a sputtering method, it is preferable that deposition be performed with a target containing $SiO_2$ at 2 wt % to 10 wt % inclusive so that $SiO_x$ (X>0) which inhibits crystallization is contained in the light-transmitting conductive film. Accordingly, crystallization at the time of heat treatment for dehydration or dehydrogenation performed later can be suppressed.

In addition, the conductive layer 458 is formed in the driver circuit and the conductive layer 438 is formed in the pixel portion using the same material and the same steps as those of the gate electrode layer 421. The conductive layer 458 has a function as a terminal electrode or a terminal wiring. The conductive layer 438 has a function as a capacitor wiring. Furthermore, when a capacitor is necessary in the driver circuit as well as in the pixel portion, a capacitor wiring is also formed in the driver circuit.

Then, the resist mask is removed and the gate insulating layer 402 is formed over the gate electrode layer 411, the conductive layer 457, the conductive layer 458, the gate electrode layer 421, and the conductive layer 438.

The gate insulating layer 402 can be formed with a single layer or a stacked layer using a silicon oxide layer, a silicon nitride layer, a silicon oxynitride layer, or a silicon nitride oxide layer by a plasma CVD method, a sputtering method, or the like. For example, when a silicon oxynitride layer is formed, it may be formed using $SiH_4$, oxygen, and nitrogen as deposition gases by a plasma CVD method. The thickness of the gate insulating layer 402 is set to 100 nm to 500 nm, inclusive. In the case of using a stacked layer, a first gate insulating layer having a thickness of 50 nm to 200 nm inclusive and a second gate insulating layer having a thickness of 5 nm to 300 nm inclusive over the first gate insulating layer are stacked. In addition, when a silicon oxide film formed using a silicon target material doped with boron is used as the gate insulating layer 402, intrusion of impurities (moisture, hydrogen ions, OH⁻, or the like) can be suppressed.

In this embodiment, the gate insulating layer 402 that is a silicon nitride layer having a thickness of 200 nm or less formed by a plasma CVD method is formed.

Then, a conductive film is formed over the gate insulating layer 402. A third photolithography step is performed, so that a resist mask is formed over part of the conductive film. The conductive film is etched using the resist mask, whereby the source electrode layer 409a and the drain electrode layer 409b are formed.

As the conductive film for forming the source electrode layer 409a and the drain electrode layer 409b, for example, a conductive material that transmits visible light such as an In—Sn—O-based oxide conductive film, an In—Sn—Zn—O-based oxide conductive film, an In—Al—Zn—O-based oxide conductive film, an Sn—Ga—Zn—O-based oxide conductive film, an Al—Ga—Zn—O-based conductive film, an Sn—Al—Zn—O-based oxide conductive film, an In—Zn—O-based oxide conductive film, an Sn—Zn—O-based oxide conductive film, an Al—Zn—O-based oxide conductive film, an In—O-based oxide conductive film, an Sn—O-based oxide conductive film, or a Zn—O-based oxide conductive film can be employed. The thickness of the conductive film is selected as appropriate in the range of 50 nm to 300 nm inclusive. When a sputtering method is employed as a deposition method of the conductive film, it is preferable that deposition be performed using a target containing $SiO_2$ at 2 wt % to 10 wt % inclusive and $SiO_x$ (x>0) which inhibits crystallization be contained in the light-transmitting conductive film so as to prevent crystallization of oxide conductive layers which are formed later at the time of the heat treatment for dehydration or dehydrogenation in a later step.

In addition, in the pixel portion, the conductive layer 439 is formed using the same material and the same steps as those of the source electrode layer 409a and the drain electrode layer 409b. The conductive layer 439 has a function of a capacitor electrode. Furthermore, when a capacitor is necessary in the driver circuit as well as in the pixel portion, the capacitor wiring is also formed in the driver circuit.

Next, the resist mask is removed and an oxide semiconductor film 430 having a thickness of 2 nm to 200 nm inclusive is formed over the gate insulating layer 402, the source electrode layer 409a, the drain electrode layer 409b, and the conductive layer 439. The oxide semiconductor film 430 preferably has a thickness of 50 nm or less such that an oxide semiconductor layer formed later is in an amorphous state even when heat treatment for dehydration or dehydrogenation is performed after the oxide semiconductor film 430 is formed. The small thickness of the oxide semiconductor film 430 can prevent the oxide semiconductor layer formed later from being crystallized when heat treatment is performed after the formation of the oxide semiconductor film 430.

Note that before the oxide semiconductor film 430 is formed by a sputtering method, dust on a surface of the gate insulating layer is preferably removed by reverse sputtering in which an argon gas is introduced and plasma is generated. The reverse sputtering refers to a method in which, without application of voltage to a target side, an RF power source is used for application of voltage to a substrate side in an argon atmosphere so that plasma is generated around the substrate to modify a surface. Note that instead of an argon atmosphere, nitrogen, helium, oxygen or the like may be used.

As the oxide semiconductor film 430, an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—Sn—O-based oxide semiconductor film, an In—O-based oxide semiconductor film, a Sn—O-based oxide semiconductor film, or a Zn—O-based oxide semiconductor film is used. In this embodiment, the oxide semiconductor film 430 is formed by sputtering with the use of an In—Ga—Zn—O-based oxide semiconductor target. Alternatively, the oxide semiconductor film 430 can be formed by a sputtering method in a rare gas (typically argon) atmosphere, an oxygen atmosphere, or an atmosphere containing a rare gas (typically argon) and oxygen. In the case where the oxide semiconductor film 430 is formed by a sputtering method, it is preferable that deposition be performed with a target containing $SiO_2$ at 2 wt % to 10 wt % inclusive so that $SiO_x$ (X>0) which inhibits crystallization is contained in the oxide semiconductor film. Accordingly, crystallization of the oxide semiconductor layer to be formed later can be suppressed in heat treatment for dehydration or dehydrogenation which is to be performed later.

Then, a resist mask is formed over the oxide semiconductor film 430 through a fourth photolithography step. Unnecessary portions of the oxide semiconductor film 430 and the gate insulating layer 402 are removed by etching, so that a contact hole 426 reaching the conductive layer 457 is formed in the gate insulating layer 402 (see FIG. 2C).

When the contact hole is formed in the gate insulating layer in the state where the oxide semiconductor film is stacked over the entire surface of the gate insulating layer in such a manner, the resist mask is not directly in contact with the surface of the gate insulating layer; accordingly, contamination of the surface of the gate insulating layer (e.g., attachment of impurities or the like to the gate insulating layer) can be prevented. Thus, a favorable state of the interface between the gate insulating layer and the oxide semiconductor film can be obtained, thereby improving reliability.

However, this embodiment is not limited thereto. The contact hole may be formed in such a manner that a resist pattern is formed on the gate insulating layer directly. In that case, it is preferable that after the resist is removed, heat treatment be performed to perform dehydration, dehydrogenation, or dehydroxylation of the surface of the gate insulating film. For example, impurities such as hydrogen and water contained in the gate insulating layer may be removed by heat treatment (e.g., 400° C. to 700° C. inclusive) in an inert gas (nitrogen, helium, neon, or argon) atmosphere or an oxygen atmosphere.

Then, a resist mask is formed through a fifth photolithography step and selective etching is performed on the oxide semiconductor film 430 using the resist mask, whereby the oxide semiconductor film 430 is processed into island-shaped oxide semiconductor layers.

Then, the resist mask is removed, and the oxide semiconductor layers are subjected to dehydration or dehydrogenation. First heat treatment for dehydration or dehydrogenation is performed, for example, at 400° C. to 700° C. inclusive, or preferably 425° C. or higher. Note that in the case of the temperature of 425° C. or higher, the heat treatment time may be one hour or shorter, whereas in the case of the temperature that is lower than 425° C., the heat treatment time is longer than one hour. Here, the substrate over which the oxide semiconductor layers are formed is introduced into an electric furnace, which is one of heat treatment apparatuses. After heat treatment is performed on the oxide semiconductor layers in a nitrogen atmosphere, the oxide semiconductor layers are not exposed to the air and water and hydrogen are prevented from being mixed into the oxide semiconductor layers again; thus, an oxide semiconductor layer 431 and an oxide semiconductor layer 432 are obtained (see FIG. 3A). In this embodiment, the same furnace is used from the heat temperature T at which the oxide semiconductor layers are subjected to dehydration or dehydrogenation to a temperature low enough to prevent water from entering again; specifically, slow cooling is performed in a nitrogen atmosphere until the temperature drops by 100° C. or more from the heat temperature T. Moreover, without limitation to a nitrogen atmosphere, dehydration or dehydrogenation is performed in a rare gas atmosphere (e.g., helium, neon, or argon).

When the oxide semiconductor layers are subjected to heat treatment at 400° C. to 700° C., the dehydration or dehydrogenation of the oxide semiconductor layers can be achieved; thus, water ($H_2O$) can be prevented from being contained again in the oxide semiconductor layers later.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have purity of 6N (99.9999%) or more, preferably, 7N (99.99999%) or more; that is, an impurity concentration is set to 1 ppm or lower, preferably 0.1 ppm or lower.

Note that the heat treatment apparatus is not limited to an electric furnace, and may have a device for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus in which heat treatment is performed using a high-temperature gas. As the gas, an inert gas which does not react with an object to be processed by heat treatment, like nitrogen or a rare gas such as argon is used. In the case where a GRTA apparatus is used, heat temperature is preferably 450° C. to 700° C. inclusive, for example.

In some cases, the oxide semiconductor layers are crystallized to be microcrystalline films or polycrystalline films depending on the conditions of the first heat treatment or the material of the oxide semiconductor layers. In the case of the microcrystalline films, it is preferable that a crystal component account for 80% or more (preferably 90% or more) of the whole microcrystalline film and the microcrystalline film be filled with microcrystalline grains so that the adjacent microcrystalline grains are in contact with each other. In some cases, the whole oxide semiconductor layers are in an amorphous state.

In addition, the first heat treatment can also be performed on the oxide semiconductor film before being processed into the island-shaped oxide semiconductor layers. In such a case, the substrate is taken out of the heat treatment apparatus after the first heat treatment, and the resist mask is formed through the photolithography step. Then, selective etching is performed using the resist mask, whereby the oxide semiconductor film is processed to be the oxide semiconductor layers.

The heat treatment for dehydration or dehydrogenation of the oxide semiconductor layers may be performed at any of the following timings: after the oxide semiconductor layers are formed; after the source electrode layer and the drain electrode layer are formed over the oxide semiconductor layer of the driver circuit; and after the oxide semiconductor layer is formed over the source electrode layer and the drain electrode layer.

In addition, before the oxide semiconductor film is formed, heat treatment (for example, 400° C. or higher and less than 700° C.) may be performed in an inert gas atmosphere (nitrogen or a rare gas such as helium, neon, or argon) or an oxygen atmosphere, thereby removing impurities such as hydrogen and water contained in the gate insulating layer.

Note that the etching of the oxide semiconductor film here is not limited to a wet etching but a dry etching may also be employed.

As the etching gas for dry etching, a gas containing chlorine (chlorine-based gas such as chlorine ($Cl_2$), trichloroboron ($BCl_3$), tetrachlorosilane ($SiCl_4$), or tetrachloromethane ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid can be used. In addition, ITO07N (produced by KANTO CHEMICAL CO., INC.) may also be used.

Furthermore, the etchant after the wet etching is removed together with the etched material by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

An oxide semiconductor target containing In, Ga, and Zn ($In_2O_3:Ga_2O_3:ZnO=1:1:1$ [in a molar ratio], In:Ga:Zn=1:1:0.5 [in an atomic ratio]) is used. The oxide semiconductor film 430 is formed under the following condition: the distance between the substrate and the target is 100 mm, the pressure is 0.2 Pa, the direct current (DC) power is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because dust can be reduced and the film thickness can be uniform. The In—Ga—Zn—O-based film is formed to a thickness of 5 nm to 200 nm. A target material including such as In:Ga:ZnO=1:1:1 or In:Ga:ZnO=1:1:4 can be used for the oxide semiconductor target material.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

Note that the oxide semiconductor layer 432 illustrated in FIG. 3A is formed so as to cover the top surfaces and the side surfaces of the source electrode layer 409a and the drain electrode layer 409b. Accordingly, the oxide semiconductor film can be etched without any consideration of etching selectivity of the oxide semiconductor film to the source electrode layer 409a and the drain electrode layer 409b. However, this embodiment is not limited thereto. Alternatively, the oxide semiconductor film can be etched so that the oxide semiconductor layer 432 is formed over part of the source electrode layer 409a and the drain electrode layer 409b as long as the source electrode layer 409a and the drain electrode layer 409b are not etched.

In addition, in the pixel portion, the oxide semiconductor layer 435 is formed using the same material and the same steps as those of the oxide semiconductor layer 431 and the oxide semiconductor layer 432. The oxide semiconductor layer 435 has a function as a capacitor wiring. Furthermore, when a capacitor is necessary in the driver circuit as well as in the pixel portion, the capacitor wiring is also formed in the driver circuit.

Next, a conductive film is formed over the oxide semiconductor layer 431, the oxide semiconductor layer 432, the oxide semiconductor layer 435, and the gate insulating layer 402. A resist mask 433a and a resist mask 433b are formed over the conductive film through a sixth photolithography step. Then, selective etching is performed, so that the source electrode layer 415a and the drain electrode layer 415b are formed (see FIG. 3B).

As a material of the conductive film for forming the source electrode layer 415a and the drain electrode layer 415b, a metal material such as molybdenum, titanium, chromium, tantalum, tungsten, aluminum, copper, neodymium, or scandium, or an alloy material containing any of these materials as its main component. The conductive material for forming the source electrode layer 415a and the drain electrode layer 415b can be formed with a single film or a stacked film including one or plurality of these materials.

As the conductive film for forming the source electrode layer 415a and the drain electrode layer 415b, a three-layer stacked film including a titanium film, an aluminum film provided over the titanium film, and a titanium film provided over the aluminum film, or a three-layer stacked film including a molybdenum film, an aluminum film provided over the molybdenum film, and a molybdenum film provided over the aluminum film is preferably used. Needless to say, a single layer film, a two-layer stacked film, or a stacked film of four or more layers may also be used as the metal conductive film. When a stacked conductive film including a titanium film, an aluminum film, and a titanium film is used as the conductive film, etching can be performed by a dry etching method with the use of a chlorine gas.

In addition, a resist mask 433c is formed using the same steps as the resist mask 433a and the resist mask 433b. The conductive layer 459 is formed in the driver circuit using the same material and the same steps as the source electrode layer 415a and the drain electrode layer 415b. The conductive layer 459 has a function as a terminal electrode or a terminal wiring.

A resist mask 433d is formed using the same steps as the resist mask 433a and the resist mask 433b. The conductive layer 442 is formed in the pixel portion using the same material and the same steps as the source electrode layer 415a and the drain electrode layer 415b.

Next, the resist masks 433a to 433d are removed and then the oxide insulating layer 416 is formed in contact with exposed surfaces of the oxide semiconductor layer 431 and the oxide semiconductor layer 432.

The oxide insulating layer 416 has a thickness of at least 1 nm and can be formed by a method by which impurities such as water and hydrogen are not mixed into the oxide insulating layer 416, such as a sputtering method, as appropriate. In this embodiment, a 300-nm-thick silicon oxide film is formed as the oxide insulating layer 416 by a sputtering method. The substrate temperature in deposition may be from room temperature to 300° C. or lower and in this embodiment, is 100° C. The silicon oxide film can be deposited by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed using a silicon target by a sputtering method in an atmosphere containing oxygen and nitrogen. The oxide insulating layer 416 which is formed in contact with the oxide semiconductor layer 431, the oxide semiconductor layer 432, and the oxide semiconductor layer 435 is formed using an inorganic insulating film that does not contain impurities such as moisture, a hydrogen ion, and OH$^-$ and blocks intrusion of such impurities from the outside, typically a silicon oxide film, a silicon nitride oxide film, an aluminum oxide film, or an aluminum oxynitride film. When a silicon oxide film formed using a silicon target material doped with boron is used as the oxide insulating layer 416, intrusion of impurities (moisture, hydrogen ions, OH$^-$, or the like) can be suppressed.

Further, second heat treatment (preferably 200° C. to 400° C. inclusive, for example, 250° C. to 350° C. inclusive) may be performed in an inert gas atmosphere or an oxygen gas atmosphere. For example, the second heat treatment is performed in a nitrogen atmosphere at 250° C. for one hour. By the second heat treatment, part of the oxide semiconductor layer 431 and the oxide semiconductor layer 432, and the oxide semiconductor layer 435 are heated while being in contact with the oxide insulating layer 416.

Through the above process, the resistance of each of the oxide semiconductor layer 431, the oxide semiconductor layer 432, and the oxide semiconductor layer 435 is reduced, and the part of oxide semiconductor layer 431 and the oxide semiconductor layer 432 is made to be in an oxygen-excess state selectively. As a result, the channel formation region 413 which is in contact with the oxide insulating layer 416 becomes i-type, and the oxide semiconductor layer 435 which is in contact with the oxide insulating layer 416 becomes i-type. The high-resistance source region 414a overlapping with the source electrode layer 415a, the high-resistance drain region 414b overlapping with the drain electrode layer 415b, and the region 428 overlapping with the conductive layer 442 are formed in a self-aligned manner (see FIG. 3C).

Note that formation regions of the high-resistance source region 414a, the high-resistance drain region 414b, and the region 428 are varied in accordance with the thickness of the oxide semiconductor layer. In the case where the thickness of the oxide semiconductor layer is, for example, 15 nm or less, portions overlapping with the source electrode layer, the drain electrode layer, and the conductive layer are totally n-type (n$^-$-type) regions. In the case where the thickness of the oxide semiconductor layer is, for example, 30 nm to 50 nm, in the portions overlapping with the source electrode layer, the drain electrode layer, and the conductive layer, n-type regions are formed in the vicinity of the source electrode layer, the drain electrode layer, and the conductive layer, and i-type regions are formed below the n-type regions.

By forming the high-resistance drain region 414b (or the high-resistance source region 414a), reliability of the driver circuit can be improved. Specifically, by forming the high-resistance drain region 414b, the conductivity can be gradually varied from the drain electrode layer to the high-resistance drain region 414b and the channel formation region in the transistor. Thus, when the transistor is operated while the drain electrode layer 415b is connected to a wiring that supplies a high power supply potential VDD, even when a high electric field is applied between the gate electrode layer 411 and the drain electrode layer 415b, the high-resistance drain region 414b (or the high-resistance source region 414a) serves as a buffer and local electric field concentration does not occur, so that the transistor can have increased withstand voltage.

Further, when the high-resistance drain region 414b (or the high-resistance source region 414a) is formed, leakage current of the driver circuit can be reduced.

Then, a seventh photolithography step is performed, so that a resist mask is formed. A contact hole 441 reaching the conductive layer 442 is formed by etching the oxide insulating layer 416 (see FIG. 4A). Moreover, contact holes reaching the gate electrode layers 411 and 421 are also formed with that etching.

Next, the resist mask is removed and then a light-transmitting conductive film is formed. For example, the light-transmitting conductive film can be formed using indium oxide (In$_2$O$_3$), an alloy of indium oxide and tin oxide (In$_2$O$_3$—SnO$_2$, abbreviated to ITO), or the like by a sputtering method, a vacuum evaporation method, or the like. Alternatively, as the light-transmitting conductive film, an Al—Zn—O-based film containing nitrogen (i.e., an Al—Zn—O—N-based non-single-crystal film), a Zn—O-based non-single-crystal film containing nitrogen, or an Sn—Zn—O-based non-single-crystal film containing nitrogen may be used. Note that the percentage (at. %) of zinc in the Al—Zn—O—N-based film is less than or equal to 47 at. % and is higher than that of aluminum in the Al—Zn—O—N-based film; the percentage (at. %) of aluminum in the Al—Zn—O—N-based film is higher than that of nitrogen in the Al—Zn—O—N-based. Such a material is etched with a hydrochloric acid-based solution. However, since a residue is easily generated particularly in etching ITO, an alloy of indium oxide and zinc oxide (In$_2$O$_3$—ZnO) may be used to improve etching processability.

Note that the unit of the relative proportion in the conductive film having a light transmitting property is atomic percent, and the relative proportion is evaluated by analysis using an electron probe X-ray microanalyzer (EPMA).

Next, an eighth photolithography step is performed so that a resist mask is formed. Unnecessary portions are removed by etching, so that the pixel electrode layer 427 and the conductive layer 417 are formed (see FIG. 4B).

In addition, FIGS. 5A1 and 5A2 respectively are a cross-sectional view and a top view of a gate wiring terminal portion at this stage. FIG. 5A1 is a cross-sectional view taken along a line C1-C2 of FIG. 5A2. In FIG. 5A1, a conductive layer 155 formed over the oxide insulating layer 416 is a terminal electrode for connection which serves as an input terminal. Furthermore, in FIG. 5A1, in the terminal portion, a terminal electrode 151 formed using the same material as the gate electrode layer 411 and a gate wiring, and a connection electrode 153 formed using the same material as the source electrode layer 415a and a source wiring overlap with each other with the gate insulating layer 402 therebetween. Further, the connection electrode 153 and the conductive layer 155 are in contact with each other through a contact hole formed in the oxide insulating layer 416.

FIGS. 5B1 and 5B2 are a cross-sectional view and a top view of a source wiring terminal portion, respectively. FIG. 5B1 corresponds to the cross-sectional view taken along a line D1-D2 in FIG. 5B2. In FIG. 5B1, the conductive layer 155 formed over the oxide insulating layer 416 is the terminal electrode for connection which serves as an input terminal. Further, in the terminal portion of FIG. 5B1, a terminal electrode 156 formed using the same material as the gate electrode layer 411 and the gate wiring is formed below a terminal electrode 150 which is electrically connected to the source electrode layer 415a and the source wiring and overlaps with the second terminal electrode 150 with the gate insulating layer 402 therebetween. The terminal electrode 156 is not electrically connected to the terminal electrode 150. When the terminal electrode 156 is set to, for example, floating, GND, or 0 V such that the potential the terminal electrode 156 is different from the potential of the terminal electrode 150, a capacitor for preventing noise or static electricity can be formed. In addition, the terminal electrode 150 is electrically connected to the conductive layer 155 with the oxide insulating layer 416 therebetween.

Through the above steps, the thin film transistor 410 and the thin film transistor 420 can be separately formed in the driver circuit and the pixel portion, respectively, over one substrate with the use of eight masks. Therefore, the manufacturing cost can be reduced as compared to the case where the pixel portion and the driver circuit are formed in different steps. The thin film transistor 410, which is a transistor for a driver circuit, includes the oxide semiconductor layer 412 including the high-resistance source region 414a, the high-resistance drain region 414b, and the channel formation region 413. The thin film transistor 420, which is a bottom-contact transistor for the pixel, includes the oxide semiconductor layer 422. The thin film transistor 410 has a structure in which even when a high electric field is applied, the high-resistance drain region serves as a buffer and local electric field concentration does not occur, so that the transistor can have increased withstand voltage.

In addition, in accordance with the manufacturing method of a semiconductor device illustrated in FIGS. 2A to 2C, FIGS. 3A to 3C, and FIGS. 4A and 4B, a storage capacitor can be formed over the same substrate. The storage capacitor is formed with a capacitor wiring and a capacitor electrode, in which the gate insulating layer serves as a dielectric. The thin film transistor 420 and storage capacitors are arranged in matrix to correspond to individual pixels so that a pixel portion is formed and a driver circuit including the thin film transistor 410 is arranged around the pixel portion, whereby one of the substrates for manufacturing an active matrix display device can be obtained. In this specification, such a substrate is also referred to as an active matrix substrate for convenience.

In addition, by providing the conductive layer 417 in a portion overlapping with the channel formation region 413 of the oxide semiconductor layer, in a bias-temperature stress test (hereinafter, referred to as a BT test) for examining reliability of a thin film transistor, the amount of shift in threshold voltage of the thin film transistor 410 between before and after the BT test can be reduced. A potential of the conductive layer 417 may be the same as or different from that of the gate electrode layer 411. The conductive layer 417 can also function as a gate electrode layer. In addition, the potential of the conductive layer 417 may be placed in a GND state or a state of 0V, or the conductive layer 417 may be placed in a floating state.

Further, the resist mask may be formed by an inkjet method in the manufacturing method of a semiconductor device described using FIGS. 2A to 2C, FIG. 3A to 3C, and FIGS. 4A and 4B. A photomask is not used when the resist mask is formed by an inkjet method, which results in reducing manufacturing costs.

Embodiment 2

In this embodiment, an example is described, in which oxide conductive layers serving as a low-resistance source region and a low-resistance drain region are provided between an oxide semiconductor layer and source and drain electrode layers in the thin film transistor of the driver circuit of Embodiment 1. Therefore, part of this embodiment can be performed in a manner similar to that of Embodiment 1, and repetitive description of the same portions as or portions having functions similar to those in Embodiment 1 and steps for manufacturing such portions will be omitted.

Figure 6:
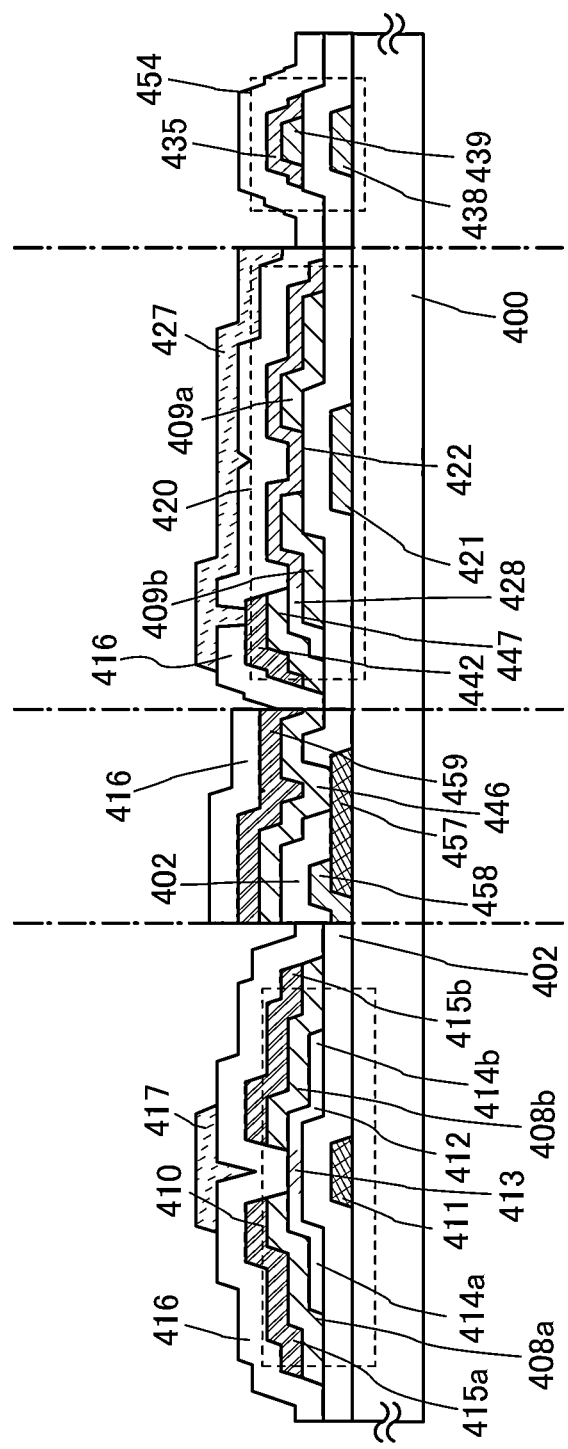
FIG. 6 illustrates a semiconductor device.
Figure 8A:
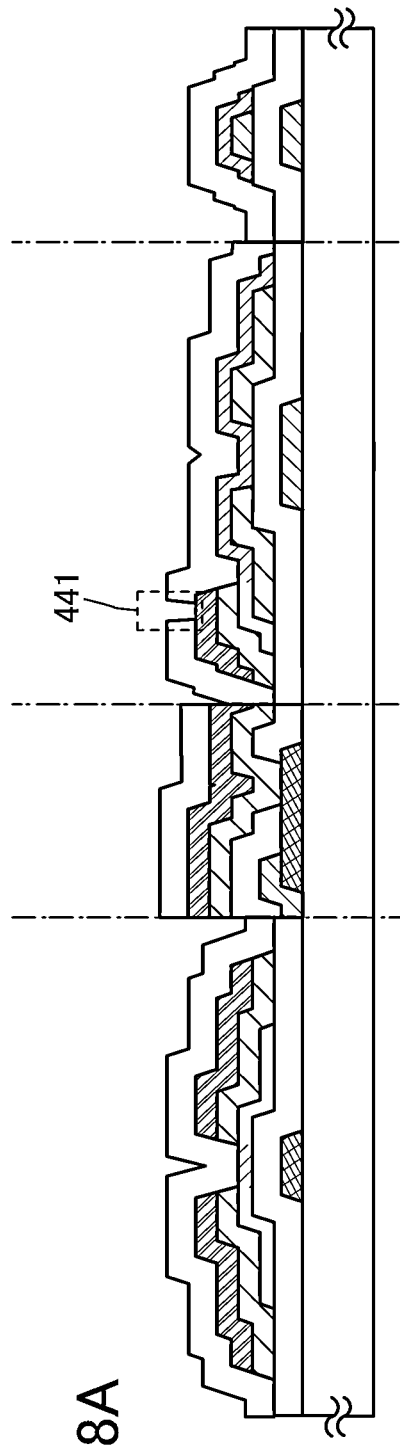
FIGS. 8A and 8B illustrate a method for manufacturing a semiconductor device.
Figure 8B:
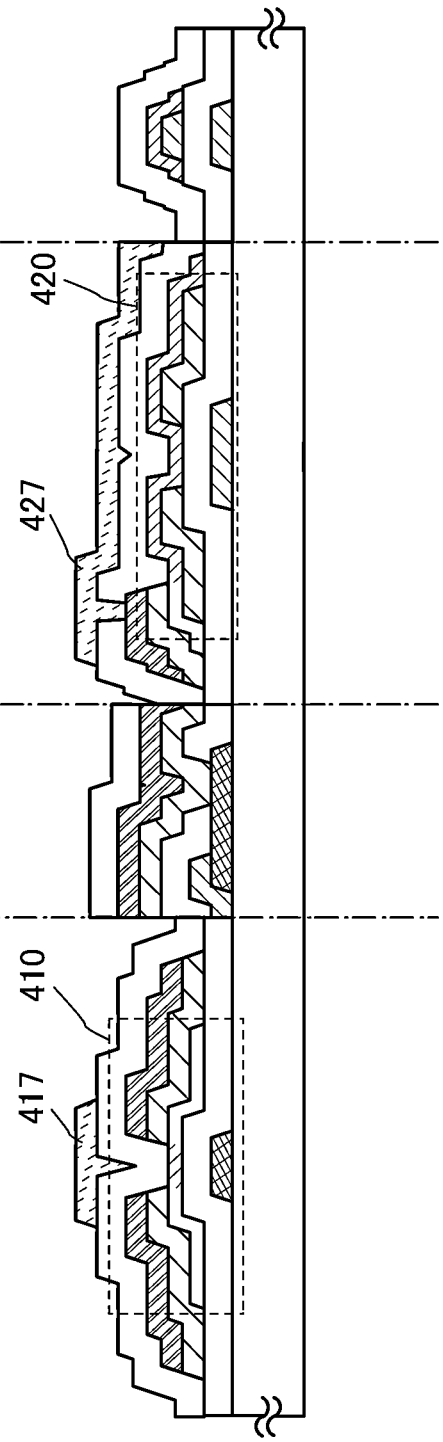

A structure of a semiconductor device in this embodiment is described with reference to FIG. 6. FIG. 6 is a cross-sectional view illustrating an example of the structure of the semiconductor device of this embodiment.

In the semiconductor device illustrated in FIG. 6, as with the semiconductor device illustrated in FIG. 1, a driver circuit and a pixel portion are provided over a substrate 400, the driver circuit includes a thin film transistor 410, and the pixel portion includes a thin film transistor 420.

The thin film transistor 410 includes a gate electrode layer 411 provided over the substrate 400; a gate insulating layer 402 provided over the gate electrode layer 411; an oxide semiconductor layer 412 which is provided over the gate electrode layer 411 with the gate insulating layer 402 therebetween and includes at least a channel formation region 413, a high-resistance source region 414a, and a high-resistance drain region 414b; an oxide conductive layer 408a and an oxide conductive layer 408b which are provided over the oxide semiconductor layer 412; a source electrode layer 415a provided over the oxide conductive layer 408a; and drain electrode layer 415b provided over the oxide conductive layer 408b.

A material having resistance lower than that of the oxide semiconductor layer 412 and higher than that of the source electrode layer 415a and the drain electrode layer 415b can be used for the oxide conductive layer 408a and the oxide conductive layer 408b. For example, an In—Sn—Zn—O-based, an In—Al—Zn—O-based, a Sn—Ga—Zn—O-based, an Al—Ga—Zn—O-based, a Sn—Al—Zn—O-based, an In—Zn—O-based, a Sn—Zn—O-based, an Al—Zn—O-based, an an In—Sn—O-based, an In—O-based, a Sn—O-based, and a Zn—O-based conductive metal oxide can be used. The thickness of each of the oxide conductive layer 408a and the oxide conductive layer 408b is set within the range of 50 nm to 300 nm inclusive, as appropriate. In the case of using a sputtering method, it is preferable that deposition be performed with a target containing $SiO_2$ at 2 wt % to 10 wt % inclusive so that $SiO_x$ (X>0) which inhibits crystallization is contained in the conductive film to be formed which transmits visible light. Accordingly, crystallization can be suppressed in heat treatment for dehydration or dehydrogenation which is to be performed later. The oxide conductive layer 408a and the oxide conductive layer 408b have functions of a low-resistance source region and a low-resistance drain region, respectively.

The driver circuit may have a structure in which the gate electrode layer or a conductive layer formed using the same conductive film as the gate electrode layer is electrically connected to the source electrode layer, the drain electrode layer, or a conductive layer formed using the same conductive film as the source electrode layer and the drain electrode layer through an opening portion provided in the gate insulating layer. The semiconductor device illustrated in FIG. 6 includes a conductive layer 457 formed using the same conductive film as the gate electrode layer 411, a conductive layer 458 formed over the conductive layer 457 using the same conductive film as a gate electrode layer 421, the gate insulating layer 402 provided over the conductive layer 458, an oxide conductive layer 446 which is formed over the gate insulating layer 402 and electrically connected to the conductive layer 457 through an opening portion provided in the gate insulating layer 402, and an conductive layer 459 provided over the oxide conductive layer 446. The oxide conductive layer 446 is formed using the same conductive film and the same steps as the oxide conductive layer 408a and the oxide conductive layer 408b. The conductive layer 459 is formed using the same conductive film and the same steps as the source electrode layer 415a and the drain electrode layer 415b. Accordingly, favorable contact can be obtained, which leads to a reduction in contact resistance. Therefore, the number of openings can be reduced, which results in reducing the area occupied by the driver circuit.

As with the semiconductor device illustrated in FIG. 1, the thin film transistor 420 includes the gate electrode layer 421 provided over the substrate 400; the gate insulating layer 402 provided over the gate electrode layer 421; the source electrode layer 409a and the drain electrode layer 409b, which are provided over the gate insulating layer 402; and an oxide semiconductor layer 422 provided over the source electrode layer 409a, the drain electrode layer 409b, and the gate insulating layer 402.

In addition, the pixel portion includes an oxide conductive layer 447 electrically connected to the drain electrode layer 409b, and a conductive layer 442 provided over the oxide conductive layer 447. The oxide conductive layer 447 illustrated in FIG. 6 is provided over part of the oxide semiconductor layer 422.

The oxide semiconductor layer 422 includes a region 428. The region 428 is formed in contact with a bottom surface of the conductive layer 442 in a self-aligned manner.

In addition, the semiconductor device illustrated in FIG. 6 includes, in the driver circuit and the pixel portion, an oxide insulating layer 416 in contact with at least part of the oxide semiconductor layer 412 and part of the oxide semiconductor layer 422.

Note that a nitride insulating layer may be provided over the oxide insulating layer 416. The nitride insulating layer is preferably in contact with the gate insulating layer 402 provided below the oxide insulating layer 416 or an insulating film serving as a base, and blocks entry of impurities such as moisture, a hydrogen ion, and OH− from the vicinity of a side surface of the substrate. The above structure is effective particularly when a silicon nitride film is used for the gate insulating layer 402 in contact with the oxide insulating layer 416 or the insulating film serving as a base. In other words, a silicon nitride film provided so as to surround a bottom surface, a top surface, and a side surface of the oxide semiconductor layer increases the reliability of the display device.

Further, in the driver circuit of the semiconductor device illustrated in FIG. 6, a conductive layer 417 overlapping with the channel formation region 413 is provided over the oxide insulating layer 416. For example, the conductive layer 417 is electrically connected to the gate electrode layer 411 so that the conductive layer 417 and the gate electrode layer 411 have the same potential, whereby a gate voltage can be applied from above and below the oxide semiconductor layer 412 placed between the gate electrode layer 411 and the conductive layer 417. Alternatively, when the gate electrode layer 411 and the conductive layer 417 are made to have different potentials, for example, one of them has a fixed potential, a GND potential, or 0 V, electrical characteristics of the TFT, such as the threshold voltage, can be controlled. In other words, one of the gate electrode layer 411 and the conductive layer 417 functions as a first gate electrode layer, and the other of the gate electrode layer 411 and the conductive layer 417 functions as a second gate electrode layer, whereby the thin film transistor 410 can be used as a thin film transistor having four terminals.

In addition, in the pixel portion of the semiconductor device illustrated in FIG. 6, a pixel electrode layer 427 is provided over the oxide insulating layer 416 and in contact with the conductive layer 442 through a contact hole provided in the oxide insulating layer 416.

Further, a planarization insulating layer may be provided between the oxide insulating layer 416 and the pixel electrode layer 427. In the case where the nitride insulating layer is provided over the oxide insulating layer 416, a planarization insulating layer is preferably provided over the nitride insulating layer.

Note that heat treatment for reducing impurities such as moisture (heat treatment for dehydration or dehydrogenation) is performed on the oxide semiconductor layer 412 and the oxide semiconductor layer 422. After heat treatment for dehydration or dehydrogenation and slow cooling, the carrier concentration in the oxide semiconductor layer is reduced by formation of an oxide insulating film in contact with the oxide semiconductor layer or the like, which leads to improvement in electric characteristics and reliability of the thin film transistor 410 and the thin film transistor 420.

Note that in the semiconductor device illustrated in FIG. 6, higher operation is needed for the thin film transistor of the driver circuit as compared to the thin film transistor of the pixel portion. Therefore, a channel length of the thin film transistor 410 may be shorter than that of the thin film transistor 420. At this time, for example, it is preferable that the channel length of the thin film transistor 410 be approximately 1 μm to 5 μm, and the channel length of the thin film transistor 420 be 5 μm to 20 μm.

As described above, in addition to the structure illustrated in FIG. 1, the example of the semiconductor device of this embodiment has a structure in which the low-resistance source region and the low-resistance drain region, which are formed using oxide conductive layers, are provided between the source and drain electrode layers and the oxide semiconductor layer. Accordingly, a frequency characteristic of a peripheral circuit (the driver circuit) can be improved. This is because contact resistance can be further decreased by contact of a metal electrode layer and the low-resistance source and drain regions, as compared with by contact of the metal electrode layer and an oxide semiconductor layer, for example. An electrode layer using molybdenum (such as a stacked layer of a molybdenum layer, an aluminum layer, and a molybdenum layer) has high contact resistance to the oxide semiconductor layer because molybdenum is difficult to oxidize in comparison with titanium and operation of extracting oxygen from the oxide semiconductor layer is weak and a contact interface between a molybdenum layer and the oxide semiconductor layer does not become n-type. However, the low-resistance source region and the low-resistance drain region are interposed between the oxide semiconductor layer and the source and drain electrode layers, whereby contact resistance can be decreased, which can lead to improvement in the frequency characteristic of the peripheral circuit (the driver circuit). By providing the low-resistance source region and the low-resistance drain region, the channel length of the thin film transistor is determined at the time of etching of the layer which is to be the low-resistance source region and the low-resistance drain region; therefore, the channel length can be further shortened.

Next, an example of a method for manufacturing the semiconductor device illustrated in FIG. 6 is described using FIGS. 7A to 7C and FIGS. 8A and 8B.

First, in a similar manner to the step illustrated in FIG. 2A, the substrate 400 is prepared and a conductive film is formed over the substrate 400. Then, a first photolithography step is performed so that a resist mask is formed over part of the conductive film. The conductive film is etched using the resist mask so that the gate electrode layer 411 and the conductive layer 457 are formed.

Next, in a similar manner to the step illustrated in FIG. 2B, a conductive film is formed over the gate electrode layer 411 and the conductive layer 457. A second photolithography step is performed so that a resist mask is formed over part of the conductive film. The conductive film is etched using the resist mask, whereby the gate electrode layer 421, the conductive layer 458, and a conductive layer 438 are formed.

Then, in a similar manner to the step illustrated in FIG. 2C, the gate insulating layer 402 is formed over the gate electrode layer 411, the conductive layer 457, the conductive layer 458, the gate electrode layer 421, and the conductive layer 438. Then, a conductive film is formed over the gate insulating layer 402. A third photolithography step is performed so that a resist mask is formed over part of the conductive film. The conductive film is etched using the resist mask, whereby the source electrode layer 409a, the drain electrode layer 409b, and a conductive layer 439 are formed. An oxide semiconductor film 430 having a thickness of 2 nm to 200 nm inclusive is formed over the gate insulating layer 402, the source electrode layer 409a, the drain electrode layer 409b, and the conductive layer 439. A resist mask is formed over the oxide semiconductor film 430 through a fourth photolithography step. Unnecessary portions of the oxide semiconductor film 430 and the gate insulating layer 402 are removed by etching, so that a contact hole 426 reaching the conductive layer 457 is formed in the gate insulating layer 402.

Then, in a similar manner to the step illustrated in FIG. 3A, a resist mask is formed over part of the oxide semiconductor film 430 through a fifth photolithography step and the oxide semiconductor film 430 is etched using the resist mask, whereby the oxide semiconductor film 430 is processed into island-shaped oxide semiconductor layers. Then, dehydration or dehydrogenation of the oxide semiconductor layers is performed.

First heat treatment for dehydration or dehydrogenation is performed, for example, at 400° C. to 700° C. inclusive, or preferably 425° C. or higher. Note that in the case of the temperature of 425° C. or higher, the heat treatment time may be one hour or shorter, whereas in the case of the temperature that is lower than 425° C., the heat treatment time is longer than one hour. Here, the substrate over which the oxide semiconductor layers are formed is put in an electric furnace which is a kind of heat treatment apparatus and heat treatment is performed on the oxide semiconductor layers in a nitrogen atmosphere, cooling is performed without exposure to the air, and water and hydrogen are prevented from being mixed into the oxide semiconductor layers again; thus, oxide semiconductor layers 431 and 432 are obtained. In this embodiment, the same furnace is used from the heat temperature T at which the oxide semiconductor layers are subjected to dehydration or dehydrogenation to a temperature low enough to prevent water from entering again; specifically, slow cooling is performed in a nitrogen atmosphere until the temperature drops by 100° C. or more from the heat temperature T. Moreover, without limitation to a nitrogen atmosphere, dehydration or dehydrogenation is performed in a rare gas atmosphere (e.g., helium, neon, or argon).

When the oxide semiconductor layers are subjected to heat treatment at 400° C. to 700° C., the dehydration or dehydrogenation of the oxide semiconductor layers can be achieved; thus, water ($H_2O$) can be prevented from being contained again in the oxide semiconductor layers later.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have purity of 6N (99.9999%) or more, preferably, 7N (99.99999%) or more; that is, an impurity concentration is set to 1 ppm or lower, preferably 0.1 ppm or lower.

In some cases, the oxide semiconductor layers are crystallized to be microcrystalline layers or polycrystalline layers depending on the conditions of the first heat treatment or the material of the oxide semiconductor layers. In the case of the microcrystalline films, it is preferable that a crystal component account for 80% or more (preferably 90% or more) of the whole microcrystalline film and the microcrystalline film be filled with microcrystalline grains so that the adjacent microcrystalline grains are in contact with each other. In some cases, the whole oxide semiconductor layers are in an amorphous state.

In addition, the first heat treatment can also be performed on the oxide semiconductor film before being processed into the island-shaped oxide semiconductor layers. In such a case, the substrate is taken out of the heat treatment apparatus after the first heat treatment, and the resist mask is formed through the photolithography process. Then, selective etching is performed using the resist mask, whereby the oxide semiconductor film is processed to be the oxide semiconductor layers.

The heat treatment for dehydration or dehydrogenation of the oxide semiconductor layers may be performed at any of the following timings: after the oxide semiconductor layers are formed; after the source electrode layer and the drain electrode layer are formed over the oxide semiconductor layer of the driver circuit; and after an insulating film is formed over the source electrode layer and the drain electrode layer.

In addition, before the oxide semiconductor film is formed, heat treatment (for example, 400° C. to 700° C. inclusive) may be performed in an inert gas atmosphere (nitrogen, helium, neon, argon, or the like) or an oxygen atmosphere, thereby removing impurities such as hydrogen and water contained in the gate insulating layer.

Through the above steps, the whole oxide semiconductor film is made to be in an oxygen-excess state to have higher resistance, that is, become an i-type oxide semiconductor film (see FIG. 7A). Note that the first heat treatment for dehydration or dehydrogenation is performed just after the formation of the oxide semiconductor film in this embodiment. However, this embodiment is not limited thereto. The first heat treatment for dehydration or dehydrogenation can be performed anytime after the formation of the oxide semiconductor film.

Next, an oxide conductive film 405 is formed over the oxide semiconductor layer 431, the oxide semiconductor layer 432, the oxide semiconductor layer 435, and the gate insulating layer 402. A conductive film is formed over the oxide conductive film 405. A resist mask 433*a* and a resist mask 433*b* are formed over the conductive film over the oxide conductive film 405 through a sixth photolithography step. Then, selective etching is performed so that the source electrode layer 415*a* and the drain electrode layer 415*b* are formed (see FIG. 7B).

As a deposition method of the oxide conductive film 405, a sputtering method, a vacuum evaporation method (e.g., an electron beam evaporation method), an arc discharge ion plating method, or a spray method is used. A material of the oxide conductive film 405 preferably contains zinc oxide as a component and preferably does not contain indium oxide. For such an oxide conductive film 405, zinc oxide, zinc aluminum oxide, zinc aluminum oxynitride, zinc gallium oxide, or the like can be used. The thickness of oxide conductive film 405 is set within the range of 50 nm to 300 nm inclusive, as appropriate. In the case of using a sputtering method, it is preferable to use a target containing $SiO_2$ at 2 wt % to 10 wt % inclusive and make $SiO_x$ (x>0) which inhibits crystallization be contained in the oxide conductive film in order to suppress crystallization at the time of heat treatment for dehydration or dehydrogenation in a later step.

Note that each material and etching conditions are adjusted as appropriate so that the oxide conductive film 405, the oxide semiconductor layer 431, the oxide semiconductor layer 432, and the oxide semiconductor layer 435 are not removed in the etching of the conductive film over the oxide conductive film 405.

In addition, a resist mask 433*c* is formed using the same steps as the resist mask 433*a* and the resist mask 433*b*. The conductive layer 459 is formed in the driver circuit using the same material and the same steps as the source electrode layer 415*a* and the drain electrode layer 415*b*. The conductive layer 459 has a function as a terminal electrode or a terminal wiring.

A resist mask 433*d* is formed using the same steps as the resist mask 433*a* and the resist mask 433*b*. The conductive layer 442 is formed in the pixel portion using the same material and the same steps as the source electrode layer 415*a* and the drain electrode layer 415*b*.

Next, the resist mask 433*a*, the resist mask 433*b*, the resist mask 433*c*, and the resist mask 433*d* are removed. The oxide conductive film 405 is etched using the source electrode layer 415*a*, the drain electrode layer 415*b*, the conductive layer 459, and the conductive layer 442 as masks, so that the oxide conductive layer 408*a*, the oxide conductive layer 408*b*, the oxide conductive layer 446, and the oxide conductive layer 447 are formed. The oxide conductive film 405 containing zinc oxide as a component can be easily etched with an alkaline solution such as a resist stripping solution, for example.

Further, etching treatment for dividing the oxide conductive layer to form a channel formation region is performed by utilizing the difference in etching rates between the oxide semiconductor layer and the oxide conductive layer. The oxide conductive layer over the oxide semiconductor layers is selectively etched utilizing a higher etching rate of the oxide conductive layer as compared with that of the oxide semiconductor layer.

In addition, the resist masks 433*a*, 433*b*, 433*c*, and 433*d* are preferably removed by ashing. In the case of etching with a stripping solution, etching conditions (the kind of the etchant, the concentration, and the etching time) are adjusted as appropriate so that the oxide conductive film 405, the oxide semiconductor layer 431, the oxide semiconductor layer 432, and the oxide semiconductor layer 435 are not etched excessively.

After the oxide semiconductor layer is etched to have an island shape, the oxide conductive film is formed, the conductive film is formed over the oxide conductive film, and etching is performed with the use of one mask so that wiring patterns including the source electrode layer and the drain electrode layer are obtained, whereby the oxide conductive layers can remain under the wiring patterns of the conductive films.

Further, as for the contact between the conductive layer 457 and the conductive layer 459, because the oxide conductive layer 446 is formed below the source wiring to function as a buffer, and the oxide conductive layer 446 does not form an insulating oxide with a metal, a resistance component is only the series resistance depending on the thickness of the oxide conductive layer 446.

Further, in the case where the first heat treatment is performed after selective etching of the conductive film for forming the source electrode layer 415*a*, the drain electrode layer 415*b*, the conductive layer 459, and the conductive layer 442, the oxide conductive layer 408*a*, the oxide conductive layer 408*b*, the oxide conductive layer 446, and the oxide conductive layer 447 are crystallized as long as the oxide conductive layer 408*a*, the oxide conductive layer 408*b*, the oxide conductive layer 446, and the oxide conductive layer 447 do not contain a substance that inhibits crystallization such as silicon oxide. On the other hand, the oxide semiconductor layer is not crystallized by the first heat treatment and kept in an amorphous structure. Crystals of the oxide conductive layer grow in a columnar shape from a base surface. As a result, when the conductive film over the oxide conductive film is etched to form the source electrode layer and the drain electrode layer, formation of an undercut in the oxide conductive film below the conductive film can be prevented.

Next, in a similar manner to the step illustrated in FIG. 3C, the oxide insulating layer 416 is formed in contact with exposed surfaces of the oxide semiconductor layer 431 and the oxide semiconductor layer 432. A second heat treatment may be performed in an inert gas atmosphere or an oxygen atmosphere. By the second heat treatment, part of the oxide semiconductor layer 431, the oxide semiconductor layer 432, and the oxide semiconductor layer 435 is heated while being in contact with the oxide insulating layer 416.

Through the above process, the part whose resistance is reduced by dehydration or dehydrogenation is made to be in an oxygen-excess state selectively. As a result, the channel formation region 413 which is in contact with the oxide insulating layer 416 becomes i-type, and the oxide semiconductor layer 435 which is in contact with the oxide insulating layer 416 becomes i-type. The high-resistance source region 414*a* is formed in a self-aligned manner in a portion of the oxide semiconductor layer 431 overlapping with the low-resistance source region (the oxide conductive layer 408a). The high-resistance drain region 414b is formed in a self-aligned manner in a portion of the oxide semiconductor layer 431 overlapping with the low-resistance drain region (oxide conductive layer 408b). The region 428 is formed in a self-aligned manner in a portion of the oxide semiconductor layer 432 overlapping with the oxide conductive layer 447 (see FIG. 7C).

In accordance with the above steps, the thin film transistor 410 and the thin film transistor 420 can be formed over one substrate.

Figure 4A:
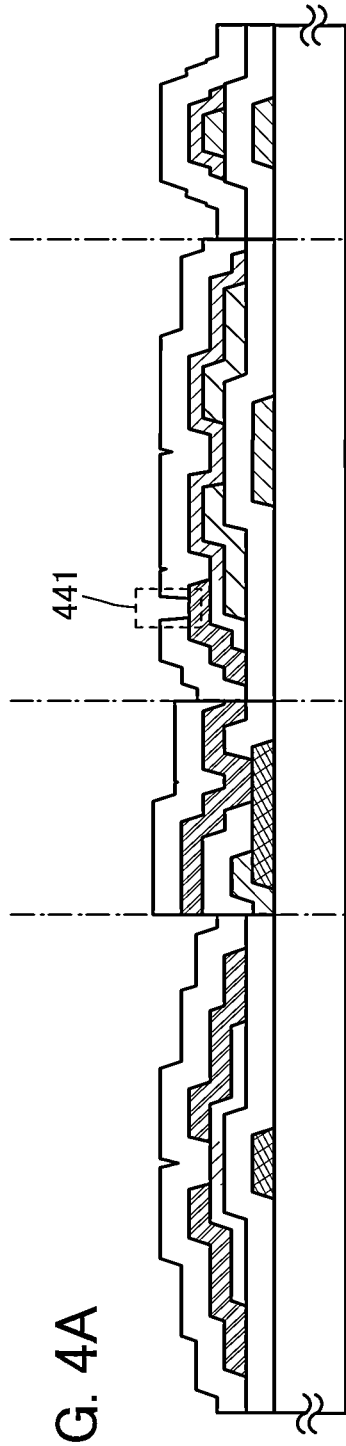
FIGS. 4A to 4B illustrate a method for manufacturing a semiconductor device.

Then, in a similar manner to the step of FIG. 4A, a seventh photolithography step is performed so that a resist mask is formed. A contact hole 441 reaching the conductive layer 442 is formed by etching the oxide insulating layer 416 (see FIG. 8A). Moreover, contact holes reaching the gate electrode layers 411 and 421 are also formed with that etching.

Figure 4B:
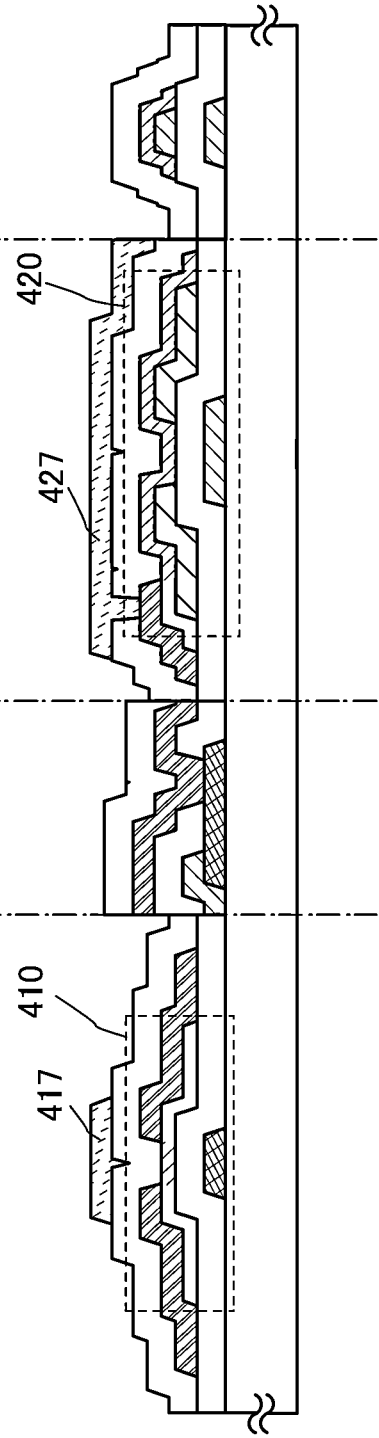

Next, in a similar manner to the step illustrated in FIG. 4B, the resist mask is removed and then a light-transmitting conductive film is formed. An eighth photolithography step is performed so that a resist mask is formed. Unnecessary portions are removed by etching, so that the pixel electrode layer 427 and the conductive layer 417 are formed.

Through the above steps, the thin film transistor 410 and the thin film transistor 420 can be separately formed in the driver circuit and the pixel portion, respectively, over one substrate with the use of eight masks. Therefore, the manufacturing cost can be reduced as compared to the case where the pixel portion and the driver circuit are formed in different steps. The thin film transistor 410, which is a transistor for a driver circuit, includes the oxide semiconductor layer 412 including the high-resistance source region 414a, the high-resistance drain region 414b, and the channel formation region 413. The thin film transistor 420, which is a bottom-contact transistor for a pixel, includes the oxide semiconductor layer 432. In the thin film transistor 410, even when a high electric field is applied, the high-resistance drain region serves as a buffer and local electric field concentration does not occur, so that withstand voltage of the transistor can be increased.

In addition, in accordance with the manufacturing method of a semiconductor device illustrated in FIGS. 7A to 7C, and FIGS. 8A and 8B, a storage capacitor formed with a capacitor wiring and a capacitor electrode, in which the gate insulating layer serves as a dielectric can be formed over the same substrate. The thin film transistors 420 and storage capacitors are arranged in matrix to correspond to individual pixels so that a pixel portion is formed and a driver circuit including the thin film transistor 410 is arranged around the pixel portion, whereby an active matrix substrate can be obtained.

Embodiment 3

In this embodiment, a liquid crystal display device which is an example of a semiconductor device that is an embodiment of the present invention will be described with reference to FIG. 9.

Figure 9:
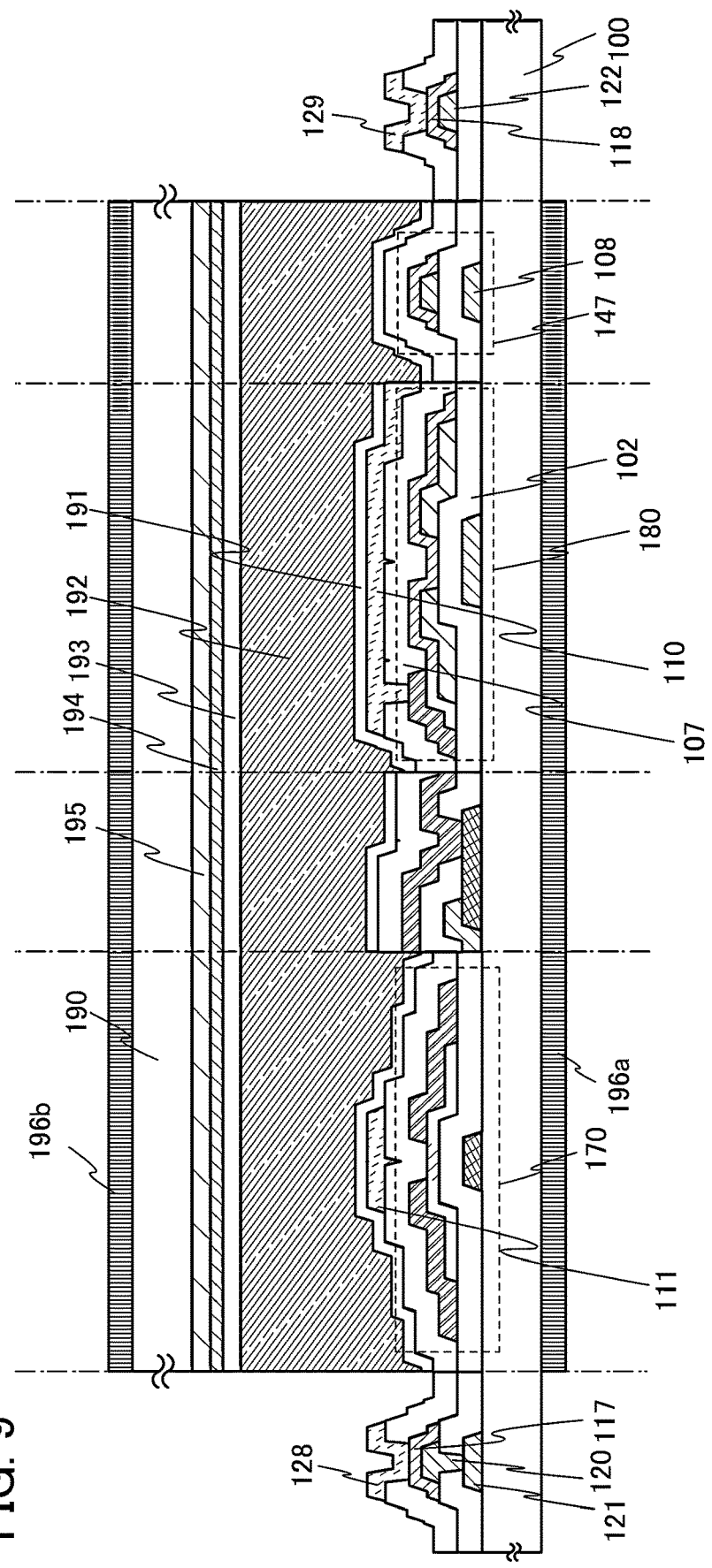
FIG. 9 illustrates a semiconductor device.

In the liquid crystal display device illustrated in FIG. 9, a substrate 100 provided with a driver circuit including a thin film transistor 170, a pixel portion including a thin film transistor 180 and a capacitor 147, a pixel electrode layer 110, and an insulating layer 191 functioning as an alignment film, and a counter substrate 190 provided with an insulating layer 193 functioning as an alignment film, a counter electrode layer 194, and a coloring layer 195 functioning as a color filter face each other with a liquid crystal layer 192 positioned between the substrates. The substrate 100 and the counter substrate 190 are provided with polarizing plates 196a and 196b (layers including a polarizer, also simply referred to as polarizers) over their planes opposite to planes provided with the liquid crystal layer 192, respectively. In a terminal portion of a gate wiring, a connection electrode 117, a terminal electrode 121, a connection electrode 120, and a terminal electrode 128 for connection are provided. In a terminal portion of a source wiring, a terminal electrode 122, a connection electrode 118, and a terminal electrode 129 for connection are provided.

As the thin film transistor 170, for example, the thin film transistor of the driver circuit described in Embodiment 1 can be used. As the thin film transistor 180, for example, the thin film transistor of the pixel portion described in Embodiment 1 can be used. In the liquid crystal display device illustrated in FIG. 9, the thin film transistor 410 illustrated in FIG. 1 is used as the thin film transistor 170, the thin film transistor 420 illustrated in FIG. 1 is used as the thin film transistor 180, for example.

As the capacitor 147, for example, the capacitor described in Embodiment 1 can be used. In the liquid crystal display device illustrated in FIG. 9, the capacitor 454 illustrated in FIG. 1 is used as the capacitor 147, for example.

In this manner, the capacitor 147, which is a storage capacitor formed with a dielectric, a capacitor wiring, and capacitor electrode, in which the gate insulating layer 102 serving as a dielectric, can also be formed over the same substrate as the driver circuit portion and the pixel portion. Alternatively, a pixel electrode may overlap with a gate wiring of an adjacent pixel with a protective insulating film and the gate insulating layer 102 therebetween to form a storage capacitor without a capacitor wiring.

The terminal electrodes 128 and 129 which are formed in the terminal portion function as electrodes or wirings connected to a flexible printed circuit (FPC). The terminal electrode 128 formed over the terminal electrode 121 with the connection electrode 120 and the connection electrode 117 therebetween serves as a connection terminal electrode which functions as an input terminal for the gate wiring. The terminal electrode 129 which is formed over the terminal electrode 122 with the connection electrode 118 therebetween serves as a connection terminal electrode which functions as an input terminal for the source wiring.

In the case of manufacturing an active matrix liquid crystal display device, an active matrix substrate and a counter substrate provided with a counter electrode are bonded to each other with a liquid crystal layer therebetween. Note that a common electrode electrically connected to the counter electrode on the counter substrate is provided over the active matrix substrate, and a terminal electrically connected to the common electrode is provided in the terminal portion. This terminal is provided so that the common electrode is fixed to a predetermined potential such as GND or 0 V.

The insulating layer 191 serving as an alignment film is formed over an oxide insulating layer 107, a conductive layer 111, and the pixel electrode layer 110.

The coloring layer 195, the counter electrode layer 194, and the insulating layer 193 serving as an alignment film are formed over the counter substrate 190. The substrate 100 and the counter substrate 190 are attached to each other with a spacer which adjusts a cell gap of the liquid crystal display device and the liquid crystal layer 192 positioned therebetween, with the use of a sealant (not illustrated). This attachment step may be performed under reduced pressure.

As the sealant, it is typically preferable to use visible light curable, ultraviolet curable, or heat curable resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

The liquid crystal layer 192 is formed by filling a space with a liquid crystal material. The liquid crystal layer 192 may be formed by a dispenser method (a dripping method) in which liquid crystals are dripped before the attachment of the substrate 100 to the counter substrate 190. Alternatively, the liquid crystal layer 192 can be formed by an injection method in which liquid crystals are injected by using a capillary phenomenon after the attachment of the substrate 100 to the counter substrate 190. There is no particular limitation on the kind of liquid crystal material, and a variety of materials can be used. If a material exhibiting a blue phase is used as the liquid crystal material, an alignment film does not need to be provided.

The polarizing plate 196a is provided on the outer side of the substrate 100, and the polarizing plate 196b is provided on the outer side of the counter substrate 190. In this manner, a transmissive liquid crystal display device of this embodiment can be manufactured.

Although not illustrated in this embodiment, a black matrix (a light-shielding layer); an optical member (an optical substrate) such as a polarizing member, a retardation member, or an anti-reflection member; and the like can be provided as appropriate. For example, circular polarization may be obtained by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency, whereby the moving-image characteristics are improved.

Further alternatively, in order to improve the moving-image characteristics of a liquid crystal display device, a driving method may be employed in which a plurality of LED (light-emitting diode) light sources or a plurality of EL light sources are used to form a surface light source as a backlight, and each light source of the surface light source is independently driven in a pulsed manner in one frame period. As the plane light source, three or more kinds of LEDs may be used or an LED that emits white light may be used. Since a plurality of LEDs can be controlled independently, the light emission timing of LEDs can be synchronized with the timing at which a liquid crystal layer is optically modulated. According to this driving method, LEDs can be partly turned off; therefore, power consumption can be reduced particularly in the case of displaying an image having a large part on which black is displayed.

By combining these driving methods, the display characteristics of a liquid crystal display device, such as moving-image characteristics, can be improved as compared to those of conventional liquid crystal display devices.

As described in this embodiment, when the semiconductor device is formed with the thin film transistor including the oxide semiconductor, manufacturing cost can be reduced. In particular, an oxide insulating film is formed in contact with an oxide semiconductor layer using the above method, whereby a thin film transistor having stable electric characteristics can be manufactured and provided. Therefore, a semiconductor device which includes highly reliable thin film transistors having favorable electric characteristics can be provided.

The channel formation region in the semiconductor layer is a high-resistance region; thus, electric characteristics of the thin film transistor are stabilized and increase in off current can be prevented. Therefore, a semiconductor device including a highly reliable thin film transistor having favorable electric characteristics can be provided.

Since a thin film transistor is easily broken due to static electricity or the like, a protective circuit is preferably provided over the same substrate as the pixel portion or the drive circuit. The protective circuit is preferably formed with a non-linear element including an oxide semiconductor layer. For example, a protective circuit can be provided between the pixel portion, and a scan line input terminal and a signal line input terminal. In this embodiment, a plurality of protective circuits are provided so as to prevent breakage of the transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed in the same step as the thin film transistor 180 in the pixel portion, and can be made to have the same properties as a diode by connecting a gate terminal to a drain terminal of the non-linear element.

Embodiment 4

In this embodiment, an example of a semiconductor device will be described below in which at least some of driver circuits and a pixel portion are formed over one substrate.

The thin film transistor to be arranged in the pixel portion is formed according to Embodiment 1 or 2. Further, the thin film transistor described in Embodiment 1 or 2 is an n-channel TFT, and thus part of a driver circuit that can include an n-channel TFT among driver circuits is formed over the same substrate as the thin film transistor of the pixel portion.

Figure 10A:
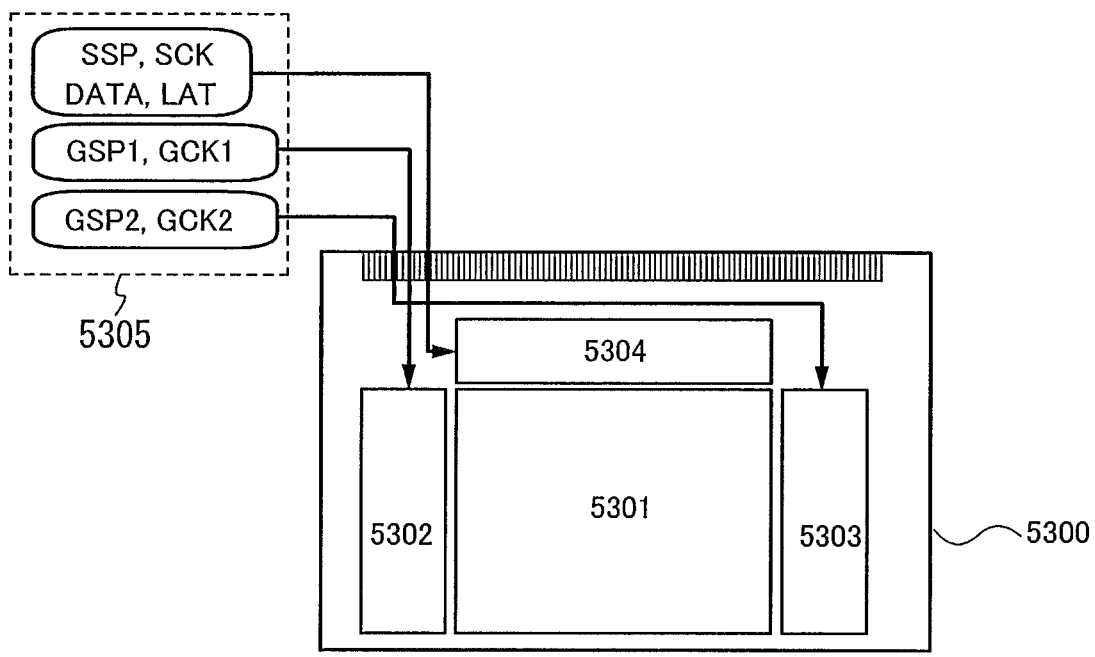
FIGS. 10A and 10B illustrate block diagrams of a semiconductor device.

FIG. 10A is an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed, and a plurality of scan lines extended from the first scan line driver circuit 5302 and the second scan line driver circuit 5303 are placed. Note that pixels each including a display element are arranged in matrix in regions where the scan lines and the signal lines intersect with each other. The substrate 5300 of the display device is electrically connected to a timing control circuit 5305 (also referred to as a controller or a control IC) through a connection portion such as an FPC (flexible printed circuit).

In FIG. 10A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion in the case where wirings are extended from a driver circuit provided outside the substrate 5300 can be reduced, and the reliability or yield can be increased.

Note that the timing control circuit 5305 supplies, for example, a first scan line driver circuit start signal (GSP1) (which is also referred to as a start pulse) and a first scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a second scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal), and a latch signal (LAT) to the signal line driver circuit 5304, as an example. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 10B:
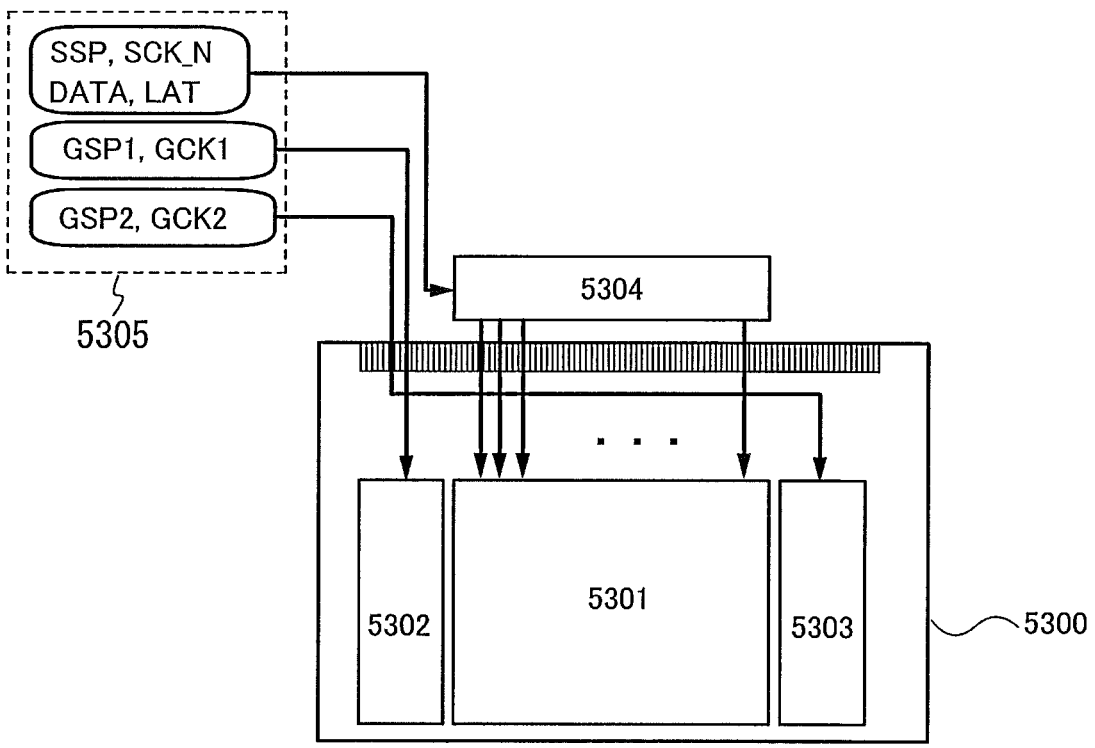

FIG. 10B illustrates a structure in which circuits with low driving frequency (for example, the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, a driver circuit formed over the substrate 5300 can be formed using a thin film transistor with lower field-effect mobility as compared to that of a transistor formed using a single crystal semiconductor. Accordingly, increase in the size of the display device, reduction in the number of steps, reduction in cost, improvement in yield, or the like can be achieved.

Figure 11A:
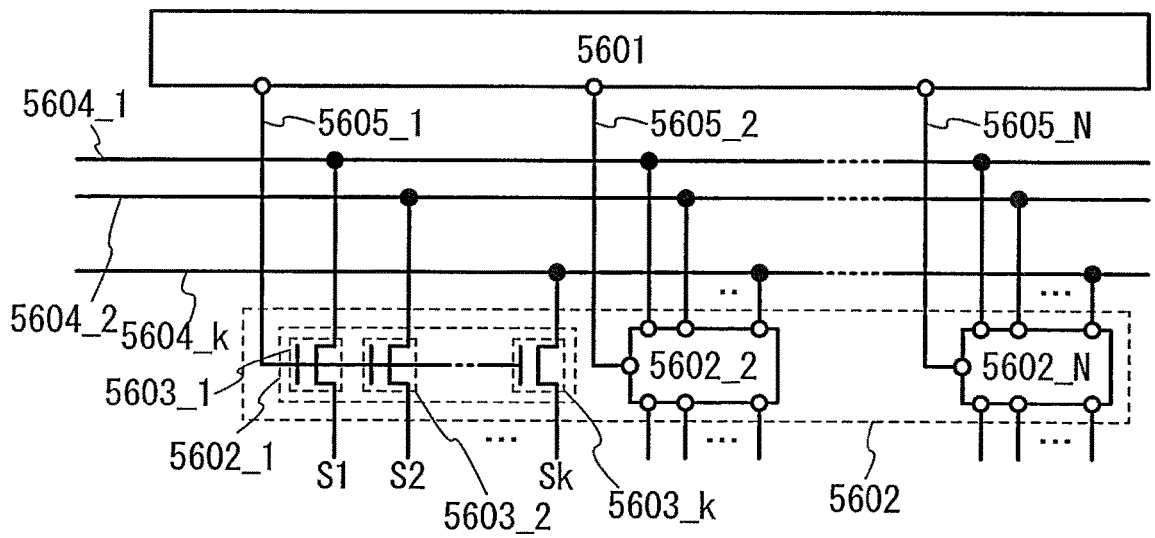
FIGS. 11A and 11B illustrate a structure of a signal line driver circuit.
Figure 11B:
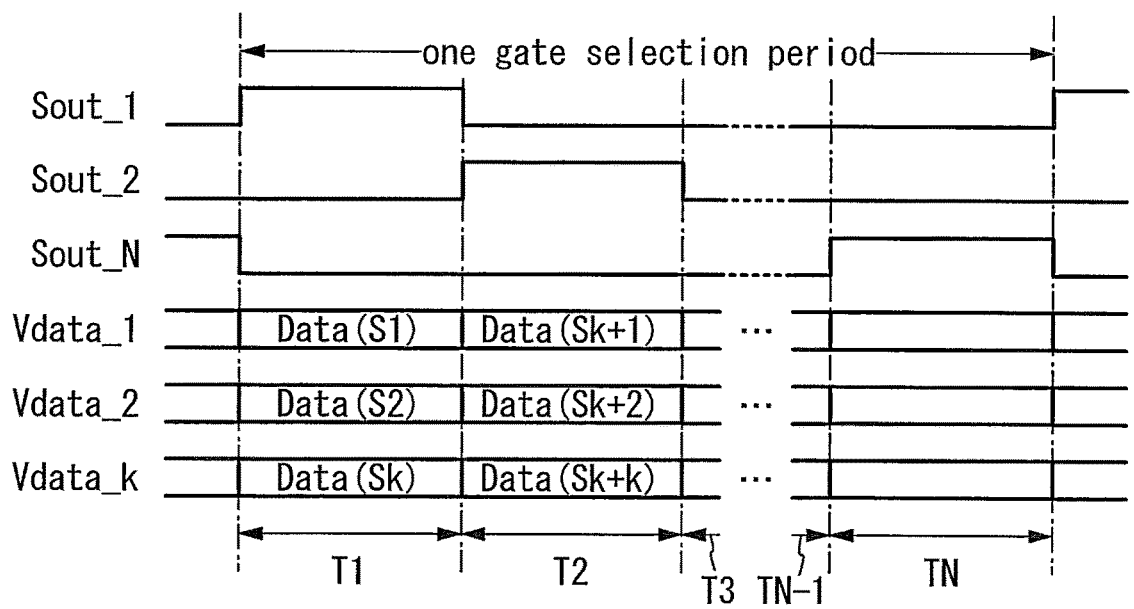

The thin film transistors in Embodiment 1 or Embodiment 2 are n-channel TFTs. FIGS. 11A and 11B illustrate an example of a structure and operation of a signal line driver circuit formed using n-channel TFTs.

The signal line driver circuit illustrated in FIG. 11A includes a shift register 5601 and a switching circuit 5602. The switching circuit 5602 includes a plurality of switching circuits. The switching circuits 5602_1 to 5602_N (N is a natural number of 2 or more) each include a plurality of thin film transistors 5603_1 to 5603_$k$ ($k$ is a natural number of 2 or more). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 56051.

The shift register 5601 has a function of sequentially selecting the switching circuits 5602_1 to 5602_N by sequentially outputting H-level signals (also referred to as an H signal or a signal at a high power supply potential level) to wirings 5605_1 to 5605_N.

The switching circuit 5602_1 has a function of controlling a conduction state between the wirings 5604_1 to 5604_$k$ and the signal lines S1 to Sk (conduction between the first terminals and the second terminals), that is, a function of controlling whether potentials of the wirings 5604_1 to 5604_$k$ are supplied to the signal lines S1 to Sk. In this manner, the switching circuit 56021 functions as a selector. Further, the thin film transistors 5603_1 to 5603_$k$ each have a function of controlling electrical continuity between their respective wirings 5604_1 to 5604_$k$ and their respective signal lines S1 to Sk, namely a function of controlling whether or not to supply their respective potentials of the wirings 5604_1 to 5604_$k$ to their respective signal lines S1 to Sk. In this manner, each of the thin film transistors 5603_1 to 5603_$k$ functions as a switch.

Video signal data (DATA) is input to each of the wirings 5604_1 to 5604_$k$. The video signal data is often an analog signal that corresponds to an image signal or image data.

Next, the operation of the signal line driver circuit in FIG. 11A is described with reference to a timing chart in FIG. 11B. FIG. 11B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 56041 to 5604_$k$. Note that one operation period of the signal line driver circuit corresponds to one gate selection period in a display device. For example, one gate selection period is divided into periods T1 to TN. Each of the periods T1 to TN is a period for writing the video signal data into a pixel in a selected row.

Note that signal waveform distortion and the like in each of the structures illustrated in drawings and the like in this embodiment are exaggerated for simplicity in some cases. Therefore, this embodiment is not necessarily limited to the scale illustrated in the drawing and the like.

In the periods T1 to TN, the shift register 5601 sequentially outputs H-level signals to the wirings 5605_1 to 5605_N. For example, in the period T1, the shift register 5601 outputs a high-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively. The Data(S1) to Data(Sk) are written into pixels in first to kth columns in a selected row through the thin film transistors 5603_1 to 5603$k$, respectively. In such a manner, in the periods T1 to TN, the video signal data are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors described in Embodiment 1 or Embodiment 2 can be used for the shift register 5601 and the switching circuit 5602. In that case, the shift register 5601 can be constituted by only n-channel transistors or only p-channel transistors.

Further, an example of part of the scan line driver circuit and part of the signal line driver circuit, or a shift register used for part of the scan line driver circuit or part of the signal line driver circuit will be described.

The scan line driver circuit includes a shift register. The scan line driver circuit may also include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

Further, one embodiment of part of the scan line driver circuit and part of the signal line driver circuit, or a shift register used for part of the scan line driver circuit or part of the signal line driver circuit is described with reference to FIGS. 12A to 12C and FIGS. 13A and 13B.

Figure 12A:
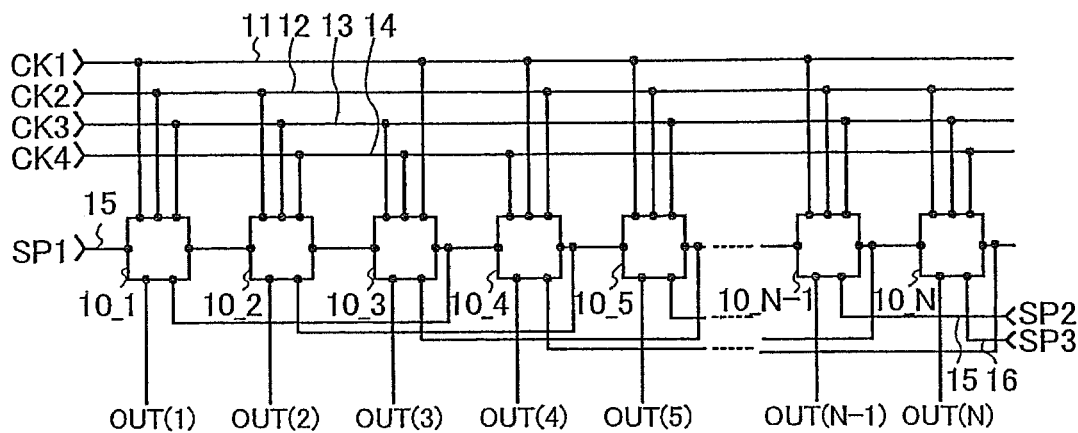
FIGS. 12A to 12C illustrate a configuration of a shift register.

The shift register includes first to Nth pulse output circuits 10_1 to 10_N (N is a natural number greater than or equal to 3) (see FIG. 12A). In the shift register illustrated in FIG. 12A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (2≤n≤N and n is a natural number), a signal from the pulse output circuit of the previous stage (such a signal is referred to as a previous-stage signal OUT(n−1)) (n is a natural number greater than or equal to 2 and less than or equal to N) is input. A signal from the third pulse output circuit 10_3 which is two stages after the first pulse output circuit 10_1 is input to the first pulse output circuit 10_1, and a signal from the (n+2)-th pulse output circuit 10_(n+2) which is two stages after the n-th pulse output circuit 10_n (referred to as a next stage signal OUT(n+2)) is input to the n-th pulse output circuit in the second stage or its subsequent stages. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that as illustrated in FIG. 12A, since the later-stage signal OUT(n+2) is not input to the pulse output circuits in the last two stages of the shift register, for example, a second start pulse SP2 and a third start pulse SP3 may be additionally input to the respective pulse output circuits.

Note that a clock signal (CK) is a signal whose level alternates between an H-level and an L-level (also referred to as an L signal or a signal at low power supply potential level) at regular intervals. Here, the first to fourth clock signals (CK1) to (CK4) are sequentially delayed by a quarter of a cycle. In this embodiment, by using the first to fourth clock signals (CK1) to (CK4), control or the like of driving of a pulse output circuit is performed. Note that the clock signal is also called GCK or SCK in accordance with an driver circuit to which the clock signal is input; however, description is made using CK as the clock signal.

Figure 12B:
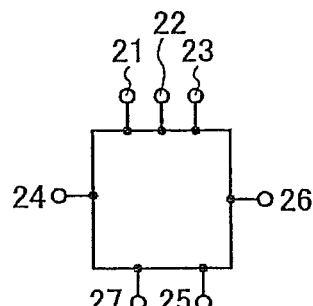

In addition, each of the first to Nth pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 12B). Each of the first input terminal 21, the second input terminal 22, and the third input terminal 23 is electrically connected to any of the first to fourth wirings 11 to 14. For example, in FIG. 12A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 12B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

Note that in the first to N-th pulse output circuits 10_1 to 10_N, the thin film transistor having four terminals, which is described in the above embodiment, can be used in addition to a thin film transistor having three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of a thin film transistor with four terminals can be controlled to be a desired value by providing the gate electrodes over and under the channel formation region of the thin film transistor with gate insulating films therebetween and controlling a potential of the upper gate electrode and/or the lower gate electrode.

Next, an example of a specific circuit structure of the pulse output circuit is described with reference to FIG. 12C.

The pulse output circuit 10_1 includes first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential Vcc is supplied, and a power supply line 53 to which a low power supply potential VSS is supplied, in addition to the first to fifth input terminals 21 to 25, the first output terminal 26, and the second output terminal 27, which are described above. Here, the magnitude relation among power supply potentials of the power supply lines illustrated in FIG. 12C is set as follows: the first power supply potential VDD is higher than or equal to the second power supply potential Vcc, and the second power supply potential Vcc is higher than the third power supply potential VSS. Although the first to fourth clock signals CK1 to CK4 are signals which oscillate between an H-level signal and an L-level signal at regular intervals, a potential is VDD when the clock signal is at the H level, and the potential is VSS when the clock signal is at the L level. By making the potential Vcc of the power supply line 52 lower than the potential VDD of the power supply line 51, a potential applied to a gate electrode of a transistor can be lowered, shift in threshold voltage of the transistor can be reduced, and deterioration of the transistor can be suppressed without an adverse effect on the operation of the transistor. A transistor with four terminals is preferably used as the first transistor 31 and the sixth to ninth transistors 36 to 39 among the first to thirteenth transistors 31 to 43. The first transistor 31 and the sixth to ninth transistors 36 to 39 need to be transistors that a potential of the gate electrode of the transistor 33 and a potential of the gate electrode of the transistor 40 are switched with a control signal of the gate electrode, and can further reduce a malfunction of the pulse output circuit since response to the control signal input to the gate electrode is fast (the rise of on-state current is steep). By using the transistor with four terminals, the threshold voltage can be controlled, and a malfunction of the pulse output circuit can be further reduced.

Note that a thin film transistor is an element having at least three terminals of a gate, a drain, and a source. The thin film transistor has a semiconductor region where a channel region (also referred to as a channel formation region) is formed in a region overlapping with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as source and drain is not called the source or the drain in some cases. In such a case, for example, one of the source and the drain may be referred to as a first terminal and the other thereof may be referred to as a second terminal.

Figure 12C:
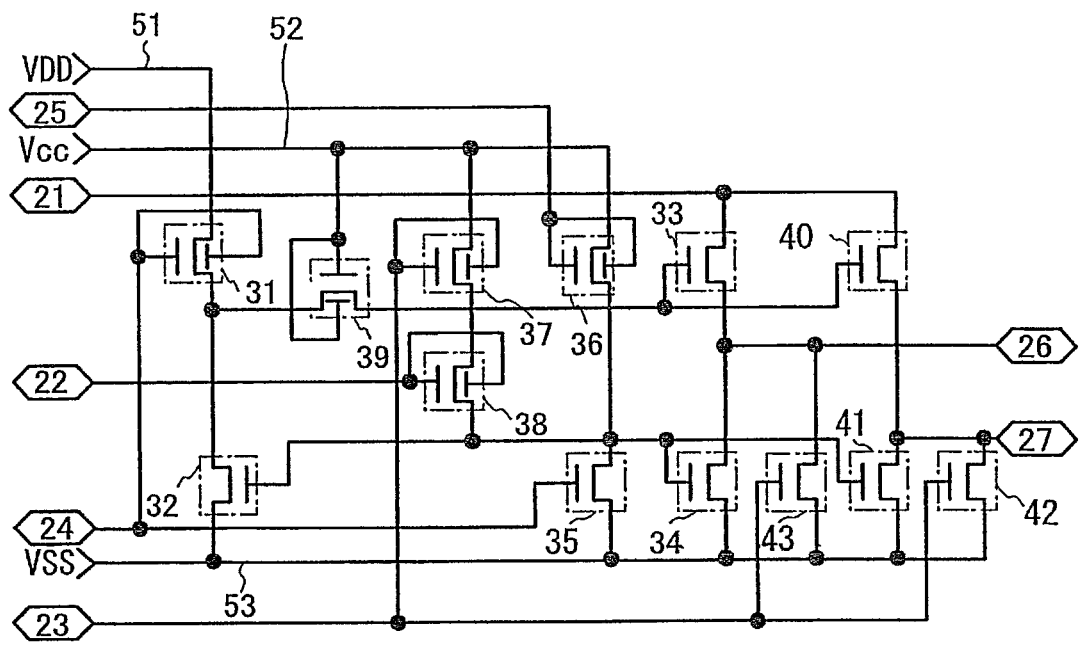

In FIG. 12C, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a first gate electrode and a second gate electrode) of the ninth transistor 39 are electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 12C, a portion where the gate electrode of the third transistor 33, the gate electrode of the tenth transistor 40, and the second terminal of the ninth transistor 39 are connected is referred to as a node A. Further, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 13A).

Figure 13A:
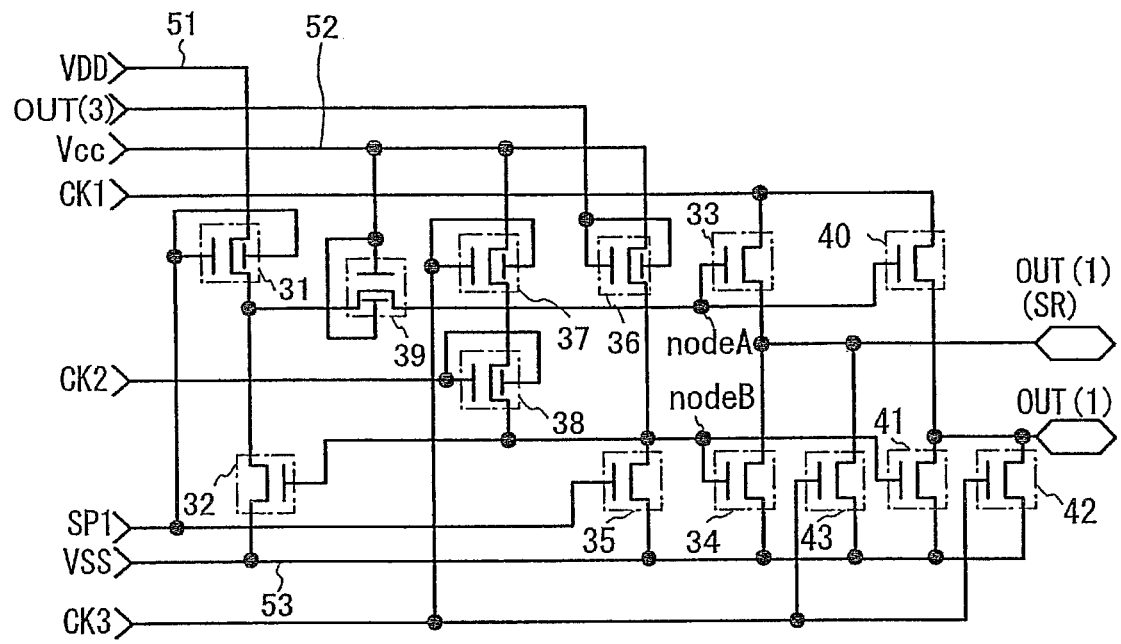
FIG. 13A shows a circuit diagram showing a configuration of a pulse output circuit and FIG. 13B shows a timing chart of operations of the shift register.

Note that in FIG. 12C and FIG. 13A, a capacitor for performing bootstrap operation by placing the node A into a floating state may be additionally provided. Furthermore, a capacitor having one electrode electrically connected to the node B may be additionally provided in order to hold a potential of the node B.

Figure 13B:
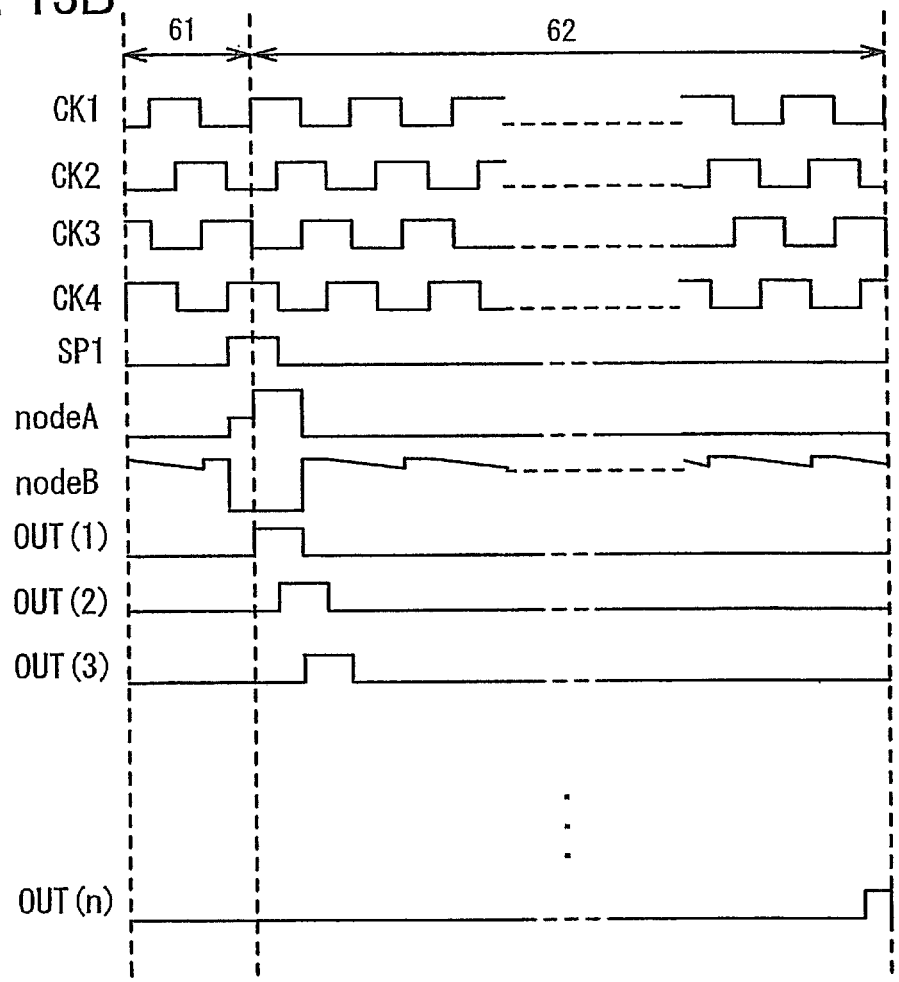

FIG. 13B shows a timing chart of the shift register including a plurality of pulse output circuits illustrated in FIG. 13A. Note that when the shift register is included in a scan line driver circuit, a period 61 in FIG. 13B corresponds to a vertical retrace period and a period 62 corresponds to a gate selection period.

Note that the placement of the ninth transistor 39 in which the second power supply potential Vcc is applied to the gate electrode as illustrated in FIG. 13A has the following advantages before and after bootstrap operation.

Without the ninth transistor 39 in which the second power supply potential Vcc is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal side, that is, on the power supply line 51 side. Consequently, in the first transistor 31, a high bias voltage is applied and thus significant stress is applied between the gate and the source and between the gate and the drain, which might cause deterioration of the transistor. Therefore, with the ninth transistor 39 in which the second power supply potential Vcc is applied to the gate electrode, an increase in potential of the second terminal of the first transistor 31 can be prevented while the potential of the node A is raised by bootstrap operation. In other words, the placement of the ninth transistor 39 can lower the value of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected to the second terminal of the first transistor 31 and the gate of the third transistor 33 respectively. Note that in the case of the shift register including a plurality of pulse output circuits in this embodiment, in a signal line driver circuit having a larger number of stages than a scan line driver circuit, the ninth transistor 39 can be omitted, and thus, the number of transistors can be reduced.

Note that an oxide semiconductor is used for semiconductor layers of the first to thirteenth transistors 31 to 43, whereby the off-state current of the thin film transistors can be reduced, the on-state current and the field-effect mobility can be increased, and the degree of deterioration of the transistors can be reduced. Further, a transistor including an oxide semiconductor has a lower rate of deterioration of the transistor due to application of a high potential to a gate electrode, as compared to a transistor including amorphous silicon. Consequently, similar operation can be obtained even when the first power supply potential VDD is supplied to the power supply line to which the second power supply potential Vcc is supplied, and the number of power supply lines placed between circuits can be reduced; thus, the size of the circuit can be reduced.

Note that a similar effect is obtained even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 are supplied from the second input terminal 22 and the third input terminal 23, respectively. In the shift register illustrated in FIG. 13A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, in FIG. 13A, when a state of the seventh transistor 37 and the eighth transistor 38 is changed in the shift register so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 is reduced to one time, which is caused by fall in potential of the gate electrode of the eighth transistor 38. Consequently, by using the clock signal CK3 supplied to the gate electrodes (the first gate electrode and the second gate electrode) of the seventh transistor 37 from the third input terminal 23 and the clock signal CK2 supplied to the gate electrodes (the first gate electrode and the second gate electrode) of the eighth transistor 38 from the second input terminal 22, the number of times of the change in the potential of the node B can be reduced, whereby the noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Embodiment 5

A thin film transistor is manufactured, and a semiconductor device having a display function (also referred to as a display device) can be manufactured using the thin film transistor in a pixel portion and further in a driver circuit. Furthermore, when part or whole of a driver circuit using a thin film transistor is formed over the same substrate as a pixel portion, a system-on-panel can be obtained.

The display device includes a display element. Examples of the display element include a liquid crystal element (also referred to as a liquid crystal display element).

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is formed, a state after formation of a conductive film to be a pixel electrode and before etching of the conductive film to form the pixel electrode, or any other states.

A display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 14A1, 14A2, and 14B. FIGS. 14A1 and 14A2 are plan views of panels in which thin film transistors 4010 and 4011 and a liquid crystal element 4013 are sealed between a first substrate 4001 and a second substrate 4006 with a sealant 4005. FIG. 14B is a cross-sectional view along M-N in FIGS. 14A1 and 14A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 14A1 illustrates an example of mounting the signal line driver circuit 4003 by a COG method, and FIG. 14A2 illustrates an example of mounting the signal line driver circuit 4003 by a TAB method.

Each of the pixel portion 4002 and the scan line driver circuit 4004 which are provided over the first substrate 4001 includes a plurality of thin film transistors. FIG. 14B illustrates the thin film transistor 4010 included in the pixel portion 4002 and the thin film transistor 4011 included in the scan line driver circuit 4004. An oxide insulating layer 4041 and an insulating layer 4021 are provided in order over the thin film transistors 4010 and 4011.

Any of the highly reliable thin film transistors including the oxide semiconductor layers which are described in Embodiment 1 or Embodiment 2 can be used as the thin film transistor 4010 and the thin film transistor 4011. The thin film transistor 410 described in Embodiment 1 or 2 can be used as the thin film transistor 4011 for the driver circuit. The thin film transistor 420 described in Embodiment 1 or 2 can be used as the thin film transistor 4010 for the pixel, for example. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same as or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be placed in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an oxide insulating layer 4032 and an oxide insulating layer 4033 functioning as alignment films, respectively, and the liquid crystal layer 4008 is sandwiched between the pixel electrode layer 4030 and the counter electrode layer 4031 with the oxide insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

A spacer 4035 is a columnar spacer obtained by selective etching of an insulating film and provided in order to control the distance (a cell gap) between the pixel electrode layer 4030 and the counter electrode layer 4031. Note that a spherical spacer may be used for the spacer 4035. In addition, the counter electrode layer 4031 is electrically connected to a common potential line formed over the same substrate as the thin film transistor 4010. With the use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

The liquid crystal display device of this embodiment can also be applied to a transmissive liquid crystal display device or a transflective liquid crystal display device.

In the example of the liquid crystal display device according to this embodiment, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process.

In the thin film transistor 4011, the oxide insulating layer 4041 is formed as a protective insulating film so as to be in contact with the semiconductor layer including the channel formation region. The oxide insulating layer 4041 can be formed using a material and method which are similar to those of the oxide insulating layer 416 described in Embodiment 1, for example. Here, a silicon oxide film is formed using a sputtering method in the similar manner to that in Embodiment 1, as the oxide insulating layer 4041.

A protective insulating layer may be additionally formed over the oxide insulating layer 4041.

In order to reduce the surface roughness due to the thin film transistor, the insulating layer 4021 is formed over the oxide insulating layer 4041, as the planarizing insulating film. As the insulating layer 4021, an organic material having heat resistance such as polyimide, acrylic resin, benzocyclobutene resin, polyamide, or epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021, and any of the following can be used depending on a material thereof: a method or means such as a sputtering method, an SOG method, a spin coating method, a dipping method, a spray coating method, a droplet discharge method (e.g., an ink-jet method, screen printing, or offset printing), a doctor knife, a roll coater, a curtain coater, or a knife coater. When the baking step of the insulating layer 4021 and the annealing of the semiconductor layer are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, and a copolymer of two or more kinds of those materials can be given.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers included in the thin film transistor 4011.

The connection terminal electrode 4015 is electrically connected to a terminal included in the FPC 4018 via an anisotropic conductive film 4019.

Note that FIGS. 14A1, 14A2, and 14B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 15:
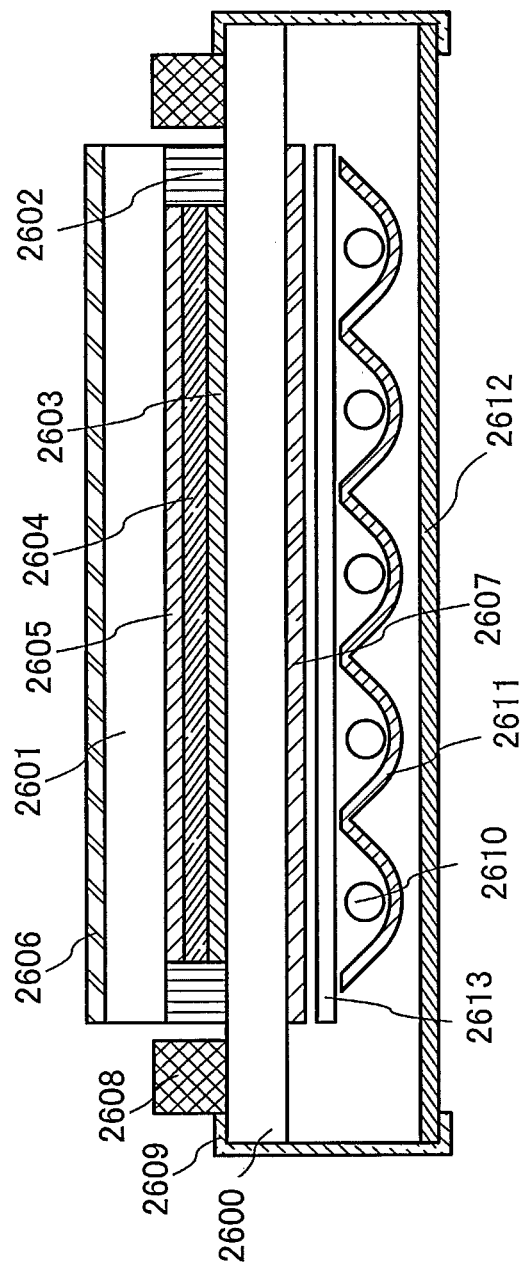
FIG. 15 illustrates a semiconductor device.

FIG. 15 illustrates an example of a liquid crystal display module which is formed as a semiconductor device with the use of a TFT substrate 2600 manufactured according to the manufacturing method disclosed in this specification.

FIG. 15 shows an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Microcell) mode, an OCB (Optically Compensated Birefringence) mode, an FLC (Ferroelectric Liquid Crystal) mode, an AFLC (AntiFerroelectric Liquid Crystal) mode, or the like can be used.

Through the above process, a highly reliable liquid crystal display panel as a semiconductor device can be manufactured.

Embodiment 6

When a semiconductor device disclosed in this specification has flexibility, it can be applied to a display portion in electronic book (e-book) readers, posters, advertisement in vehicles such as trains, a variety of cards such as credit cards, and the like. An example of such electronic appliances is illustrated in FIG. 16.

Figure 16:
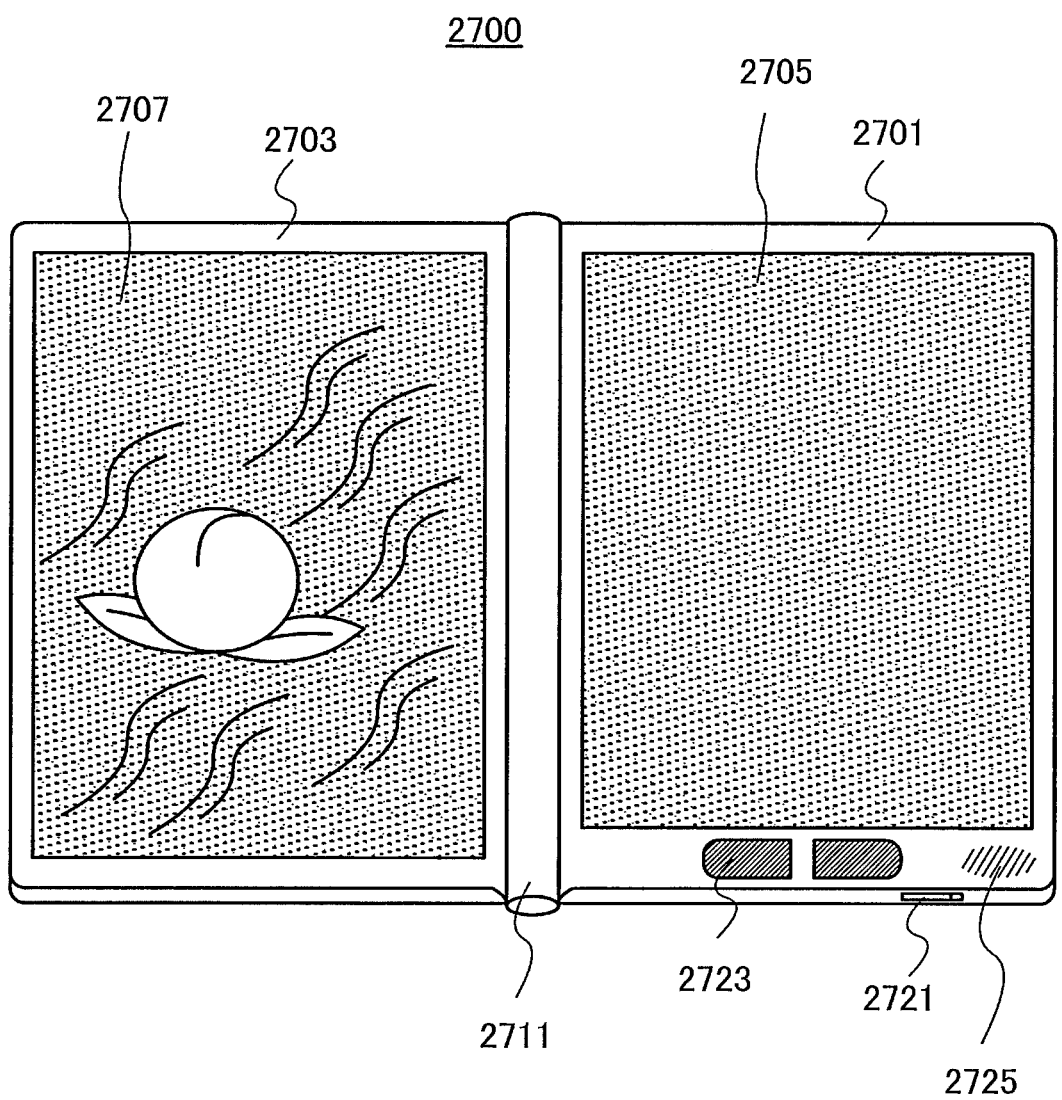
FIG. 16 is an external view of an example of an e-book reader.

FIG. 16 illustrates an example of an electronic book reader. For example, an electronic book reader 2700 includes two housings, a housing 2701 and a housing 2703. The housings 2701 and 2703 are bound with each other by an axis portion 2711, along which the electronic book reader 2700 is opened and closed. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 16) can display a text image and a display portion on the left side (the display portion 2707 in FIG. 16) can display a different type of image.

FIG. 16 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. In addition, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 7

A semiconductor device disclosed in this specification can be applied to a variety of electronic appliances (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 17A:
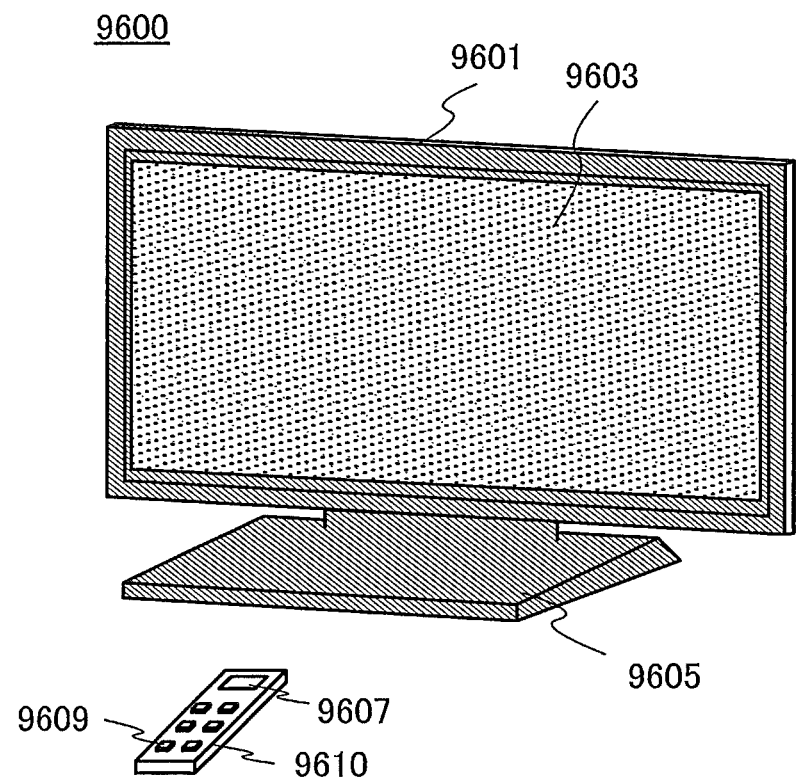
FIGS. 17A and 17B are external views of examples of a television device and a digital photo frame.

FIG. 17A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 17B:
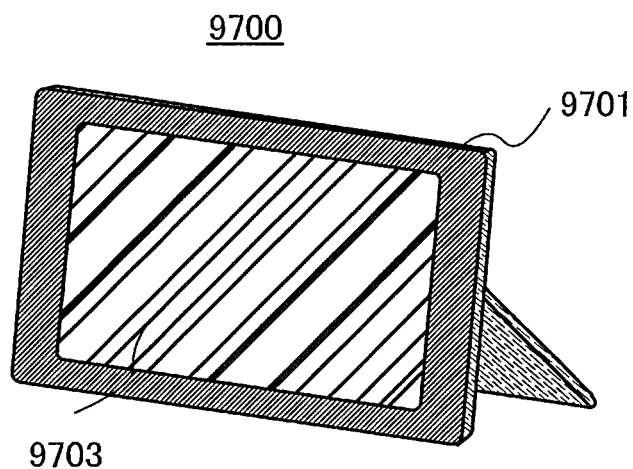

FIG. 17B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 18A:
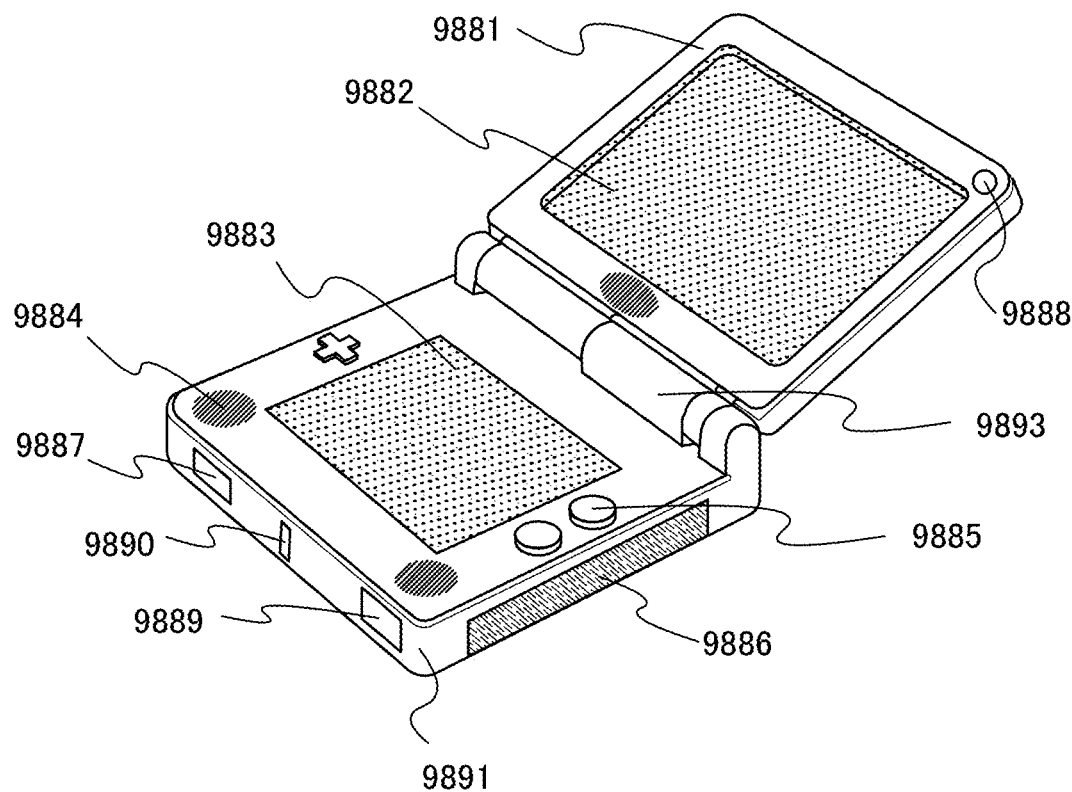
FIGS. 18A and 18B are external views of examples of amusement machines.

FIG. 18A illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 18A additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable game console illustrated in FIG. 18A has a function of reading a program or data stored in a storage medium to display it on the display portion, and a function of sharing information with another portable game console via wireless communication. The portable game console of FIG. 18A can have a variety of functions other than those above.

Figure 18B:
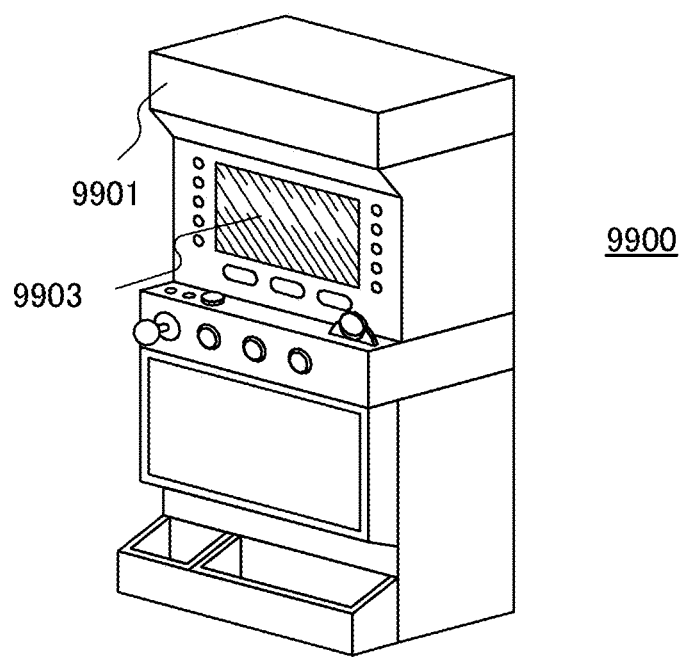

FIG. 18B illustrates an example of a slot machine 9900, which is a large game machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 19A:
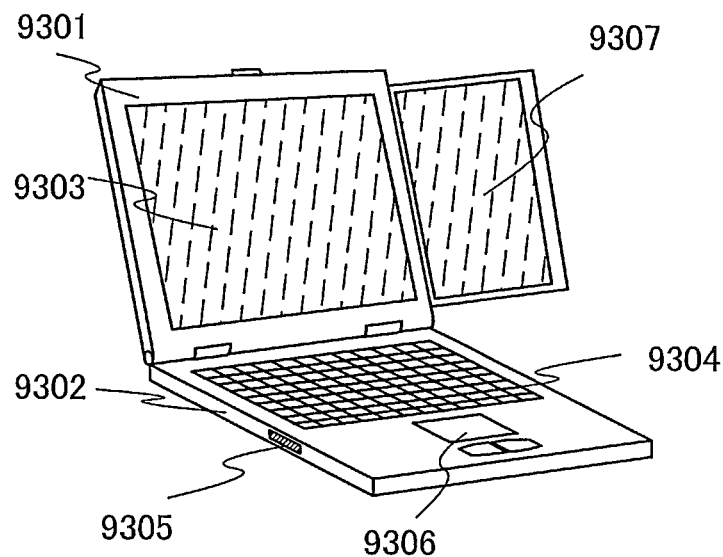
FIGS. 19A and 19B are external views illustrating an example of a portable computer and an example of a mobile phone set.

FIG. 19A is a perspective view illustrating an example of a portable computer.

In the portable computer of FIG. 19A, a top housing 9301 having a display portion 9303 and a bottom housing 9302 having a keyboard 9304 can overlap with each other by closing a hinge unit which connects the top housing 9301 and the bottom housing 9302. The portable computer in FIG. 19A is convenient for carrying around. Moreover, in the case of using the keyboard for input, the hinge unit is opened so that a user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which is storable is formed using an image display device such as a liquid crystal display panel.

In addition, the portable computer illustrated in FIG. 19A can be provided with a receiver and the like and can receive a TV broadcast to display an image on the display portion 9303 or the display portion 9307. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 19B:
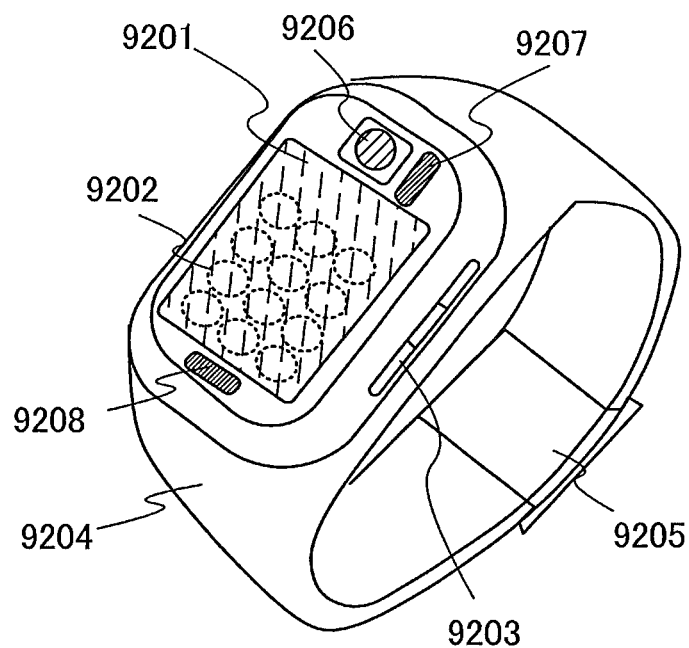

FIG. 19B is a perspective view illustrating an example of a mobile phone that a user can wear on the wrist like a wristwatch.

This mobile phone includes a main body which includes a battery and a communication device having at least a telephone function; a band portion 9204 which enables the main body to be worn on the wrist; an adjusting portion 9205 which adjusts the band portion 9204 to fit the wrist; a display portion 9201; a speaker 9207; and a microphone 9208.

In addition, the main body includes operation switches 9203. The operation switches 9203 can serve, for example, a button for starting a program for the Internet when pushed in addition to serving as a power switch, a button for switching displays, a button for instructing to start taking images, or the like, and can be configured to have respective functions.

A user can input data into this mobile phone by touching the display portion 9201 with a finger or an input pen, operating the operation switches 9203, or inputting voice into the microphone 9208. In FIG. 19B, display buttons 9202 are displayed on the display portion 9201. Input can be performed by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 19B may be provided with a receiver of a television broadcast and the like, and thus can display an image on the display portion 9201 by receiving a television broadcast. In addition, the mobile phone illustrated in FIG. 19B may be provided with a storage device and the like such as a memory, and thus can record a television broadcast in the memory. The mobile phone illustrated in FIG. 19B may have a function of collecting location information, such as the GPS.

An image display device such as a liquid crystal display panel is used as the display portion 9201. The mobile phone illustrated in FIG. 19B is compact and lightweight and thus has limited battery capacity. Therefore, a panel which can be driven with low power consumption is preferably used as a display device for the display portion 9201.

Note that although FIG. 19B illustrates the electronic device which is worn on the wrist, this embodiment is not limited thereto as long as an electronic device is portable.

Embodiment 8

In this embodiment, as one mode of a semiconductor device, examples of display devices each including the thin film transistor described in Embodiments 1 and 2 will be described with reference to FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, and FIG. 33. In this embodiment, an example of a liquid crystal display device including a liquid crystal element as a display element will be described with reference to FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, and FIG. 33. The thin film transistor described in Embodiments 1 and 2 can be used for TFTs 628 and 629, which are used for the liquid crystal display device illustrated in FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, and FIG. 33. The TFTs 628 and 629 can be manufactured in a process similar to that described in Embodiments 1 and 2 and have high electric characteristics and high reliability. The TFTs 628 and 629 are thin film transistors in each of which a channel formation region is formed in an oxide semiconductor layer. The case where the thin film transistor 420 illustrated in FIG. 1 is used as an example of a thin film transistor is explained in FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, and FIG. 33, but the case is not limited thereto.

First, a vertical alignment (VA) liquid crystal display device is described. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when voltage is not applied. In this embodiment, in particular, a pixel is divided into some regions (for example, 2 to 4 subpixels), and molecules are aligned in different directions in their respective regions. This is referred to as multi-domain or multi-domain design. In the following description, a liquid crystal display device of multi-domain design is described.

Figure 20:
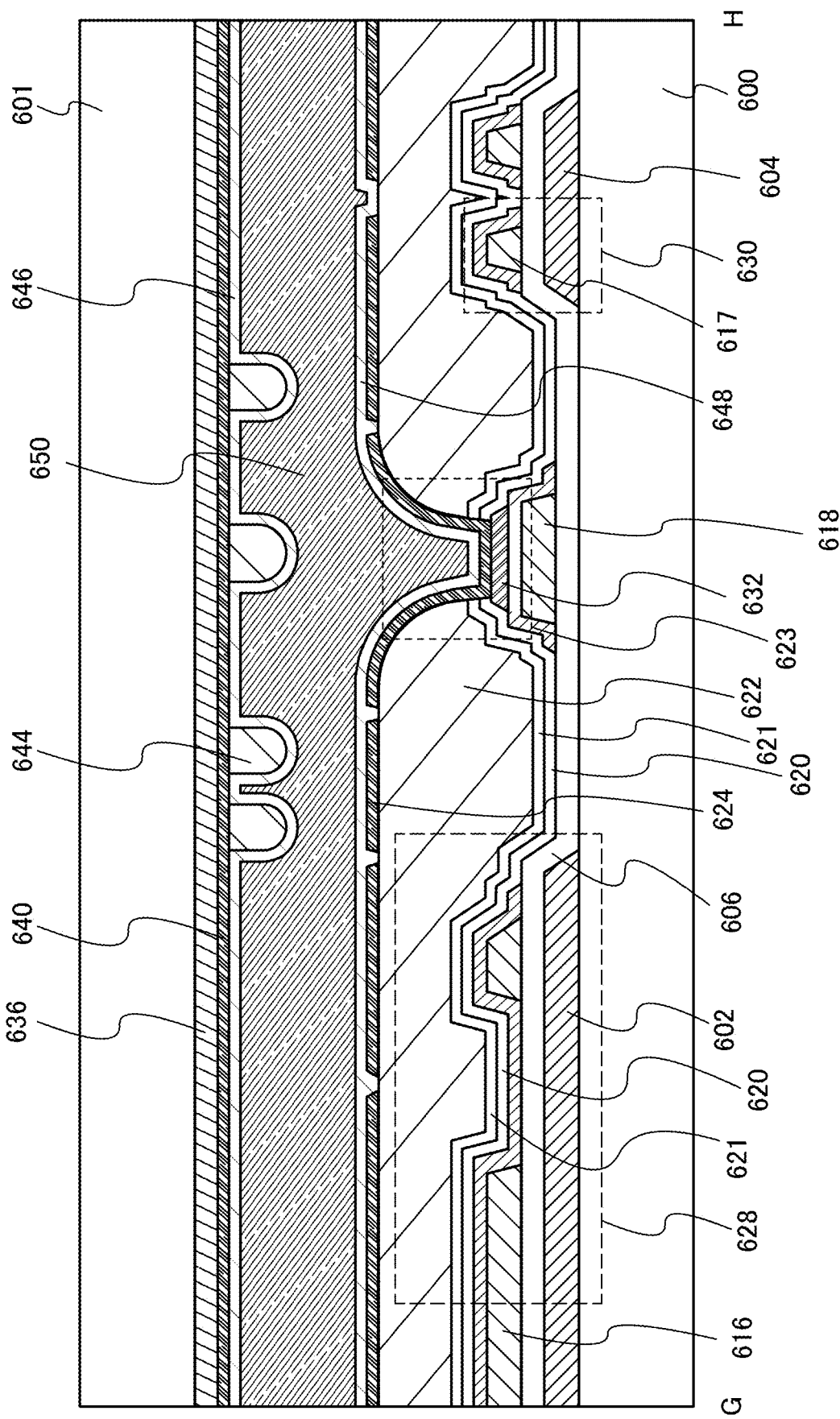
FIG. 20 illustrates a semiconductor device.
Figure 21:
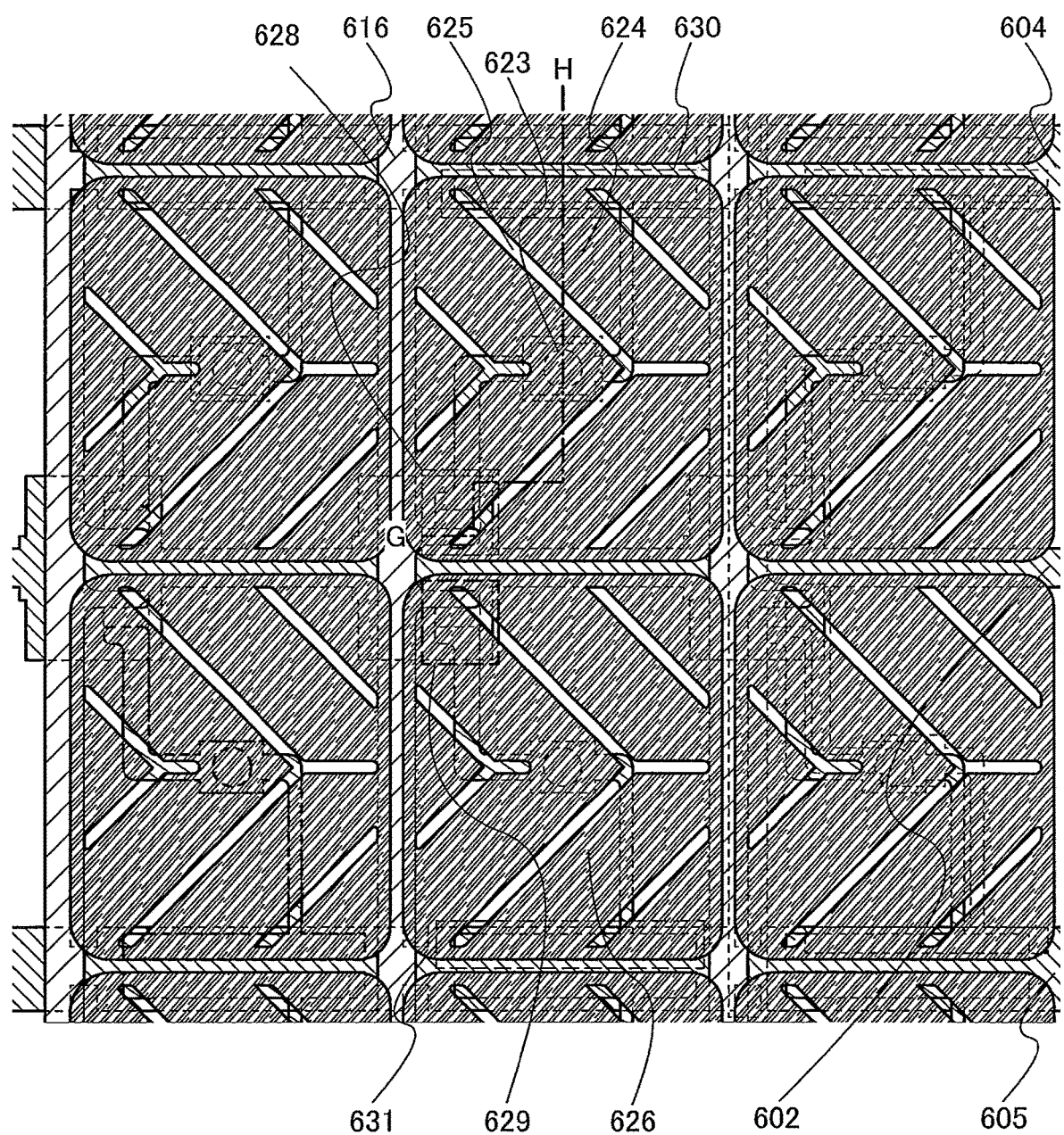
FIG. 21 illustrates a semiconductor device.
Figure 22:
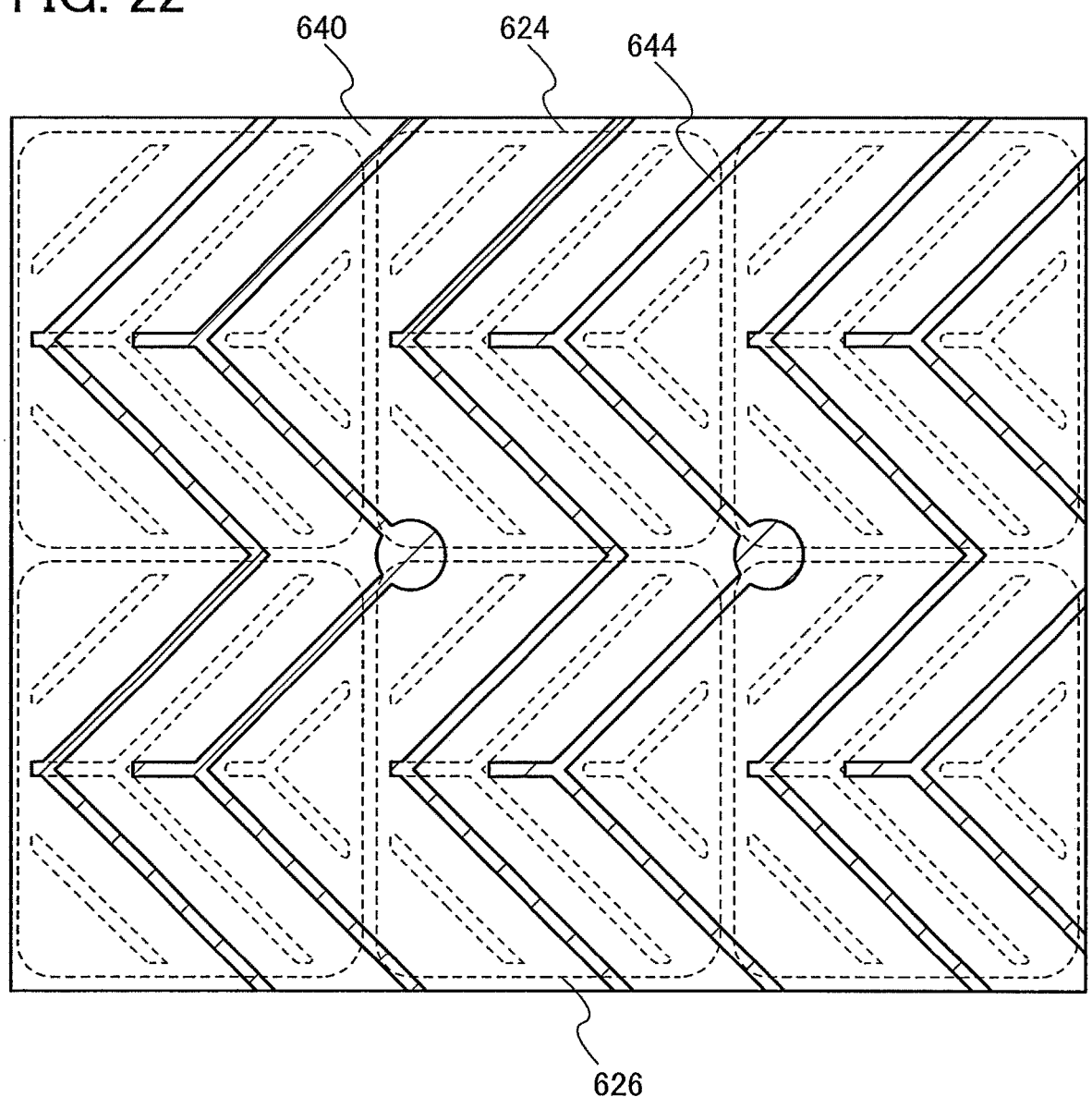
FIG. 22 illustrates a semiconductor device.

FIG. 21 and FIG. 22 illustrate a pixel electrode and a counter electrode, respectively. Note that FIG. 21 is a plan view showing the substrate side where the pixel electrode is formed. FIG. 20 illustrates a cross-sectional structure taken along a line G-H in FIG. 21. FIG. 22 is a plan view of the substrate side where the counter electrode is formed. Hereinafter, description is made with reference to these drawings.

In FIG. 20, a substrate 600 over which the TFT 628, a pixel electrode layer 624 electrically connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a first coloring film, a second coloring film, and a third coloring film (not illustrated), and projections 644 are formed on the counter electrode layer 640. With this structure, the height of the projection 644 for controlling orientation of liquid crystals is made different from that of the spacer. An alignment film 648 is formed over the pixel electrode layer 624, and an alignment film 646 is similarly formed on the counter electrode layer 640 and the projections 644. A liquid crystal layer 650 is formed between the substrate 600 and the counter substrate 601.

Although a columnar spacer is used for the spacer here, bead spacers may be dispersed. Further, the spacer may also be formed over the pixel electrode layer 624 provided over the substrate 600.

The TFT 628, the pixel electrode layer 624 connected to the TFT 628, and the storage capacitor portion 630 are formed over the substrate 600. The pixel electrode layer 624 is connected to the TFT 628. The pixel electrode layer 624 is electrically connected to a conductive layer 632, an oxide semiconductor layer of the TFT 628 and a wiring 618 through a contact hole 623 which penetrates an insulating film 620 covering a storage capacitor portion 630, an insulating film 621 covering the insulating film 620, and an insulating film 622 covering the insulating film 621. The thin film transistor described in Embodiments 1 and 2 can be used as the TFT 628 as appropriate. Further, the storage capacitor portion 630 includes a first capacitor wiring 604 which is formed at the same time as a gate wiring 602 of the TFT 628, a gate insulating film 606, and a second capacitor wiring 617 which is formed at the same time as a wiring 616 and the wiring 618.

The pixel electrode layer 624, the liquid crystal layer 650, and the counter electrode layer 640 overlap with each other, whereby a liquid crystal element is formed.

For example, the pixel electrode layer 624 is formed using a material described in Embodiments 1 and 2. The pixel electrode layer 624 is provided with slits 625. The slits 625 are provided for controlling the alignment of liquid crystals.

The TFT 629, a pixel electrode layer 626 connected to the TFT 629, and a storage capacitor portion 631 which are illustrated in FIG. 21, can be formed in a manner similar to the TFT 628, the pixel electrode layer 624 and the storage capacitor portion 630, respectively. Both the TFT 628 and the TFT 629 are connected to the wiring 616. One pixel of this liquid crystal display panel includes the pixel electrode layers 624 and 626. The pixel electrode layers 624 and 626 constitute subpixels. Although the liquid crystal display device illustrated in FIG. 21 is formed using two subpixels, this embodiment is not limited to this. The liquid crystal display device described in this embodiment can be formed using three or more subpixels.

FIG. 22 illustrates a planar structure of the counter substrate side. The counter electrode layer 640 is preferably formed using a material similar to that of the pixel electrode layer 624. The projections 644 which control alignment of liquid crystals are formed on the counter electrode layer 640. Note that in FIG. 22, the pixel electrode layers 624 and 626 are represented by dashed lines, and the counter electrode layer 640 and the pixel electrode layers 624 and 626 overlap with each other.

Figure 23:
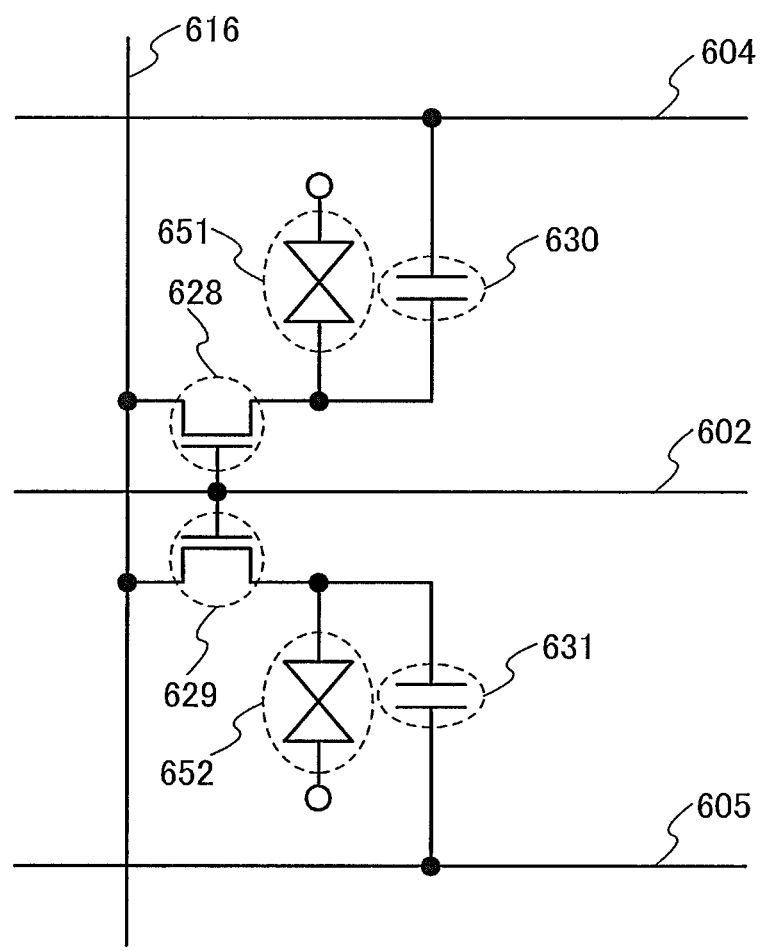
FIG. 23 illustrates a semiconductor device.

FIG. 23 shows an equivalent circuit of this pixel structure. Both the TFTs 628 and 629 are electrically connected to the gate wiring 602 and the wiring 616. The storage capacitor portion 630 and a liquid crystal element 651 are electrically connected to the TFT 628. The storage capacitor portion 631 and the liquid crystal element 652 are electrically connected to the TFT 629. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When a voltage is applied to the pixel electrode layer 624 provided with the slits 625, a distorted electric field (an oblique electric field) is generated in the vicinity of the slits 625. The slits 625 and the projections 644 on the counter substrate 601 side are disposed so as to overlap with each other, thereby effectively generating the oblique electric field to control alignment of the liquid crystals, and thus the direction in which liquid crystals are aligned is different depending on the location. That is, a viewing angle of the liquid crystal display panel is increased by domain multiplication.

Next, a different VA liquid crystal display device from the above is described with reference to FIG. 24, FIG. 25, FIG. 26, and FIG. 27.

Figure 24:
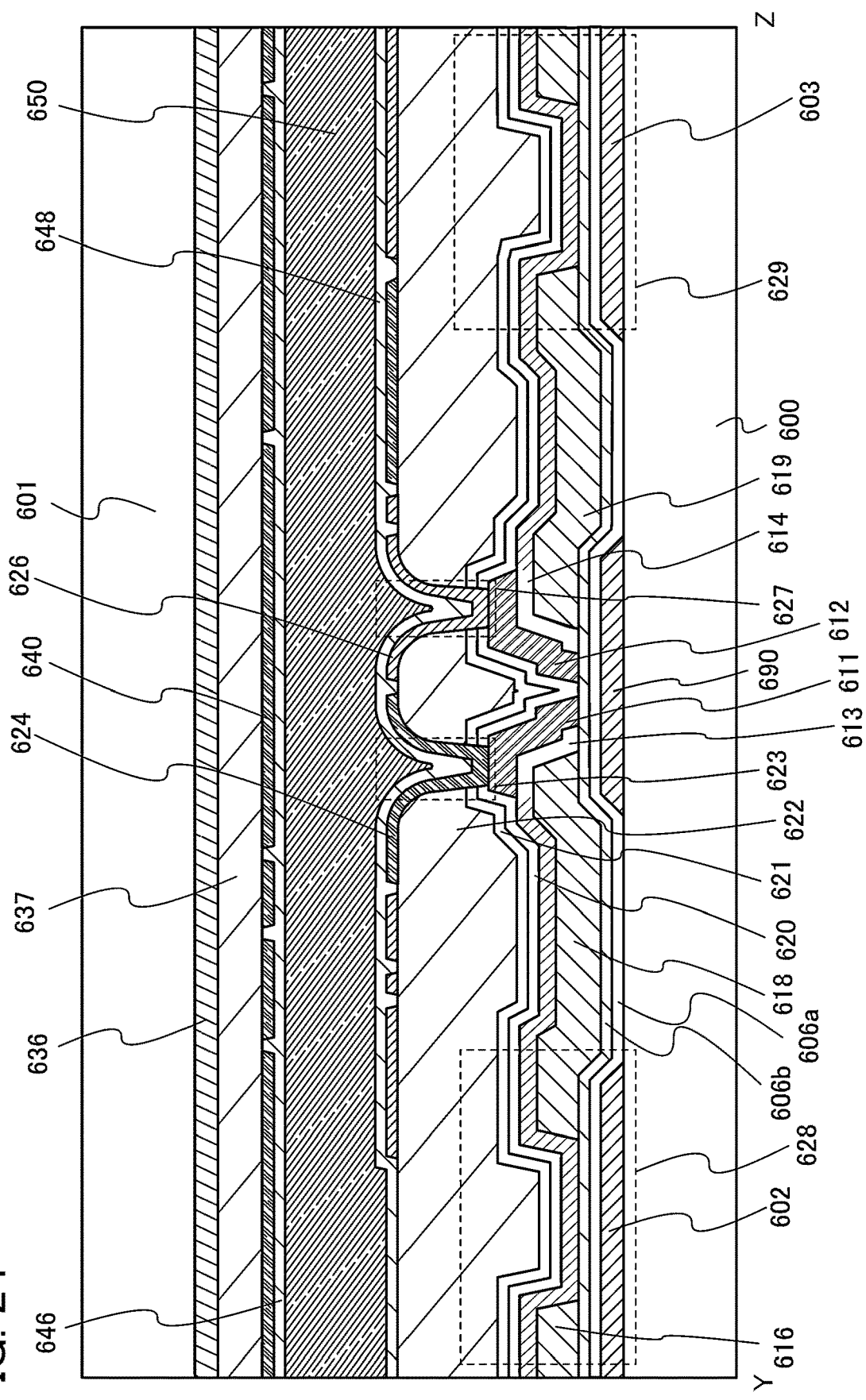
FIG. 24 illustrates a semiconductor device.
Figure 25:
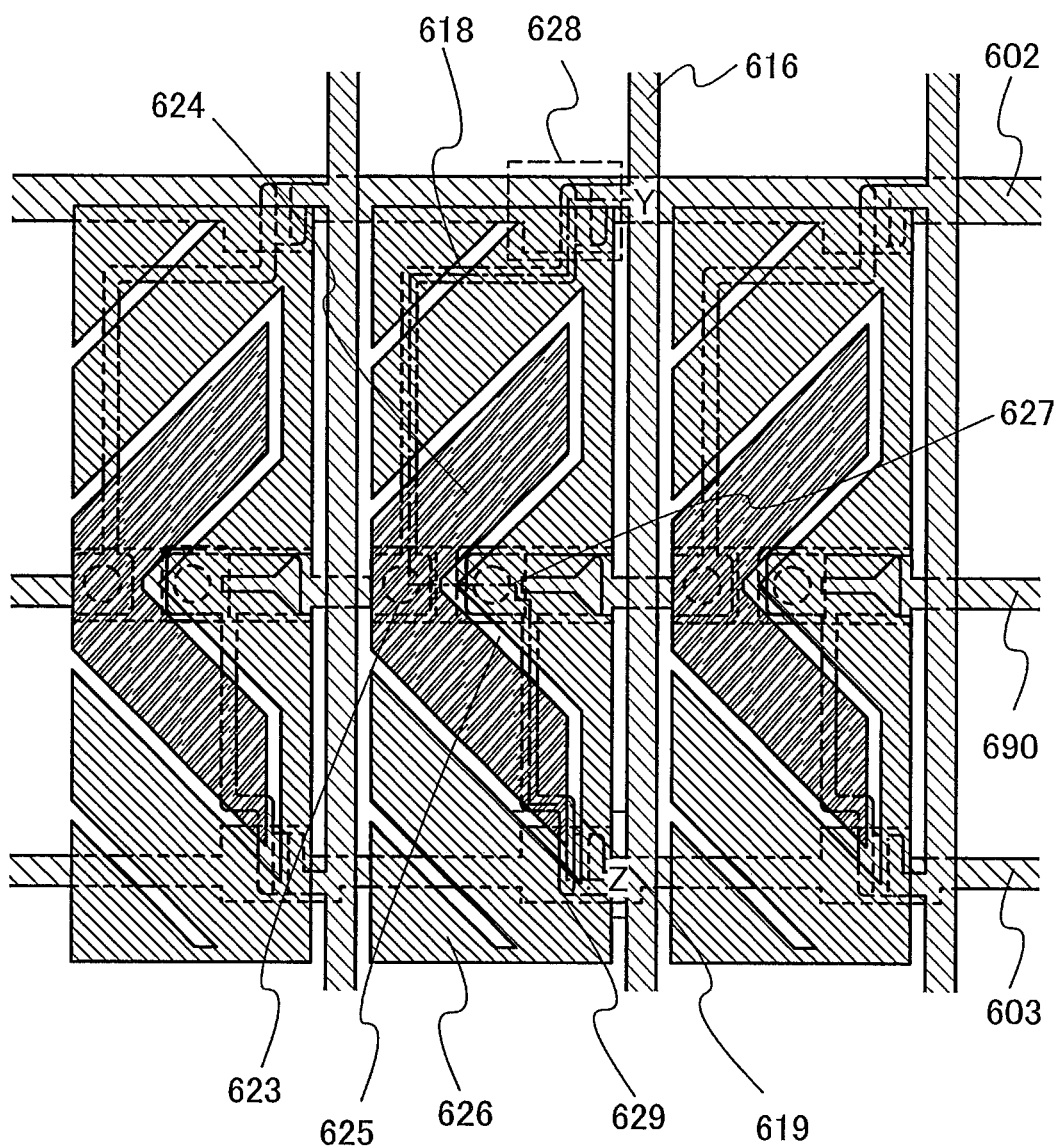
FIG. 25 illustrates a semiconductor device.

FIG. 24 and FIG. 25 each illustrate a pixel structure of a VA liquid crystal display panel. FIG. 25 is a plan view of the substrate 600, and FIG. 24 illustrates a cross-sectional structure along a section line Y-Z in FIG. 25. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

The pixel electrode layer 624 is connected to a conductive layer 611 in the contact hole 623 which penetrates the insulating film 620, the insulating film 621, and the insulating film 622. The conductive layer 611 is connected to the TFT 628 through a high-resistance drain region 613 of an oxide semiconductor layer and the wiring 618. The pixel electrode layer 626 is connected to a conductive layer 612 in a contact hole 627 which penetrates the insulating film 620, the insulating film 621, and the insulating film 622. The conductive layer 612 is connected to the TFT 629 through a high-resistance drain region 614 of an oxide semiconductor layer and a wiring 619. The gate wiring 602 of the TFT 628 is separated from a gate wiring 603 of the TFT 629 so that different gate signals can be supplied. On the other hand, the wiring 616 serving as a data line is shared by the TFTs 628 and 629. As each of the TFTs 628 and 629, the thin film transistor described in Embodiments 1 and 2 can be used as appropriate. Further, a capacitor wiring 690 is provided. Note that a first gate insulating film 606a and a second gate insulating film 606b are formed over the gate wiring 602, the gate wiring 603, and the capacitor wiring 690.

Figure 27:
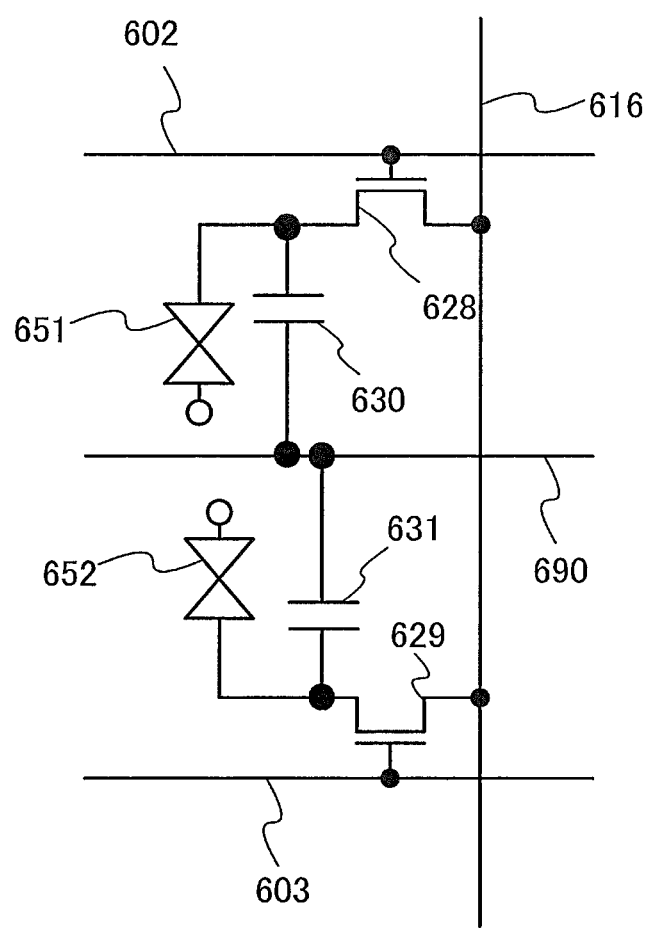
FIG. 27 illustrates a semiconductor device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which spreads into a V shape. A voltage applied to the pixel electrode layer 624 by the TFT 628 is made different from a voltage applied to the pixel electrode layer 626 by the TFT 629, whereby alignment of liquid crystals is controlled. FIG. 27 illustrates an equivalent circuit of this pixel structure. The TFT 628 is connected to the gate wiring 602, and the TFT 629 is connected to the gate wiring 603. If different gate signals are supplied to the gate wirings 602 and 603, operation timing of the TFTs 628 and 629 can be different. Both the TFTs 628 and 629 are connected to the wiring 616. The storage capacitor portion 630 and the liquid crystal element 651 are connected to the TFT 628, and the storage capacitor portion 631 and the liquid crystal element 652 are connected to the TFT 629.

Figure 26:
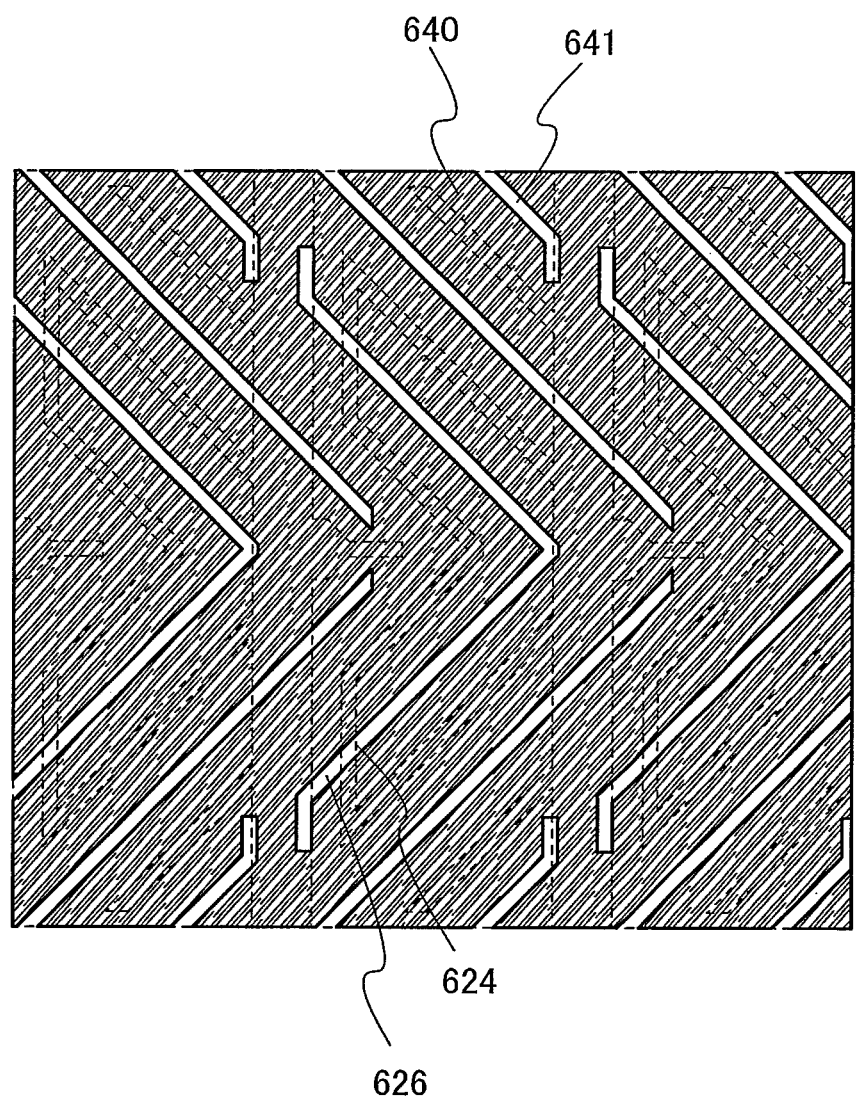
FIG. 26 illustrates a semiconductor device.

The counter substrate 601 is provided with a coloring film 636 and the counter electrode layer 640. A planarization film 637 is formed between the coloring film 636 and the counter electrode layer 640 to prevent alignment disorder of the liquid crystals. FIG. 26 illustrates a structure of the counter substrate side. The counter electrode layer 640 is an electrode shared by different pixels and slits 641 are formed. This slits 641 is disposed so as to alternately engage with the slits 625 on the pixel electrode layers 624 and 626 side, whereby an oblique electric field is generated effectively to control alignment of the liquid crystals. Accordingly, the orientation of the liquid crystals can be varied in different places, so that the viewing angle is widened.

The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. Further, the multi-domain structure is employed in which the first liquid crystal element and the second liquid crystal element are provided for one pixel.

Next, a liquid crystal display device in a horizontal electric field mode is described. In a horizontal field mode, an electric field is applied in a horizontal direction with respect to liquid crystal molecules in a cell, whereby liquid crystals are driven to express gray scales. In accordance with this mode, a viewing angle can be expanded to about 180°. Hereinafter, a liquid crystal display device in the horizontal electric field mode is described.

Figure 28:
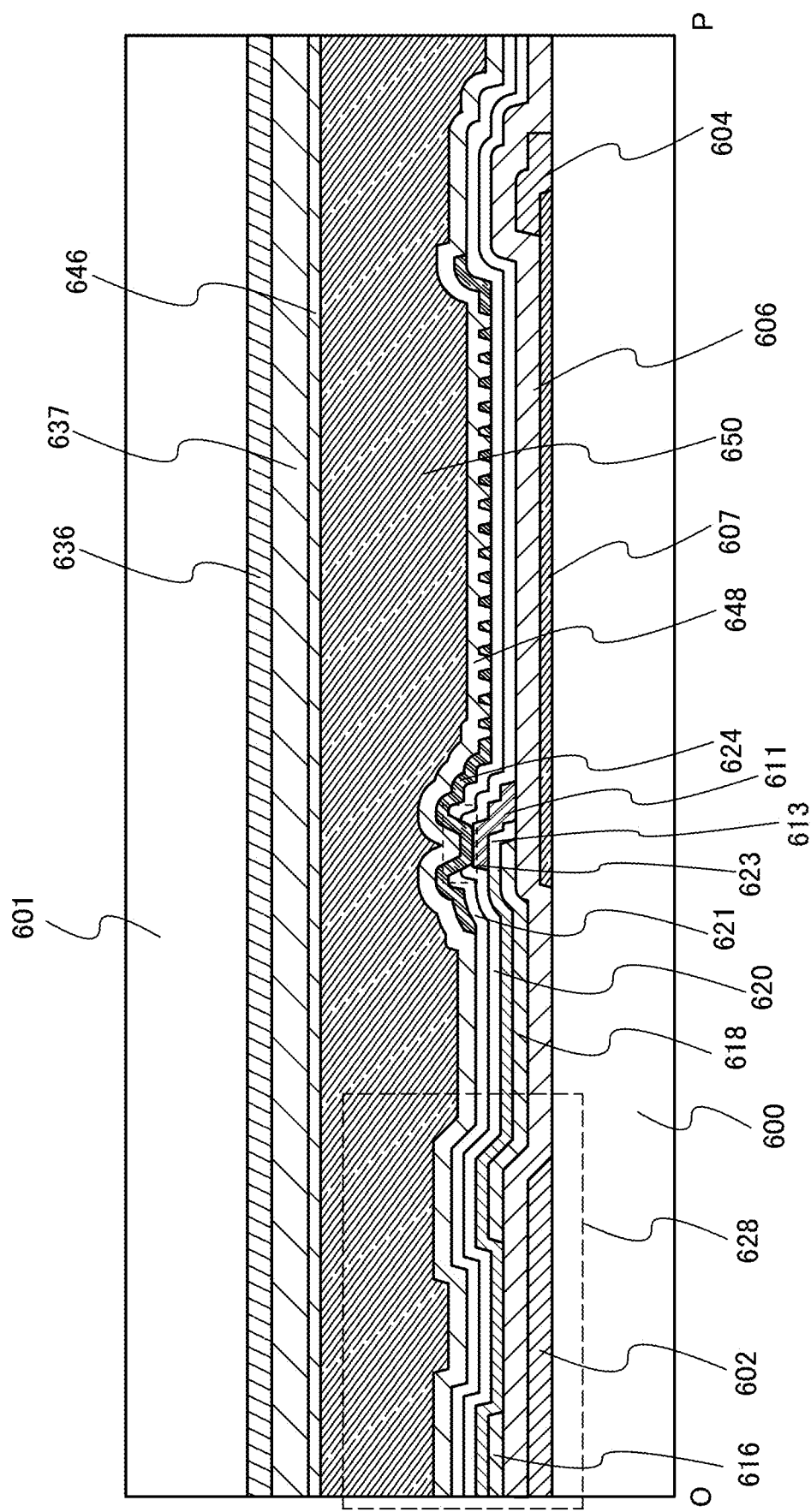
FIG. 28 illustrates a semiconductor device.

In FIG. 28, the substrate 600 over which the TFT 628 and the pixel electrode layer 624 electrically connected to the TFT 628 through the conductive layer 611 are formed overlaps with the counter substrate 601, and liquid crystals are injected between the substrate 600 and the counter substrate 601. The counter substrate 601 is provided with the coloring film 636, the planarization film 637, and the like. Note that a counter electrode layer is not provided on the counter substrate 601 side. In addition, the liquid crystal layer 650 is formed between the substrate 600 and the counter substrate 601 with the alignment films 646 and the alignment films 648 therebetween.

An electrode layer 607, the capacitor wiring 604 connected to the electrode layer 607, and the TFT 628 which is a thin film transistor described in Embodiment 1 or 2 are formed over the substrate 600. The capacitor wiring 604 can be formed at the same time as the gate wiring 602 of the TFT 628. The electrode layer 607 can be formed of a material similar to that of the pixel electrode layer 427 described in Embodiments 1 and 2. The electrode layer 607 is divided almost in a pixel form. Note that the gate insulating film 606 is formed over the electrode layer 607 and the capacitor wiring 604.

The wiring 616 and the wiring 618 of the TFT 628 are formed over the gate insulating film 606. The wiring 616 is a data line through which a video signal travels and is a wiring extending in one direction in a liquid crystal display panel, and functions as one of source and drain electrodes of the TFT 628. The wiring 618 serves as the other of the source and drain electrodes of the TFT 628 and is a wiring connected to the pixel electrode layer 624 which serves as a second pixel electrode with the high-resistance drain region 613 in the oxide semiconductor layer and the conductive layer 611 therebetween. The conductive layer 611 can be formed using a material similar to that of the conductive layer 442 described in Embodiment 1.

The insulating film 620 is formed over the wiring 616 and the wiring 618, and an insulating film 621 is formed over the insulating film 620. Over the insulating film 621, the pixel electrode layer 624 which is connected to the wiring 618 through the contact hole 623 formed in the insulating film 620 and the insulating film 621, the conductive layer 611, and the high-resistance drain region 613 is formed. The pixel electrode layer 624 is formed using a material similar to that of the pixel electrode layer 427 described in Embodiment 1.

In such a manner, the TFT 628 and the pixel electrode layer 624 connected to the TFT 628 are formed over the substrate 600. Note that a storage capacitor is formed between the electrode layer 607 and the pixel electrode layer 624.

Figure 29:
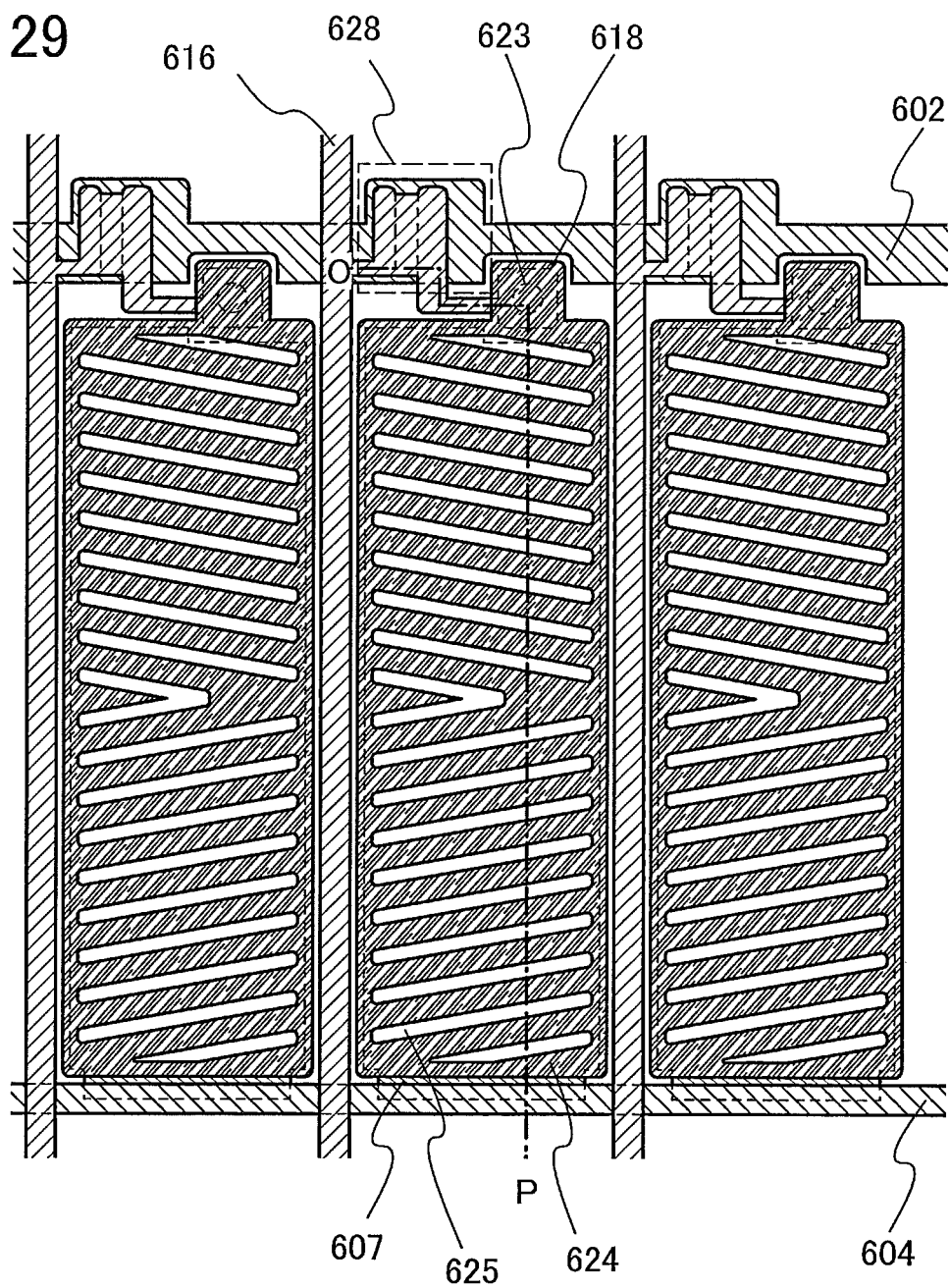
FIG. 29 illustrates a semiconductor device.

FIG. 29 is a plan view illustrating a structure of the pixel electrode. FIG. 28 illustrates a cross-sectional structure taken along a line O-P in FIG. 29. The pixel electrode layer 624 is provided with the slits 625. The slits 625 are provided for controlling alignment of liquid crystals. In that case, an electric field is generated between the electrode layer 607 and the pixel electrode layer 624. The gate insulating film 606 is formed between the electrode layer 607 and the pixel electrode layer 624. The thickness of the gate insulating film 606 is 50 to 200 nm, which is much smaller than that of the liquid crystal layer whose thickness is 2 to 10 μm. Therefore, an electric field is generated in a direction which is substantially parallel to the substrate 600 (a horizontal direction). The alignment of the liquid crystals is controlled with this electric field. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased. In addition, since both the electrode layer 607 and the pixel electrode layer 624 are light-transmitting electrodes, an aperture ratio can be improved.

Next, a different example of a liquid crystal display device in a horizontal electric field mode is shown.

Figure 30:
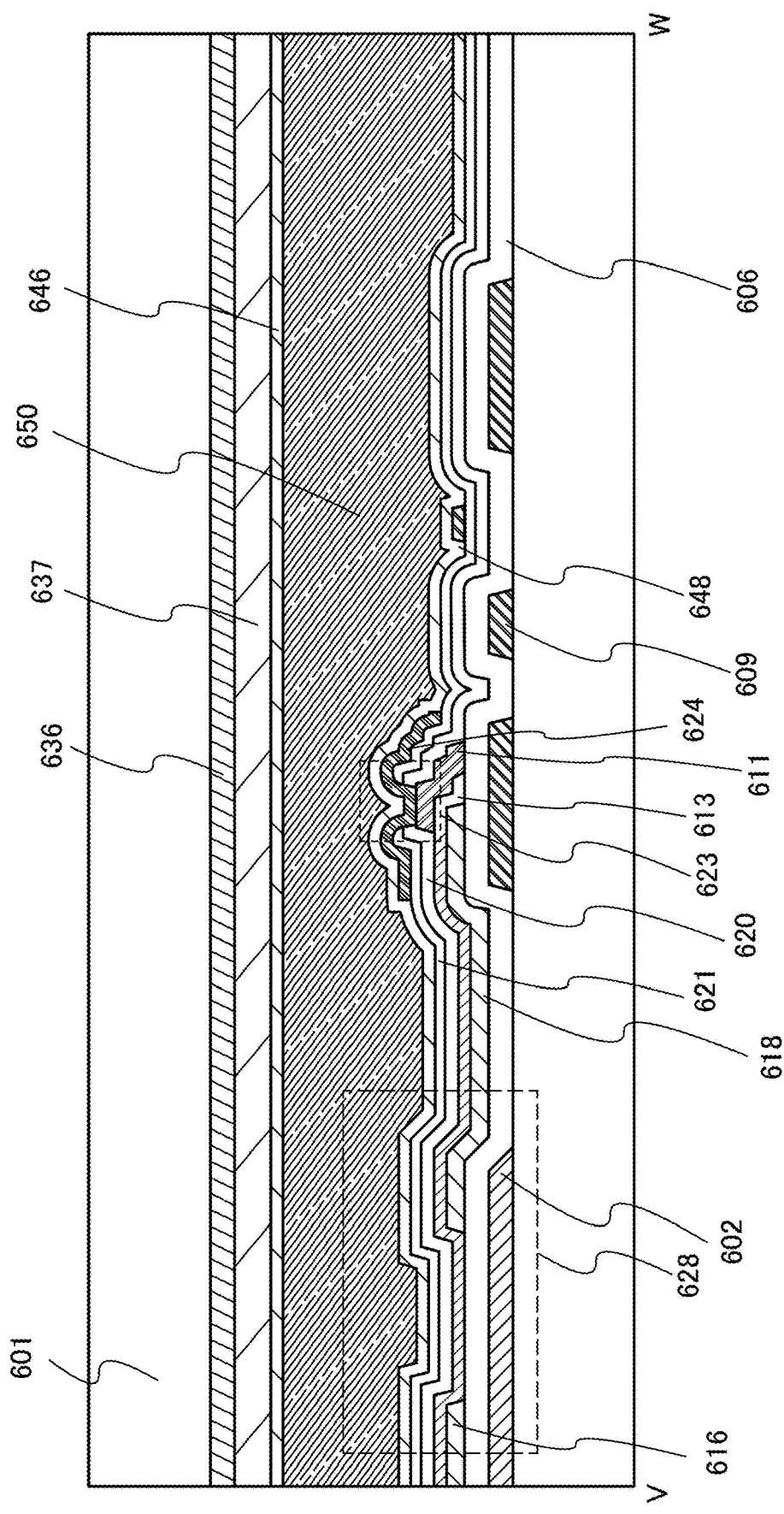
FIG. 30 illustrates a semiconductor device.
Figure 31:
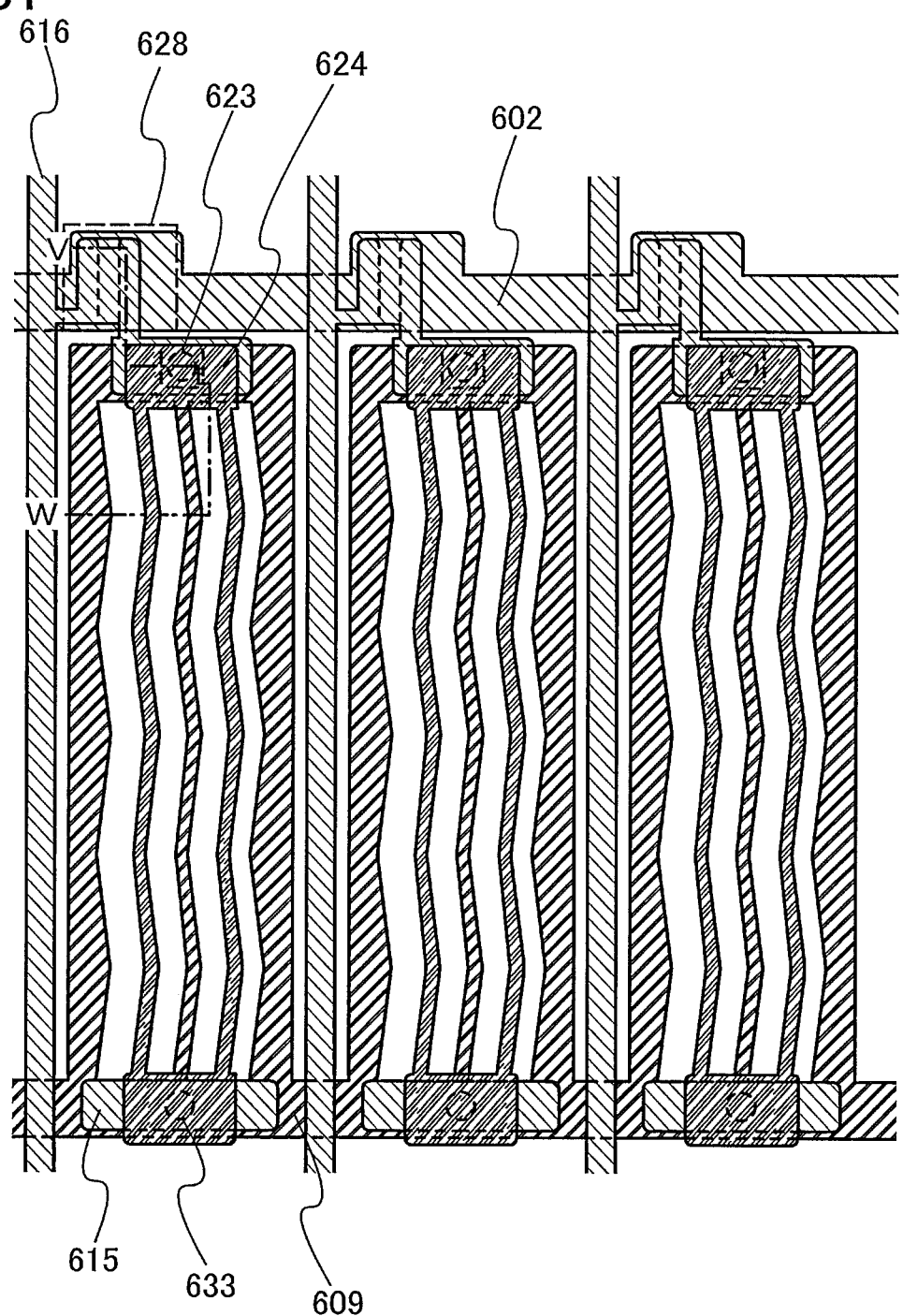
FIG. 31 illustrates a semiconductor device.

FIG. 30 and FIG. 31 each illustrate a pixel structure of an IPS mode liquid crystal display device. FIG. 31 is a plan view and FIG. 30 illustrates a cross-sectional structure taken along a line V-W in FIG. 31. Description below will be given with reference to both the drawings.

In FIG. 30, the substrate 600 over which the TFT 628 and the pixel electrode layer 624 connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode layer is not provided on the counter substrate 601 side. In addition, the liquid crystal layer 650 is formed between the substrate 600 and the counter substrate 601 with the alignment films 646 and 648 therebetween.

A common potential line 609 and the TFT 628 described in Embodiments 1 and 2 are formed over the substrate 600. The common potential line 609 can be formed at the same time as the gate wiring 602 of the TFT 628. The electrode layer 607 is divided almost in a pixel form. As the TFT 628, the thin film transistor described in any of Embodiments 1 and 2 can be employed.

The wirings 616 and 618 of the TFT 628 are formed over the gate insulating film 606. The wiring 616 is a data line through which a video signal travels, extends in one direction in a liquid crystal display panel, and functions as one of source and drain electrodes of the TFT 628. The wiring 618 serves as the other of the source electrode and the drain electrode, and is electrically connected to the pixel electrode layer 624 with the conductive layer 611 and the high-resistance drain region 613 therebetween.

The insulating film 620 is formed over the wiring 616 and the wiring 618, and the insulating film 621 is formed over the insulating film 620. Over the insulating film 621, the pixel electrode layer 624 which is connected to the wiring 618 through the contact hole 623 formed in the insulating film 620 and the insulating film 621, the conductive layer 611, and the high-resistance drain region 613 is formed. The pixel electrode layer 624 is formed using a material similar to that of the pixel electrode layer 427 described in Embodiment 1. Note that as illustrated in FIG. 31, the pixel electrode layer 624 is formed such that the pixel electrode layer 624 and a comb-like electrode which is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between a potential applied to the pixel electrode layer 624 and a potential of the common potential line 609. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased.

In such a manner, the TFT 628 and the pixel electrode layer 624 connected to the TFT 628 are formed over the substrate 600. A storage capacitor is formed with the gate insulating film 606, the common potential line 609, and a capacitor electrode 615. The capacitor electrode 615 and the pixel electrode layer 624 are connected to each other through a contact hole 633.

Next, a mode of a liquid crystal display device in a TN mode is described.

Figure 32:
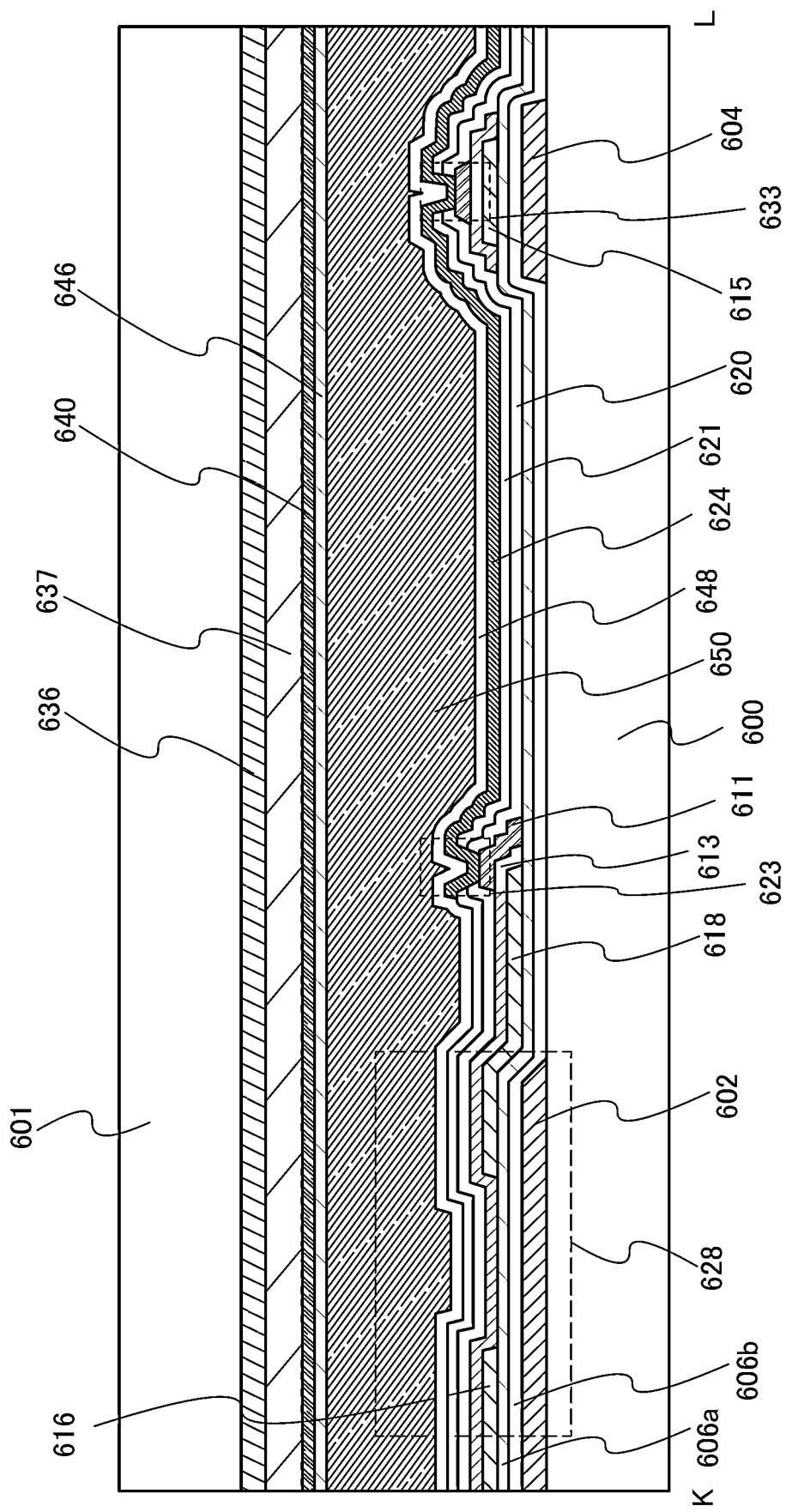
FIG. 32 illustrates a semiconductor device.
Figure 33:
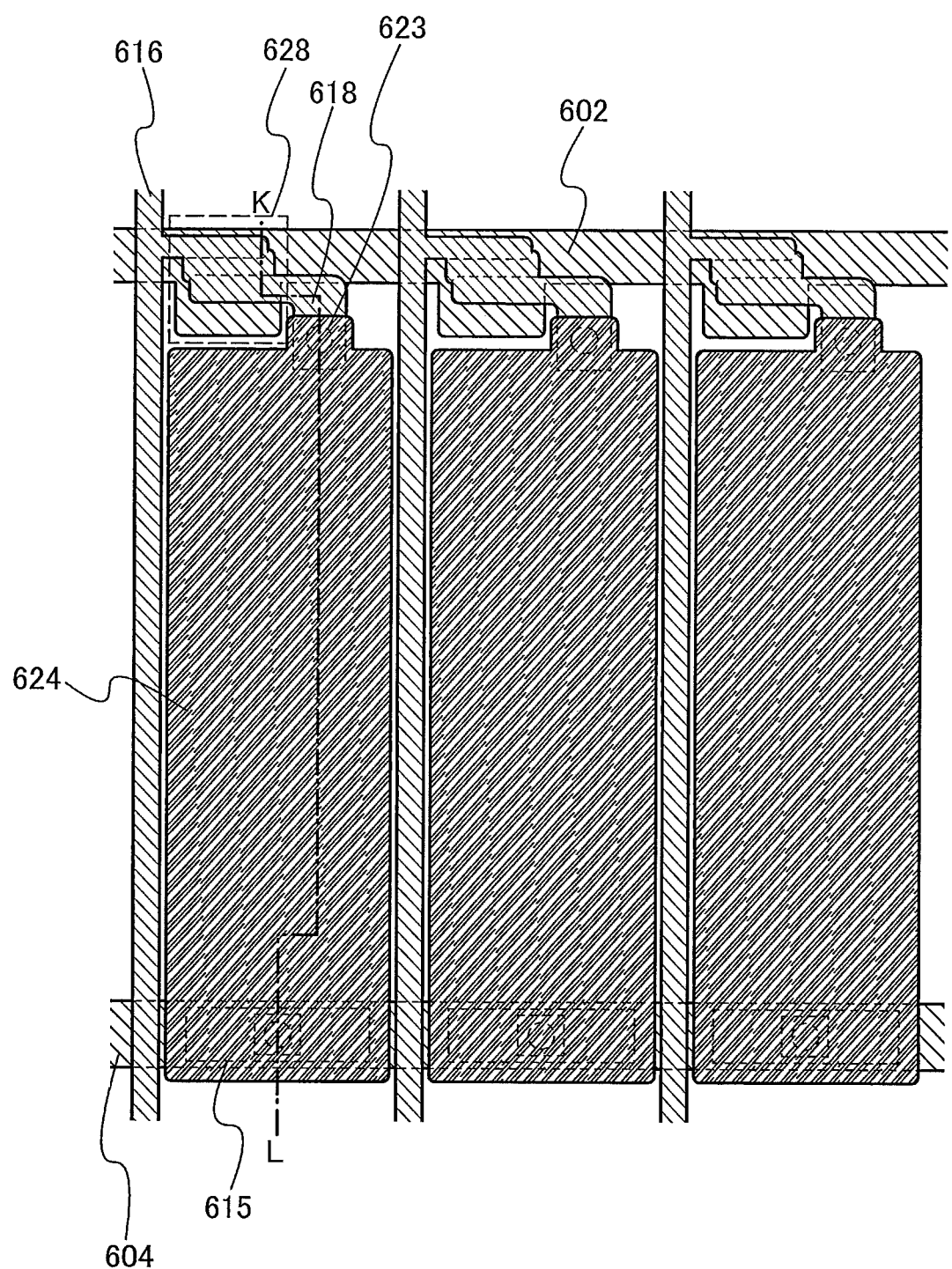
FIG. 33 illustrates a semiconductor device.

FIG. 32 and FIG. 33 illustrate a pixel structure of a liquid crystal display device in a TN mode. FIG. 33 is a plane view and FIG. 32 illustrates a cross-sectional structure taken along a line K-L illustrated in FIG. 33. Description below will be given with reference to both the drawings.

The pixel electrode layer 624 is connected to the wiring 618 through the contact hole 623 which penetrates an insulating film 620 and the insulating film 621, the conductive layer 611 and the high-resistance drain region 613. The wiring 616 functioning as a data line is also connected to the TFT 628. As the TFT 628, the TFT described in Embodiments 1 and 2 can be used.

The pixel electrode layer 624 is formed using a material similar to that of the pixel electrode layer 427 described in Embodiment 1. The capacitor wiring 604 can be formed at the same time as the gate wiring 602 of the TFT 628. The gate insulating film 606a and the gate insulating film 606b are formed over the gate wiring 602 and the capacitor wiring 604. A storage capacitor is formed using the capacitor wiring 604, the capacitor electrode 615, and the gate insulating films 606a and 606b between the capacitor wiring 604 and the capacitor electrode 615. The capacitor electrode 615 and the pixel electrode layer 624 are connected to each other through the contact hole 633.

The counter substrate 601 is provided with the coloring film 636 and the counter electrode layer 640. The planarization film 637 is formed between the coloring film 636 and the counter electrode layer 640 to prevent alignment disorder of liquid crystal. The liquid crystal layer 650 is formed between the pixel electrode layer 624 and the counter electrode layer 640 with alignment films 646 and 648 therebetween.

The pixel electrode layer 624, the liquid crystal layer 650, and the counter electrode layer 640 overlap with each other, whereby a liquid crystal element is formed.

The coloring film 636 may be provided on the side of the substrate 600. A polarizing plate is attached to a surface of the substrate 600, which is the reverse of the surface provided with the thin film transistor, and another polarizing plate is attached to a surface of the counter substrate 601, which is the reverse of the surface provided with the counter electrode layer 640.

The wiring 618 is electrically connected to the pixel electrode layer 624 with the conductive layer 611 and the high-resistance drain region 613 therebetween.

In the above-described manner, a liquid crystal display device can be configured.

Embodiment 9

An example of electronic paper will be described as one embodiment of a semiconductor device.

The thin film transistor described in Embodiments 1 and 2 can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. An electrophoretic display contains a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles contain a pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. The electrophoretic display does not require a polarizing plate and a counter substrate, which are necessary for a liquid crystal display device, so that the thickness and weight thereof are reduced.

A solution in which the above-described microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in Embodiments 1 to 7 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 34:
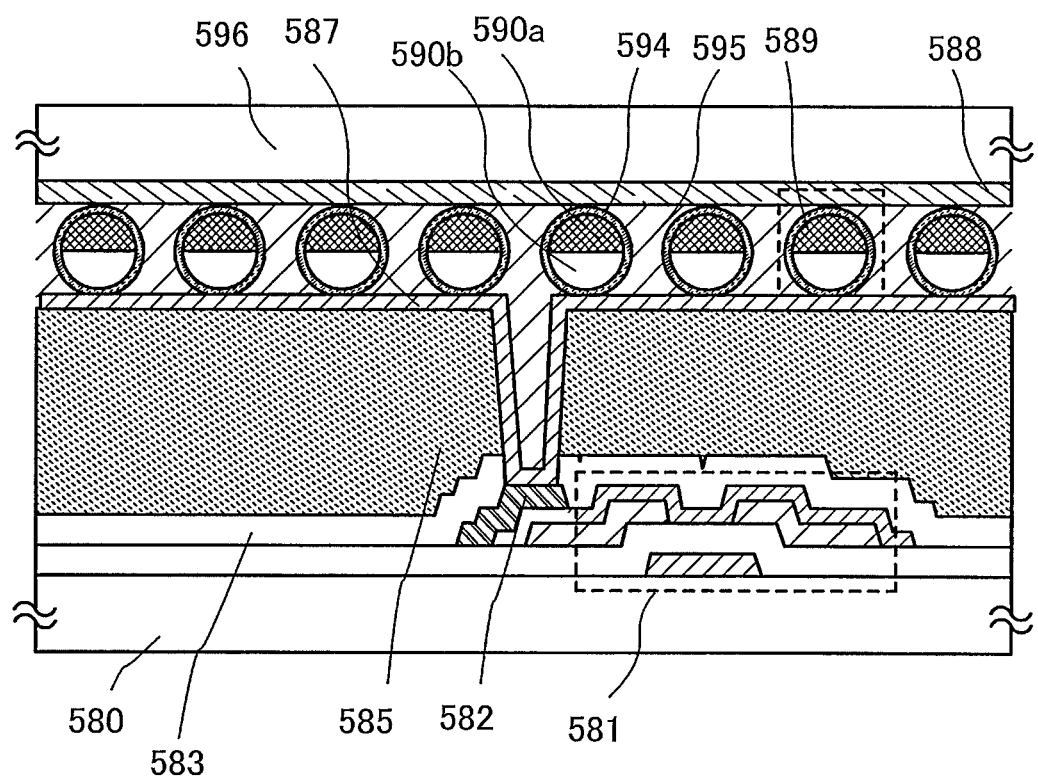
FIG. 34 illustrates a semiconductor device.

FIG. 34 illustrates active matrix electronic paper as an example of a semiconductor device. A thin film transistor 581 used for the semiconductor device can be manufactured in a manner similar to that of the thin film transistor described in Embodiments 1 and 2 and is a highly reliable thin film transistor including an oxide semiconductor layer. Moreover, any of the thin film transistors described in Embodiments 1 and 2 can also be used as the thin film transistor 581.

The electronic paper in FIG. 34 is an example using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor with a bottom gate structure and is covered with an insulating film 583 in contact with a semiconductor layer formed over the substrate 580. A source electrode layer or a drain electrode layer of the thin film transistor 581 is electrically connected to a first electrode layer 587 with a conductive layer 582 therebetween. The conductive layer 582 is in contact with the first electrode layer 587 at an opening formed in an insulating layer 585. Spherical particles 589 are provided between the first electrode layer 587 and a second electrode layer 588 formed over a substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule provided between a first electrode layer and a second electrode layer, when an electric field is applied by the first electrode layer and the second electrode layer, the white microparticles and the black microparticles move in opposite directions, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper as a semiconductor device can be manufactured.

This application is based on Japanese Patent Application serial no. 2009-204565 filed with Japan Patent Office on Sep. 4, 2009, the entire contents of which are hereby incorporated by reference.

The invention claimed is:

1. A semiconductor device comprising:
   a pixel portion comprising a first transistor and a capacitor; and
   a driver circuit portion comprising a second transistor,
   wherein the first transistor comprises:
      a first gate electrode layer;
      a first oxide semiconductor layer, a region of the first oxide semiconductor layer and the first gate electrode layer overlapping with each other; and
      a first source electrode layer and a first drain electrode layer each provided under and in contact with the first oxide semiconductor layer,
   wherein the capacitor comprises a first conductive layer and a second conductive layer,
   wherein the first conductive layer is a same layer as the first gate electrode layer and comprises a same material as the first gate electrode layer,
   wherein the second conductive layer is a same layer as the first source electrode layer and the first drain electrode layer and comprises a same material as the first source electrode layer and the first drain electrode layer,
   wherein the second transistor comprises:
      a second gate electrode layer;
      a second oxide semiconductor layer provided over the second gate electrode layer;
      a third gate electrode layer provided over the second oxide semiconductor layer; and
      a second source electrode layer and a second drain electrode layer each being in contact with the second oxide semiconductor layer, and
   wherein the second gate electrode layer and the third gate electrode layer overlap with each other with the second oxide semiconductor layer located therebetween.

2. The semiconductor device according to claim 1, wherein the second gate electrode layer is electrically connected to the third gate electrode layer.

3. The semiconductor device according to claim 1, wherein each of the second source electrode layer and the second drain electrode layer comprises a single layer comprising an element selected from molybdenum, titanium, chromium, tantalum, tungsten, aluminum, copper, neodymium, and scandium.

4. A mobile phone equipped with the semiconductor device according to claim 1.

5. A semiconductor device comprising:
a pixel portion comprising a first transistor and a capacitor; and
a driver circuit portion comprising a second transistor,
wherein the first transistor comprises:
   a first gate electrode layer;
   a first oxide semiconductor layer, a region of the first oxide semiconductor layer and the first gate electrode layer overlapping with each other; and
   a first source electrode layer and a first drain electrode layer each provided under and in contact with the first oxide semiconductor layer,
wherein the capacitor comprises a first conductive layer and a second conductive layer,
wherein the first conductive layer is a same layer as the first gate electrode layer and comprises a same material as the first gate electrode layer,
wherein the second conductive layer is a same layer as the first source electrode layer and the first drain electrode layer and comprises a same material as the first source electrode layer and the first drain electrode layer,
wherein the second transistor comprises:
   a second gate electrode layer;
   a second oxide semiconductor layer provided over the second gate electrode layer;
   a third gate electrode layer provided over the second oxide semiconductor layer; and
   a second source electrode layer and a second drain electrode layer each being in contact with the second oxide semiconductor layer,
wherein the second gate electrode layer and the third gate electrode layer overlap with each other with the second oxide semiconductor layer located therebetween, and
wherein each of the first oxide semiconductor layer and the second oxide semiconductor layer comprises In, Ga, and Zn.

6. The semiconductor device according to claim 5, wherein the second gate electrode layer is electrically connected to the third gate electrode layer.

7. The semiconductor device according to claim 5, wherein each of the second source electrode layer and the second drain electrode layer comprises a single layer comprising an element selected from molybdenum, titanium, chromium, tantalum, tungsten, aluminum, copper, neodymium, and scandium.

8. A mobile phone equipped with the semiconductor device according to claim 5.

* * * * *